(12) United States Patent
Sinclair et al.

(10) Patent No.: US 7,590,795 B2
(45) Date of Patent: Sep. 15, 2009

(54) FLASH MEMORY SYSTEMS UTILIZING DIRECT DATA FILE STORAGE

(75) Inventors: Alan W. Sinclair, Falkirk (GB); Barry Wright, Edinburgh (GB)

(73) Assignee: SanDisk Corporation, Milpitas, CA (US)

( * ) Notice: Subject to any disclaimer, the term of this patent is extended or adjusted under 35 U.S.C. 154(b) by 377 days.

(21) Appl. No.: 11/462,013

(22) Filed: Aug. 2, 2006

(65) Prior Publication Data

US 2007/0033378 A1    Feb. 8, 2007

Related U.S. Application Data

(60) Provisional application No. 60/705,388, filed on Aug. 3, 2005.

(51) Int. Cl.
    *G06F 12/02*    (2006.01)
(52) U.S. Cl. ...................... 711/103; 711/104
(58) Field of Classification Search ................ 711/103, 711/104
    See application file for complete search history.

(56) References Cited

U.S. PATENT DOCUMENTS

| | | | |
|---|---|---|---|
| 4,800,520 A | 1/1989 | Iijima | |
| 4,802,117 A | 1/1989 | Chrosny et al. | |
| 5,226,155 A | 7/1993 | Iijima | |
| 5,341,339 A | 8/1994 | Wells | |
| 5,369,754 A | 11/1994 | Fandrich et al. | |
| 5,388,083 A | 2/1995 | Assar et al. | |
| 5,404,485 A | 4/1995 | Ban | |
| 5,568,423 A | 10/1996 | Jou et al. | |
| 5,570,315 A | 10/1996 | Tanaka et al. | |
| 5,581,723 A | 12/1996 | Hasbun et al. | |
| 5,592,662 A | 1/1997 | Sawada et al. | |
| 5,592,669 A | 1/1997 | Robinson et al. | |
| 5,602,987 A | 2/1997 | Harari et al. | |
| 5,619,690 A | 4/1997 | Matsumani et al. | |
| 5,628,014 A | 5/1997 | Cecchini et al. | |
| 5,634,050 A | 5/1997 | Krueger et al. | |
| 5,668,968 A | 9/1997 | Wu | |
| 5,737,742 A | 4/1998 | Achiwa et al. | |
| 5,761,536 A | 6/1998 | Franaszek | |

(Continued)

FOREIGN PATENT DOCUMENTS

DE    10234971 A1    2/2004

(Continued)

OTHER PUBLICATIONS

Rankl, Wolfgang et al., "Smart Card Handbook, Third Edition (translated by Kenneth Cox)", John Wiley & Sons, Ltd., 2004, pp. 52-93, 233-369, and 435-490.

(Continued)

*Primary Examiner*—Kevin L Ellis
*Assistant Examiner*—Hamdy S Ahmed
(74) *Attorney, Agent, or Firm*—Davis Wright Tremaine LLP

(57) ABSTRACT

Host system data files are written directly to a large erase block flash memory system with a unique identification of each file and offsets of data within the file but without the use of any intermediate logical addresses or a virtual address space for the memory. Directory information of where the files are stored in the memory is maintained within the memory system by its controller, rather than by the host.

7 Claims, 33 Drawing Sheets

U.S. PATENT DOCUMENTS

Figure 1:
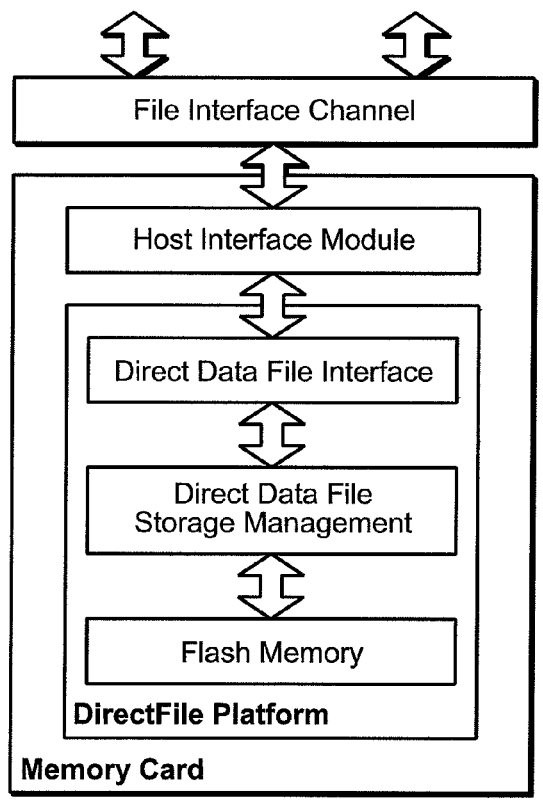

| | | |
|---|---|---|
| 5,774,397 A | 6/1998 | Endoh et al. |
| 5,799,168 A | 8/1998 | Ban |
| 5,809,558 A | 9/1998 | Matthews et al. |
| 5,832,493 A | 11/1998 | Marshall et al. |
| 5,867,641 A | 2/1999 | Jenett |
| 5,896,393 A | 4/1999 | Yard et al. |
| 5,907,854 A | 5/1999 | Kerns |
| 5,928,347 A | 7/1999 | Jones |
| 5,933,845 A | 8/1999 | Kopp et al. |
| 5,933,846 A | 8/1999 | Endo |
| 5,937,425 A | 8/1999 | Ban |
| 5,966,047 A | 10/1999 | Anderson et al. |
| 5,966,720 A | 10/1999 | Itoh et al. |
| 5,987,478 A | 11/1999 | See et al. |
| 5,996,047 A | 11/1999 | Peacock |
| 6,014,724 A | 1/2000 | Jenett |
| 6,021,415 A | 2/2000 | Cannon et al. |
| 6,038,636 A | 3/2000 | Brown, III et al. |
| 6,046,935 A | 4/2000 | Takeuchi et al. |
| 6,069,827 A | 5/2000 | Sinclair |
| 6,145,069 A | 11/2000 | Dye |
| 6,148,354 A | 11/2000 | Ban et al. |
| 6,189,081 B1 | 2/2001 | Fujio |
| 6,216,204 B1 | 4/2001 | Thiriet |
| 6,226,728 B1 | 5/2001 | See et al. |
| 6,256,690 B1 | 7/2001 | Carper |
| 6,275,804 B1 | 8/2001 | Carl et al. |
| 6,279,069 B1 | 8/2001 | Robinson et al. |
| 6,347,355 B1 | 2/2002 | Kondo et al. |
| 6,373,746 B1 | 4/2002 | Takeuchi et al. |
| 6,374,324 B2 | 4/2002 | Han |
| 6,385,690 B1 | 5/2002 | Iida et al. |
| 6,401,160 B1 | 6/2002 | See et al. |
| 6,412,040 B2 | 6/2002 | Hasbun et al. |
| 6,426,893 B1 | 7/2002 | Conley et al. |
| 6,446,140 B1 | 9/2002 | Nozu |
| 6,456,528 B1 | 9/2002 | Chen |
| 6,467,015 B1 | 10/2002 | Nolan et al. |
| 6,467,021 B1 | 10/2002 | Sinclair |
| 6,477,616 B1 | 11/2002 | Takahashi |
| 6,480,935 B1 | 11/2002 | Carper et al. |
| 6,484,937 B1 | 11/2002 | Devaux et al. |
| 6,490,649 B2 | 12/2002 | Sinclair |
| 6,493,811 B1 | 12/2002 | Blades et al. |
| 6,522,580 B2 | 2/2003 | Chen et al. |
| 6,535,949 B1 | 3/2003 | Parker |
| 6,542,407 B1 | 4/2003 | Chen et al. |
| 6,547,150 B1 | 4/2003 | Deo et al. |
| 6,567,307 B1 | 5/2003 | Estakhri |
| 6,598,114 B2 | 7/2003 | Funakoshi |
| 6,604,168 B2 | 8/2003 | Ogawa |
| 6,668,336 B2 | 12/2003 | Lasser |
| 6,681,239 B1 | 1/2004 | Munroe et al. |
| 6,715,027 B2 | 3/2004 | Kim et al. |
| 6,763,424 B2 | 7/2004 | Conley |
| 6,766,432 B2 | 7/2004 | Saltz |
| 6,771,536 B2 | 8/2004 | Li et al. |
| 6,772,955 B2 | 8/2004 | Yoshimoto et al. |
| 6,779,063 B2 | 8/2004 | Yamamoto |
| 6,781,877 B2 | 8/2004 | Cernea et al. |
| 6,823,417 B2 | 11/2004 | Spencer |
| 6,834,331 B1 | 12/2004 | Liu |
| 6,839,823 B1 | 1/2005 | See et al. |
| 6,886,083 B2 | 4/2005 | Murakami |
| 6,895,464 B2 | 5/2005 | Chow et al. |
| 6,898,662 B2 | 5/2005 | Gorobets |
| 6,925,007 B2 | 8/2005 | Harari et al. |
| 6,938,116 B2 | 8/2005 | Kim et al. |
| 7,032,065 B2 | 4/2006 | Gonzalez et al. |
| 7,092,911 B2 | 8/2006 | Yokota et al. |
| 7,139,864 B2 | 11/2006 | Bennett et al. |
| 7,395,384 B2 | 7/2008 | Sinclair et al. |
| 7,426,606 B2 | 9/2008 | Chu |
| 2002/0013879 A1 | 1/2002 | Han |
| 2002/0099904 A1 | 7/2002 | Conley |
| 2002/0112116 A1 | 8/2002 | Nelson |
| 2002/0116569 A1 | 8/2002 | Kim et al. |
| 2002/0194451 A1 | 12/2002 | Mukaida et al. |
| 2003/0065899 A1 | 4/2003 | Gorobets |
| 2003/0088812 A1 | 5/2003 | Lasser |
| 2003/0109093 A1 | 6/2003 | Harari et al. |
| 2003/0147278 A1 | 8/2003 | Tanaka et al. |
| 2003/0229753 A1 | 12/2003 | Hwang |
| 2003/0229769 A1 | 12/2003 | Montemayor |
| 2004/0019716 A1 | 1/2004 | Bychkov et al. |
| 2004/0073727 A1 | 4/2004 | Moran et al. |
| 2004/0103241 A1 | 5/2004 | Chang et al. |
| 2004/0157638 A1 | 8/2004 | Moran et al. |
| 2004/0177212 A1 | 9/2004 | Chang et al. |
| 2004/0248612 A1 | 12/2004 | Lee et al. |
| 2005/0141312 A1 | 6/2005 | Sinclair et al. |
| 2005/0141313 A1 | 6/2005 | Gorobets et al. |
| 2005/0144357 A1 | 6/2005 | Sinclair |
| 2005/0144358 A1 | 6/2005 | Conley et al. |
| 2005/0144360 A1 | 6/2005 | Bennett et al. |
| 2005/0144363 A1 | 6/2005 | Sinclair |
| 2005/0144365 A1 | 6/2005 | Gorobets et al. |
| 2005/0144367 A1 | 6/2005 | Sinclair |
| 2005/0144516 A1 | 6/2005 | Gonzalez et al. |
| 2005/0166087 A1 | 7/2005 | Gorobets |
| 2006/0020744 A1 | 1/2006 | Sinclair et al. |
| 2006/0020745 A1 | 1/2006 | Conley et al. |
| 2006/0031593 A1 | 2/2006 | Sinclair |
| 2006/0101084 A1 | 5/2006 | Kishi et al. |
| 2006/0149916 A1 | 7/2006 | Nase |
| 2006/0155920 A1 | 7/2006 | Smith et al. |
| 2006/0155921 A1 | 7/2006 | Gorobets et al. |
| 2006/0155922 A1 | 7/2006 | Gorobets et al. |
| 2006/0161724 A1 | 7/2006 | Bennett et al. |
| 2006/0161728 A1 | 7/2006 | Bennett et al. |
| 2006/0168395 A1 | 7/2006 | Deng et al. |
| 2006/0184718 A1 | 8/2006 | Sinclair et al. |
| 2006/0184719 A1 | 8/2006 | Sinclair |
| 2006/0184720 A1 | 8/2006 | Sinclair et al. |
| 2006/0184722 A1 | 8/2006 | Sinclair |
| 2006/0184723 A1 | 8/2006 | Sinclair et al. |
| 2007/0030734 A1 | 2/2007 | Sinclair et al. |
| 2007/0033323 A1 | 2/2007 | Gorobets |
| 2007/0033324 A1 | 2/2007 | Sinclair |
| 2007/0033326 A1 | 2/2007 | Sinclair |
| 2007/0033328 A1 | 2/2007 | Sinclair et al. |
| 2007/0033329 A1 | 2/2007 | Sinclair et al. |
| 2007/0033330 A1 | 2/2007 | Sinclair et al. |
| 2007/0033331 A1 | 2/2007 | Sinclair et al. |
| 2007/0033332 A1 | 2/2007 | Sinclair et al. |
| 2007/0033374 A1 | 2/2007 | Sinclair et al. |
| 2007/0033375 A1 | 2/2007 | Sinclair et al. |
| 2007/0033376 A1 | 2/2007 | Sinclair et al. |
| 2007/0033377 A1 | 2/2007 | Sinclair et al. |
| 2007/0086260 A1 | 4/2007 | Sinclair |
| 2007/0088904 A1 | 4/2007 | Sinclair |
| 2007/0186032 A1 | 8/2007 | Sinclair et al. |

FOREIGN PATENT DOCUMENTS

| | | |
|---|---|---|
| EP | 0 852 765 B1 | 9/2001 |
| EP | 1100001 B1 | 8/2003 |
| EP | 1 571 557 A1 | 9/2005 |
| JP | 62-283496 A | 12/1987 |
| JP | 2002-251310 A | 9/2002 |
| JP | 2005-122439 A | 5/2005 |
| WO | WO 00/49488 A1 | 8/2000 |
| WO | WO 02/29575 A2 | 4/2002 |
| WO | WO 2004/012027 A2 | 2/2004 |

| | | |
|---|---|---|
| WO | WO 2004/040453 A2 | 5/2004 |
| WO | WO 2004/040455 A2 | 5/2004 |
| WO | WO 2004/046937 A1 | 6/2004 |
| WO | WO 2005/066793 A1 | 7/2005 |
| WO | WO 2007/047062 A3 | 4/2007 |

OTHER PUBLICATIONS

Ban, Amir, "Inside Flash File Systems—Part I", IC Card Systems & Design, Jul./Aug. 1993, pp. 15-16, 18.

Ban, Amir, "Inside Flash File Systems—Part II", IC Card Systems & Design, Sep./Oct. 1993, pp. 21-24.

Intel AP-686 Application Note, "Flash File System Selection Guide," Dec. 1998, 18 pages.

Ban, Amir, "Local Flash Disks: Two Architectures Compared," M-Systems Flash Disk Pioneers, White Paper, Rev. 1.0, Aug. 2001, 9 pages.

Chiang, Mei-Ling et al., "Data Management in a Flash Memory Based Storage Server", National Chiao-Tung University, Hsinchu, Taiwan, Dept. of Computer and Information Science, 8 pages.

Kim, Han-Joon et al., "A New Flash Memory Management for Flash Storage System", Computer Software and Applications Conference, 1999. Compsac '99 Proceedings. IEEE Comput. Soc., pp. 284-289.

Chiang et al., "Cleaning Policies in Mobile Computers Using Flash Memory," *Journal of Systems & Software*, vol. 48, 1999, pp. 213-231.

Imamiya et al., "A 125-mm2 1-Gb NAND Flash Memory with 10-Mbyte/s Program Speed" Nov. 2002, IEEE Journal of Solid-State Circuits, vol. 37, No. 11, pp. 1493-1501.

Kjelso et al., "Memory Management in Flash-Memory Disks with Data Compression," 1995, Springer-Verlag, pp. 399-413.

Kim et al., "A Space-Efficient Flash Translation Layer for CompactFlash Systems," *IEEE Transactions on Consumer Electronics*, vol. 48, No. 2, May 2002, pp. 366-375.

Lim et al., "An Efficient NAND Flash File System for Flash Memory Storage," *IEEE Transactions on Computer*, vol. 55, No. 7, Jul. 1, 2006, pp. 906-912.

PNY Technologies Attache Flash Product, http://web.archive.org/web/20030704092223/http://www.pny.com/products/flash/attache.asp. Jul. 4, 2003. pp. 1-2.

Wu et al., "eNVy: A Non-Volatile, Main Memory Storage System," *ACM Sigplan Notices*, vol. 29, No. 11, Nov. 1, 2004, pp. 86-97.

EPO/ISA, "Notification of Transmittal of the International Search Report and the Written Opinion of the International Searching Authority, or the Declaration," corresponding PCT/ US2006/030093 on May 10, 2007, 13 pages.

EPO/ISA, "Notification of Transmittal of the International Search Report and the Written Opinion of the International Searching Authority, or the Declaration," corresponding PCT/ US2006/030242 on Apr. 25, 2007, 14 pages.

Chiang et al., "Managing Flash Memory in Personal Communication Device," *IEEE*, 1997, pp. 177-182.

USPTO, "Office Action," mailed in related U.S. Appl. No. 11/462,007 on Oct. 17, 2008, 29 pages.

USPTO, "Office Action," mailed in related U.S. Appl. No. 11/462,001 on Oct. 20, 2008, 40 pages.

USPTO, "Office Action," mailed in related U.S. Appl. No. 11/461,997 on Oct. 30, 2008, 27 pages.

File Commands

| Command | Parameters | Description |
|---|---|---|
| Create | <fileID> | Creates an entry identified by <fileID> in the directory in the device.<br>If <fileID> is not specified with the command, it is assigned by the device and is returned to the host. |
| Open | <fileID> | Enables execution of subsequent data commands for the specified file. |
| Close | <fileID> | Disables execution of subsequent data commands for the specified file. |
| Delete | <fileID> | Indicates that directory, file index, and file info entries for the specified file should be deleted. File data may be erased. |
| Erase | <fileID> | Indicates that directory, file index, and file info entries for the specified file should be deleted and that file data should be erased immediately. |
| List_files | | Reads all valid <fileID> values from the device, in numerical order. |

*FIG. 2-1*

Data Commands

| Command | Parameters | Description |
|---|---|---|
| Write | <fileID> | Overwrites data in specified file at offset address defined by current value of write_pointer. |
| Insert | <fileID> | Inserts data in specified file at offset address defined by current value of write_pointer. |
| Remove | <fileID> <length> | Deletes data of size <length> from specified file at offset address defined by current value of write_pointer. |
| Read | <fileID> | Reads data from specified file at offset address defined by current value of read_pointer. |
| Save_buffer | <fileID> | Saves data in buffer for specified file to a temporary location in flash memory. |
| Write_pointer | <fileID> <offset> | Defines new current value for write_pointer for specified file. |
| Read_pointer | <fileID> <offset> | Defines new current value for read_pointer for specified file. |

*FIG. 2-2*

Info Commands

| Command | Parameters | Description |
|---|---|---|
| Write_info | <fileID> | Writes file_info for specified file at offset address defined by current value of info_write_pointer. |
| Read_info | <fileID> | Reads file_info for specified file at offset address defined by current value of info_read_pointer. |
| Info_write_pointer | <fileID> <offset> | Defines new current value for info_write_pointer for specified file. |
| Info_read_pointer | <fileID> <offset> | Defines new current value for info_read_pointer for specified file. |

*FIG. 2-3*

Stream Commands

| Command | Parameters | Description |
|---|---|---|
| Stream | <length> | Defines an uninterrupted stream of data that will be transferred to or from the device. |
| Pause | <time> | Defines a delay that is inserted before execution of the following command. |

*FIG. 2-4*

State Commands

| Command | Parameters | Description |
|---|---|---|
| Idle | | The device should enter an idle state, within which it may perform internal operations. |
| Standby | | The device should enter a standby state, within which it may not perform internal operations. |
| Shut-down | | The device will be shut down and power will be removed when it is next not in a busy state. |

*FIG. 2-5*

Device Commands

| Command | Parameters | Description |
|---|---|---|
| Capacity | | Request from host for the device to report capacities occupied by file data and available for new file data. |
| Status | | Request from host for the device to report its current status. |

*FIG. 2-6*

Format of a Plain File

Format of a Common File

Format on an Edited Plain File

Format of an Edited Common File

Host Data Programming after Buffer Swap-In

Aligned Data Read to Buffer

Aligned Data Programming from Buffer

Non-Aligned Data Read to Buffer

Non-Aligned Non-Sequential Data Programming from Buffer

File Indexing

Physical FIT Blocks

Examples of FIT File Update Operations

Block State Diagram

Figures 1, 2:
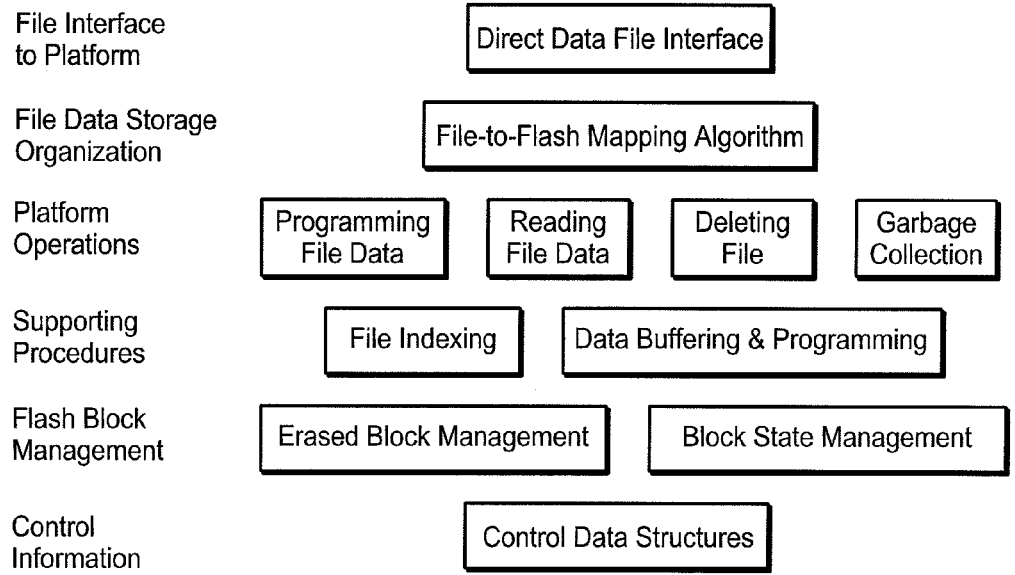
Figures 1, 9:
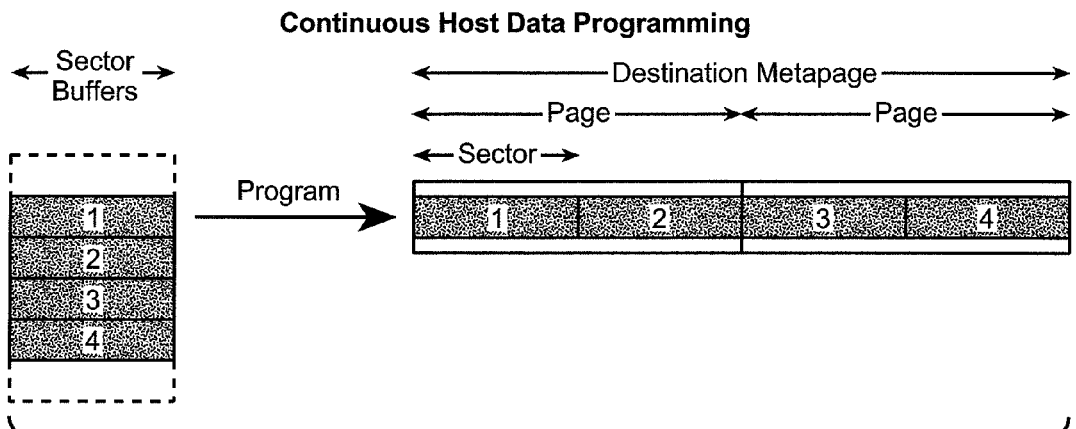
Figures 2, 9:
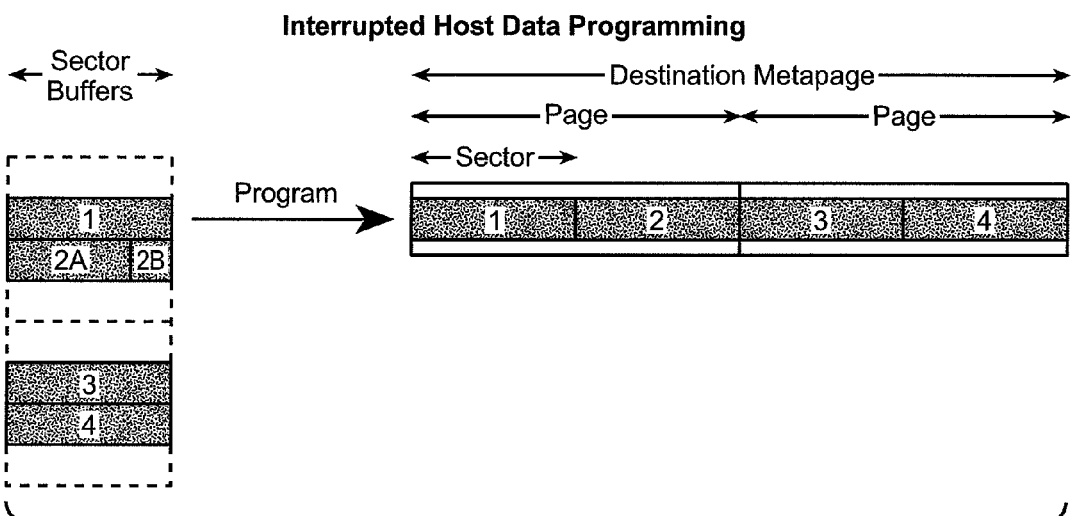
Figures 3, 9:
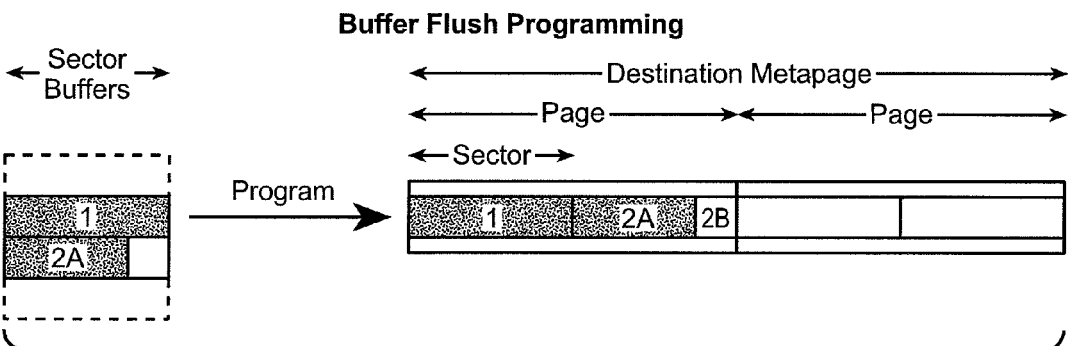
Figures 4, 9:
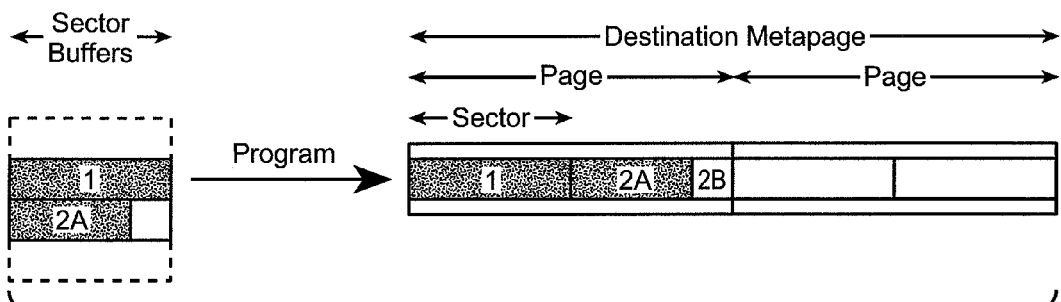
Figures 5, 9:
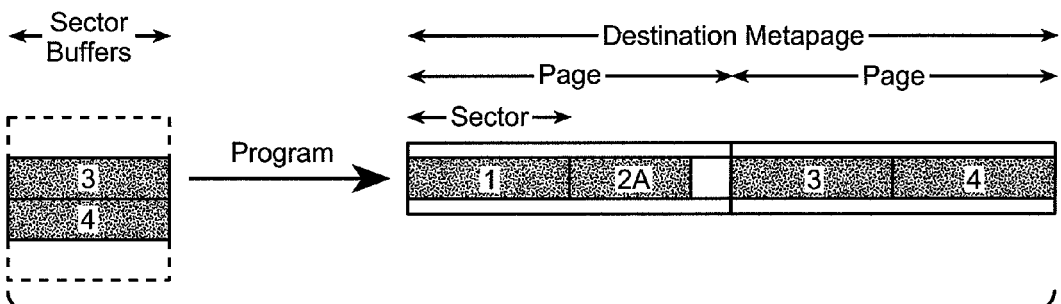
Figures 6, 9:
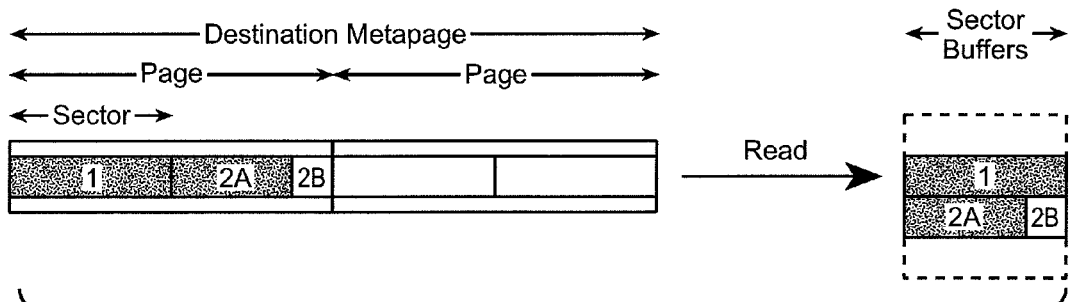
Figures 7, 9:
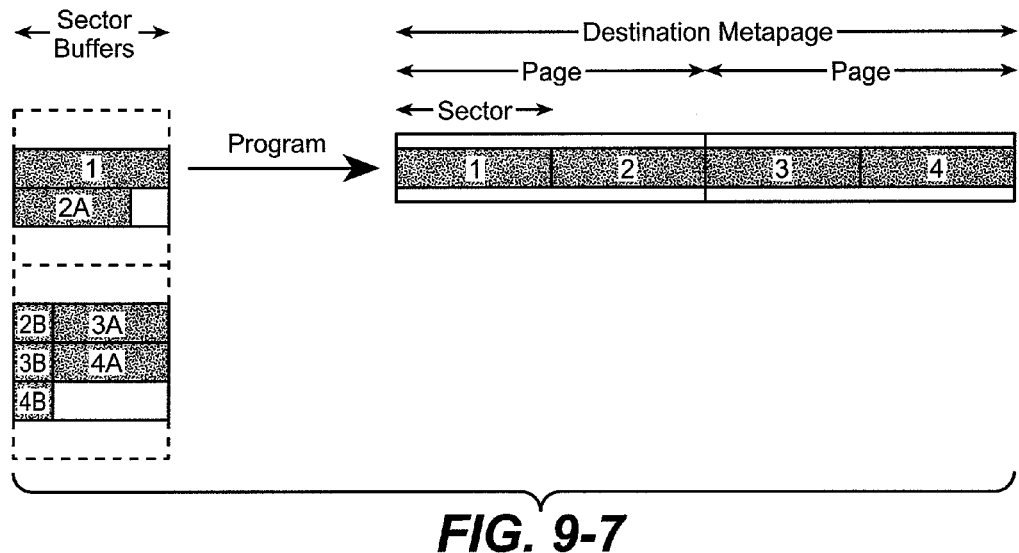
Figures 8, 9:
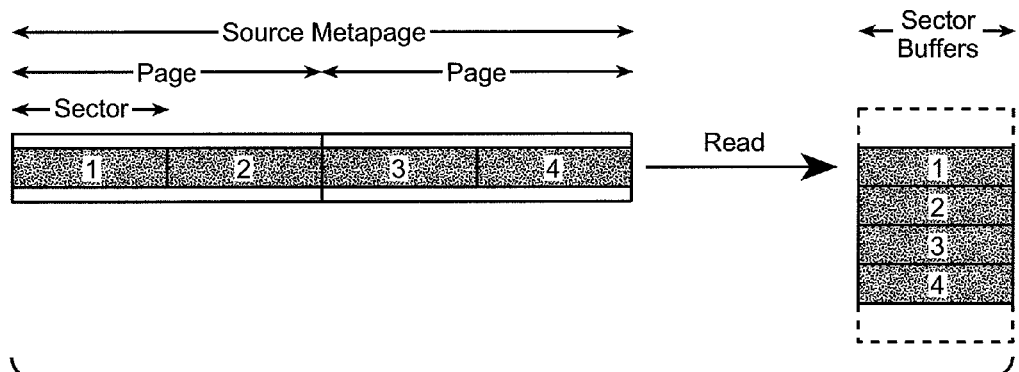
Figure 9:
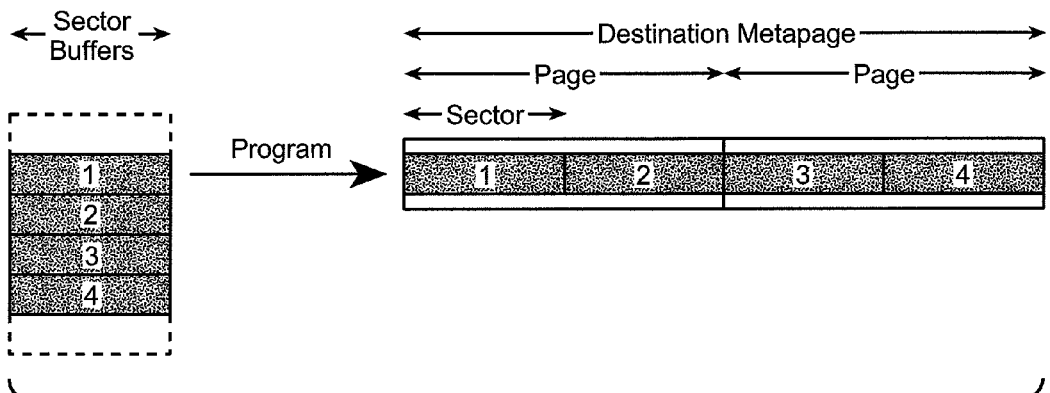
Figures 9, 10:
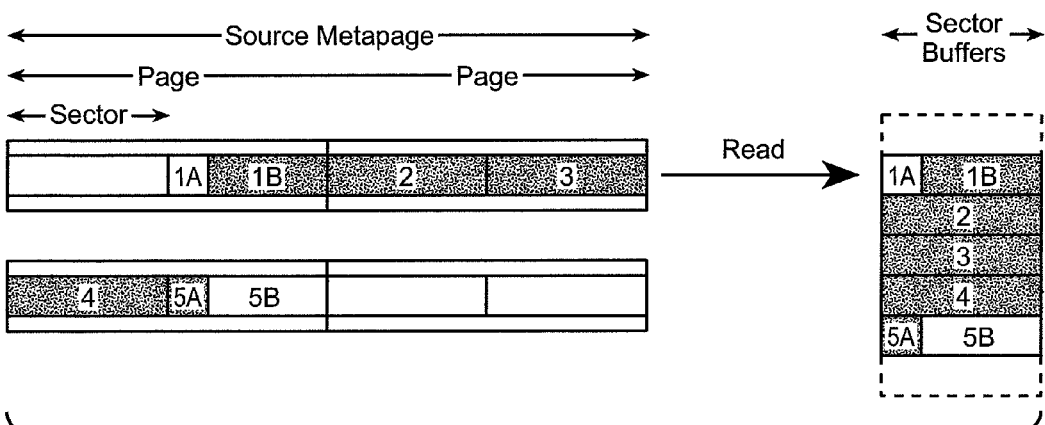
Figures 9, 10, 11:
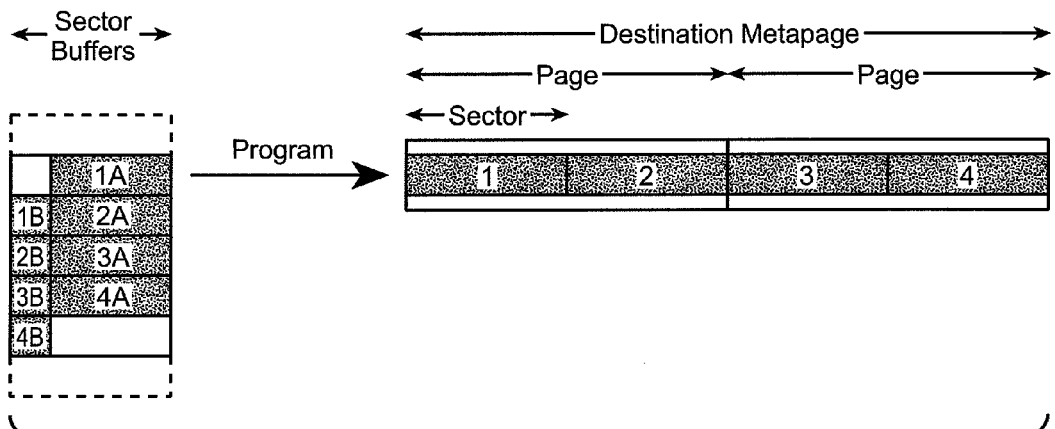
Figures 9, 10, 11, 12:
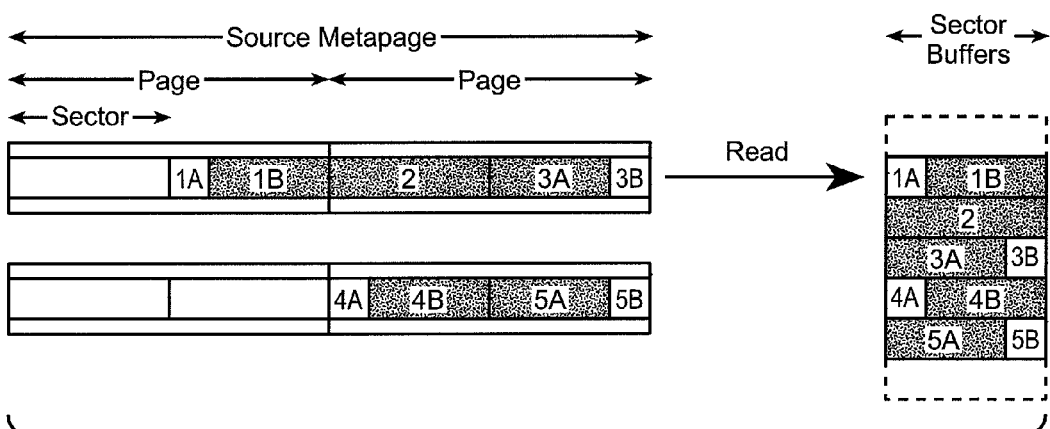

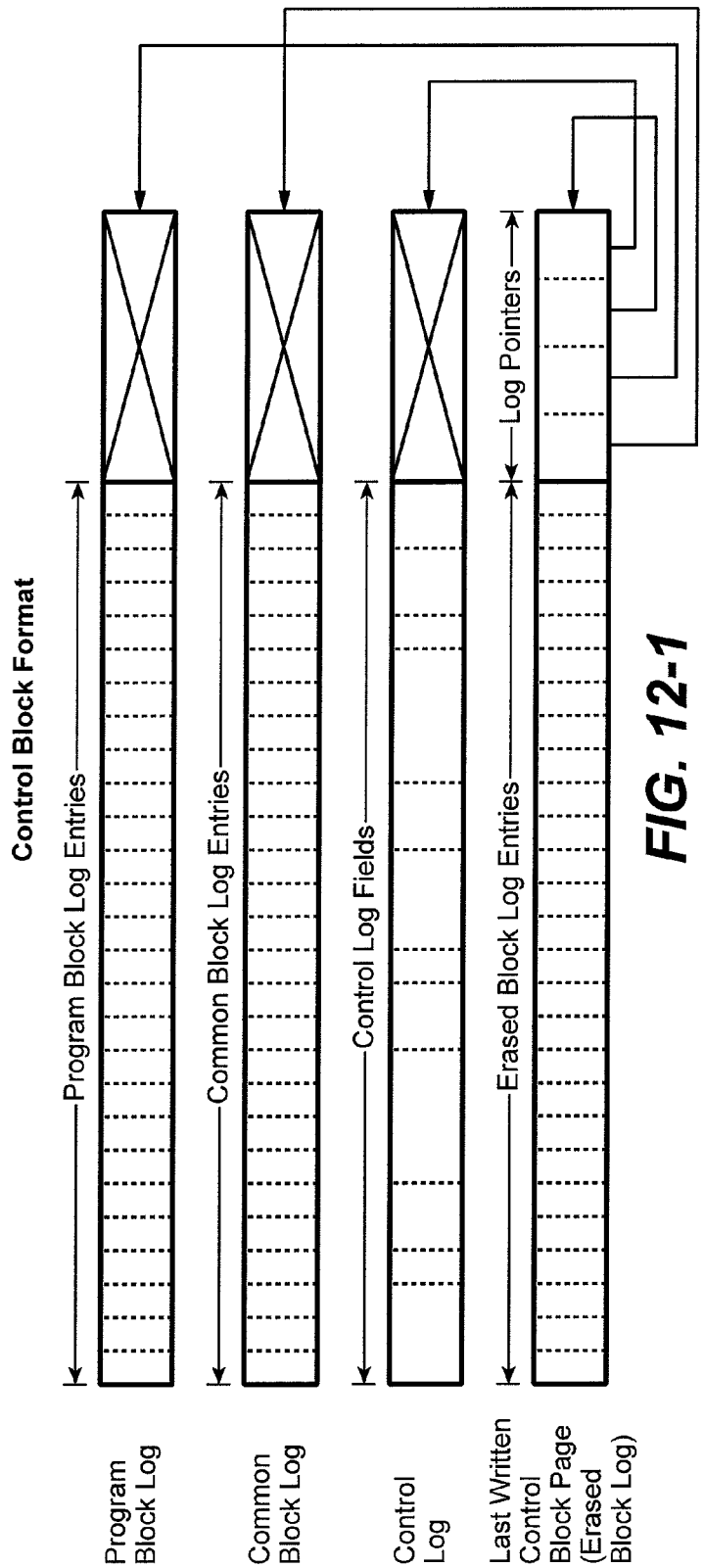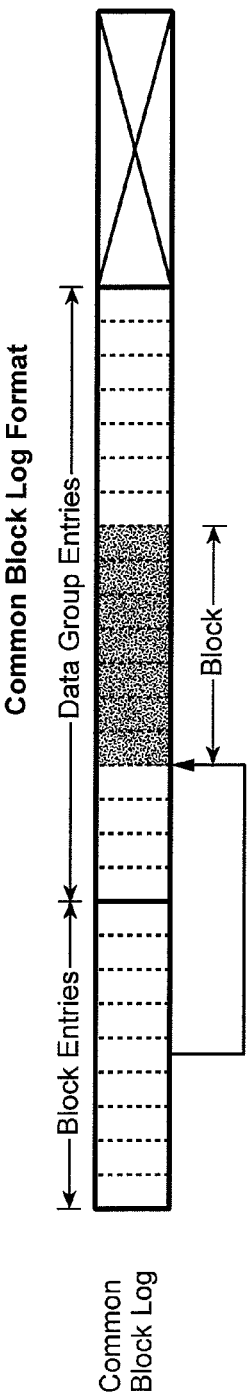
FIG. 12-1
FIG. 12-2

FIG. 13-1

| FIG. 13-1A |
| --- |
| FIG. 13-1B |

FIG. 13-1A

Command Set Used with Static Files (Part A)

| Command | Parameters | Description |
| --- | --- | --- |
| Create | <fileID> | Creates an entry identified by <fileID> in the directory in the device.<br><fileID> should be specified with the command, to denote an appropriate numerical identifier for the static file.<br>The Create command may be used after the direct data file device has returned an error status following an Open command for a file that does not exist in the directory in the direct data file device. |
| Open | <fileID> | Enables execution of subsequent data commands for the specified file.<br>The write_pointer is set to the end of the file and the read_pointer is set to the beginning of the file.<br>If the file does not exist, an error status is returned. |
| Close | <fileID> | Disables execution of subsequent data commands for the specified file.<br>The Close command for a static file causes an entry to be inserted into either the obsolete block garbage collection queue or the file garbage collection queue. |
| Delete | <fileID> | The Delete command is not normally used with static files. However, it may be used if the size of the device partition assigned for static files is reduced. |
| List_files | | Reads all valid <fileID> values from the device, in numerical order. |
| Write | <fileID> | Overwrites data in specified static file at offset address defined by current value of write_pointer.<br>The offset address should not be outside the range corresponding to the file size used by the host for all static files. |
| Read | <fileID> | Reads data from specified file at offset address defined by current value of read_pointer.<br>The offset address should not be outside the range corresponding to the file size used by the host for all static files. |

Command Set Used with Static Files (Part B)

| Command | Parameters | Description |
|---|---|---|
| Save_buffer | <fileID> | Saves data in buffer for specified static file to a temporary location in flash memory.<br>Save_buffer is used when the protocol in use for static files requires that data that has been supplied for the file must be committed to flash memory. |
| Write_pointer | <fileID> <offset> | Defines new current value for write_pointer for specified file.<br>Write_pointer is used to define the offset within the static file of data to be written, for the first data after the file is opened, or for data that is not sequential to previously written data.<br>The offset should not be outside the range corresponding to the file size used by the host for all static files. |
| Read_pointer | <fileID> <offset> | Defines new current value for read_pointer for specified file.<br>Read_pointer is used to define the offset within the static file of data to be read, for the first data after the file is opened, or for data that is not sequential to previously read data.<br>The offset should not be outside the range corresponding to the file size used by the host for all static files. |
| Stream | <length> | Defines an uninterrupted stream of data that will be transferred to or from the device.<br>Used for modeling only. |
| Pause | <time> | Defines a delay that is inserted before execution of the following command.<br>Used for modeling only. |
| Idle | | The device should enter an idle state, within which it may perform internal operations.<br>The idle command is used immediately after a Close command for a static file, to force any pending garbage collection operations to be performed.<br>No other command should be sent to the device until the device shows not-busy staus for background operations. |
| Standby | | The device should enter a standby state, within which it may not perform internal operations. |
| Shut-down | | The device will be shut down and power will be removed when it is next not in a busy state. |
| Capacity | | Request from host for the device to report capacities occupied by file data and available for new file data. |
| Status | | Request from host for the device to report its current status.<br>The status command does not terminate a command being executed. |

*FIG. 13-1B*

FLASH MEMORY SYSTEMS UTILIZING DIRECT DATA FILE STORAGE

CROSS-REFERENCE TO RELATED APPLICATION

The benefit is claimed of U.S. provisional patent application No. 60/705,388, filed Aug. 3, 2005 by Alan W. Sinclair and Barry Wright.

BACKGROUND AND SUMMARY

This application relates generally to the operation of re-programmable non-volatile memory systems such as semiconductor flash memory, including management of the interface between a host device and the memory system, and, more specifically, to the efficient use of a data file interface rather than the common mass memory logical address space (LBA) interface.

Described herein are developments in various operations of a flash memory that are described in pending U.S. patent application Ser. Nos. 11/060,174, publication no. 2006/0184718 A1, 11/060,248, publication no. 2006/0184719 A1, and 11/060,249, publication no. 2006/0184720 A1, all filed on Feb. 16, 2005 naming either Alan W. Sinclair alone or with Peter J. Smith (hereinafter referenced as the "Prior Applications").

Further developments are described in related U.S. patent applications of Alan W. Sinclair and Barry Wright, namely non-provisional applications Nos. 11/382,224, publication no. 2007/0033328 A1, and 11/382,232, now U.S. Pat. No. 7,450,420, and provisional applications Nos. 60/746,740 and 60/746,742, all filed on May 8, 2006, and non-provisional applications entitled "Indexing Of File Data In Reprogrammable Non-Volatile Memories That Directly Store Data Files," application Ser. No. 11/459,255, publication no. 2007/0033375 A1, "Reprogrammable Non-Volatile Memory Systems With Indexing of Directly Stored Data Files," application Ser. No. 11/459,246, publication no. 2007/0033374 A1, "Methods of Managing Blocks in NonVolatile Memory" application Ser. No. 11/459,268, publication no. 2007/0033332A1, and "NonVolatile Memory With Block Management," application Ser. No. 11/459,2609 publication no. 2007/0033331 A1 all filed Jul. 21, 2006.

All patents, patent applications, articles and other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

Data consolidation is treated differently herein than garbage collection and the two processes are implemented at least partially by different algorithms. When a file or memory block contains obsolete data, a garbage collection operation is utilized to move valid data of the file or block to one or more other blocks. This gathers valid data into a fewer number of blocks, thus freeing up capacity occupied by obsolete data once the original source block(s) are erased. In data consolidation, valid data of one partially filled block, such as is usually created as the result of writing a new file, are combined with valid data of another partially filled block. One or both of the original blocks that were the source of the data, now containing obsolete duplicate data, are then scheduled for garbage collection. Although queues are provided for scheduling individual garbage collection operations to recover memory storage capacity occupied by obsolete data, data consolidation preferably occurs when no garbage collection is scheduled and conditions are otherwise satisfactory for consolidation.

Rather than scheduling data consolidation of a newly written file right after the file is closed, data of a newly written file are maintained in the original blocks to which they were programmed after receipt from a host. This most commonly includes a block that is partially filled with the new data. Since it is not uncommon for a data file to be deleted or updated in a way that creates obsolete data, consolidation of the data of the partially filled block is postponed as long as possible after the file is closed. The file may be deleted without the need to relocate any data. Therefore, if the file is deleted or updated before such a consolidation becomes necessary, the consolidation is avoided. Such a consolidation can become necessary, as the memory becomes full, for there to be enough erased blocks for further programming of new data. But because the file based memory does not retain data files that have been deleted by the host, contrary to the case when a logical interface is used, the memory will usually have a sufficient number of erased blocks even though the consolidation is delayed. The time taken by the omitted consolidation is therefore saved, and the performance of the memory improved as a result.

There are several other developments in the direct file storage, described below, that may be summarized:

1. Once a file is closed, it is not added to the file garbage collection queue unless it contains obsolete data.

2. Garbage collection of a file does not create a common block that contains data from another file. Data for the file, which must be copied during the garbage collection, are programmed to the current program block for the file. The program block remains partially programmed at the end of the garbage collection.

3. When data must be relocated from a common block as a result of a file group in the block being made obsolete by deletion of a file, remaining valid data are relocated into an available space of a program block.

4. Movement of host data written directly into a full or portion of a program block is avoided.

5. During garbage collection of a file, data are relocated to a program block for the file. There is no dedicated intermediate copy block.

6. Data are transferred between the memory system controller buffer memory and the memory cell array in complete sectors of data. This allows the generation of an ECC during programming and checking of an ECC during data read.

7. The start of a data group or file group in a common block is aligned to the start of a metapage. On-chip copy may consequently be used for block consolidation. Data groups in program blocks have no specific alignment to physical structures.

8. A swap block within the flash memory is used to make a security copy of data held in the volatile controller buffer memory for an open file that is not active; that is, when the most recent write command relates to a different file. It may also be used as part of a virtual buffer structure, to allow the available buffer memory capacity to support a larger number of open files through the use of swap operations between them.

9. When a FIT file is moved to another FIT range because its current range overflows, the file data pointer in the directory is updated to reflect the new FIT range.

10. Data in a FIT update block for a FIT range is consolidated with data in the FIT block for the range when the amount of data for the range in the FIT update block exceeds a threshold value. This allows data for new files to be consolidated to a FIT block.

11. During compaction of a FIT update block, a FIT file for a closed file is relocated to the FIT block for its range if sufficient erased space exists. Otherwise, it is relocated to the compacted FIT update block.

12. A host may use write_pointer and read_pointer commands to control all files in a set to have equal size, the same as the size of a metablock, and may use close and idle commands to cause a file in the set to be consolidated into a single metablock immediately after the file is closed.

13. The set of host commands includes read and write commands for a specified fileID that include companion commands for the values of the Write_pointer and Read_pointer that give the memory addresses at which the commanded data write or read is to begin.

DRAWINGS

Figures 1, 3:
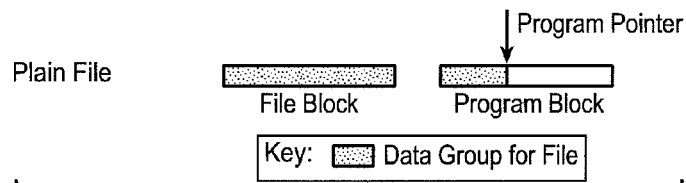
Figures 2, 3:
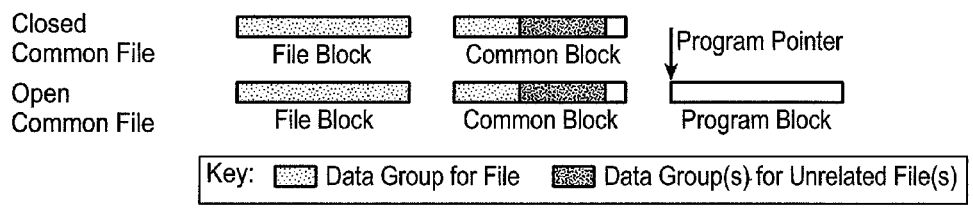
Figure 3:
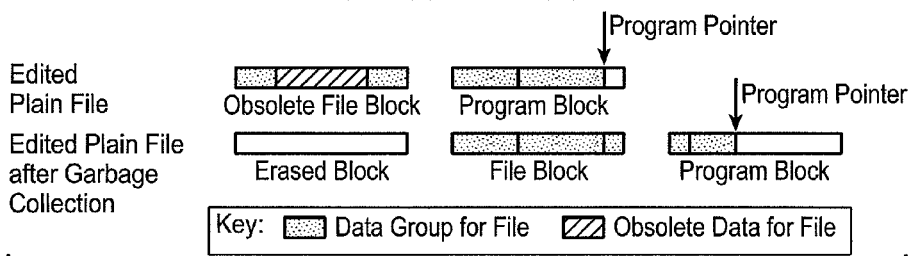
Figures 3, 4:
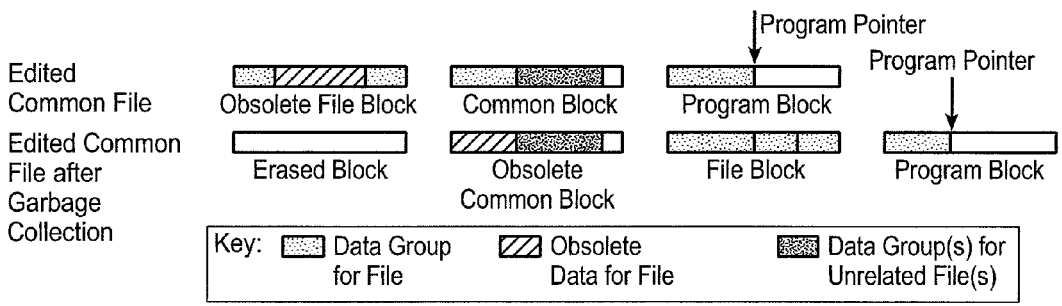
Figures 1, 4:
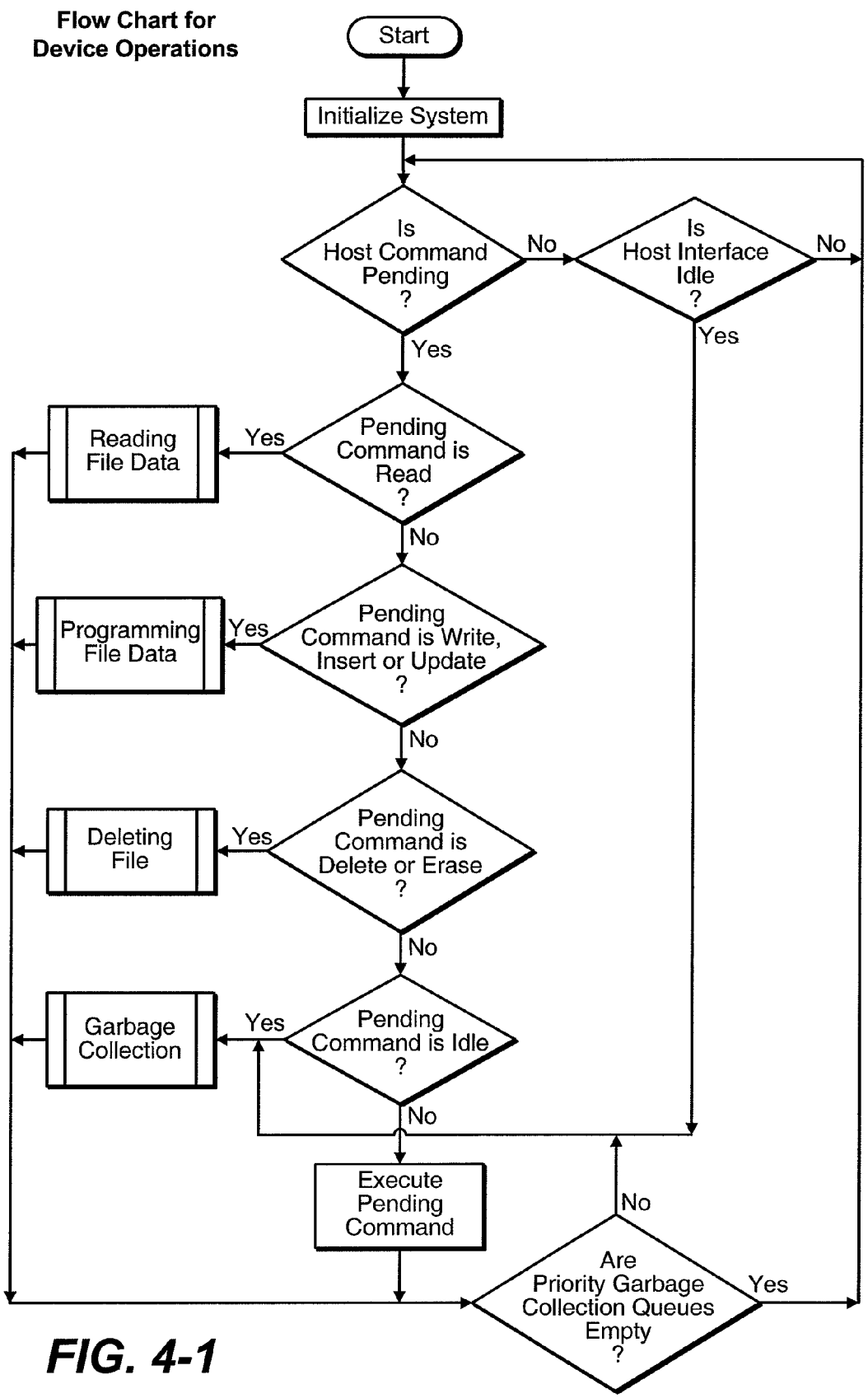
Figures 1, 5:
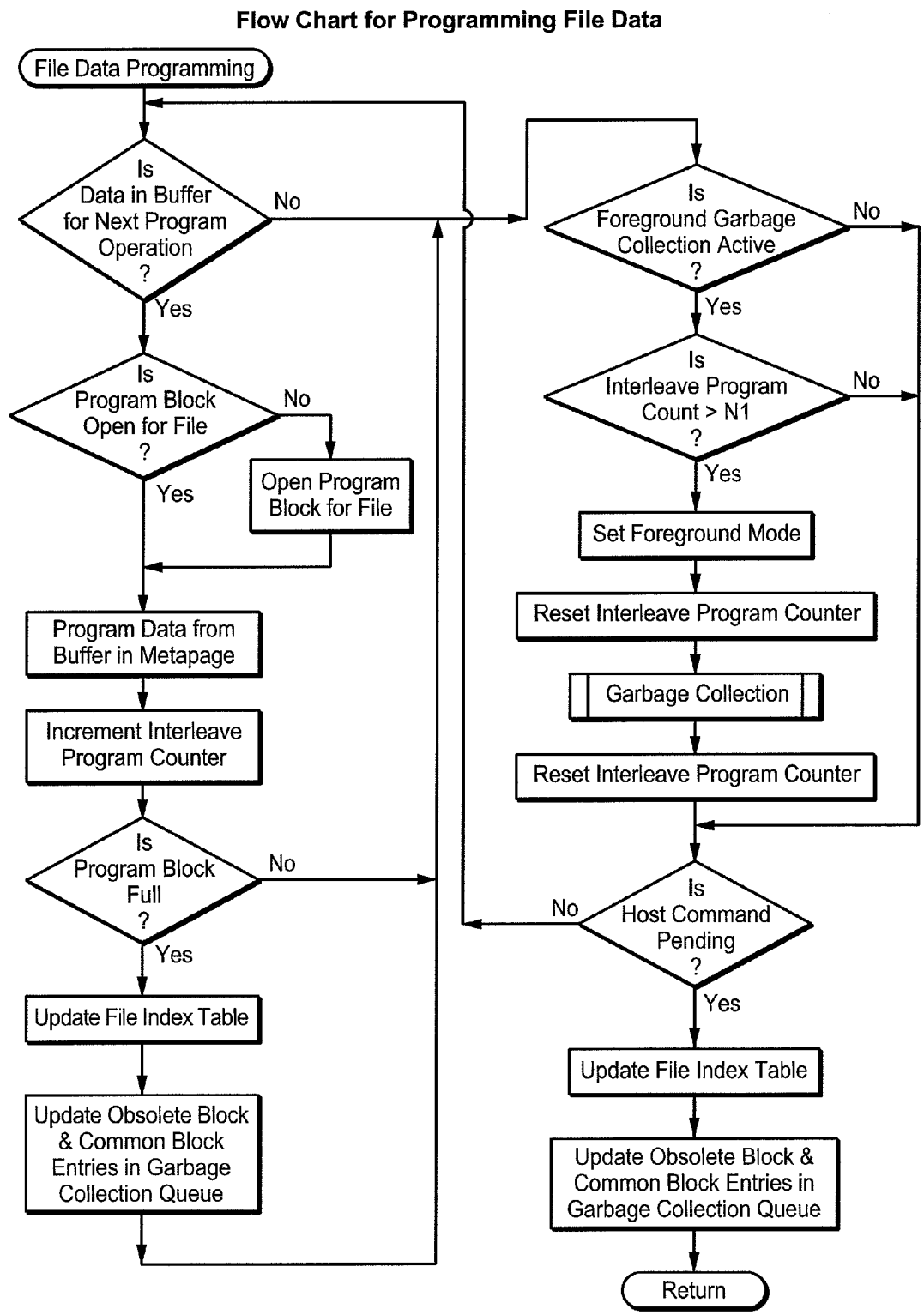
Figures 1, 6:
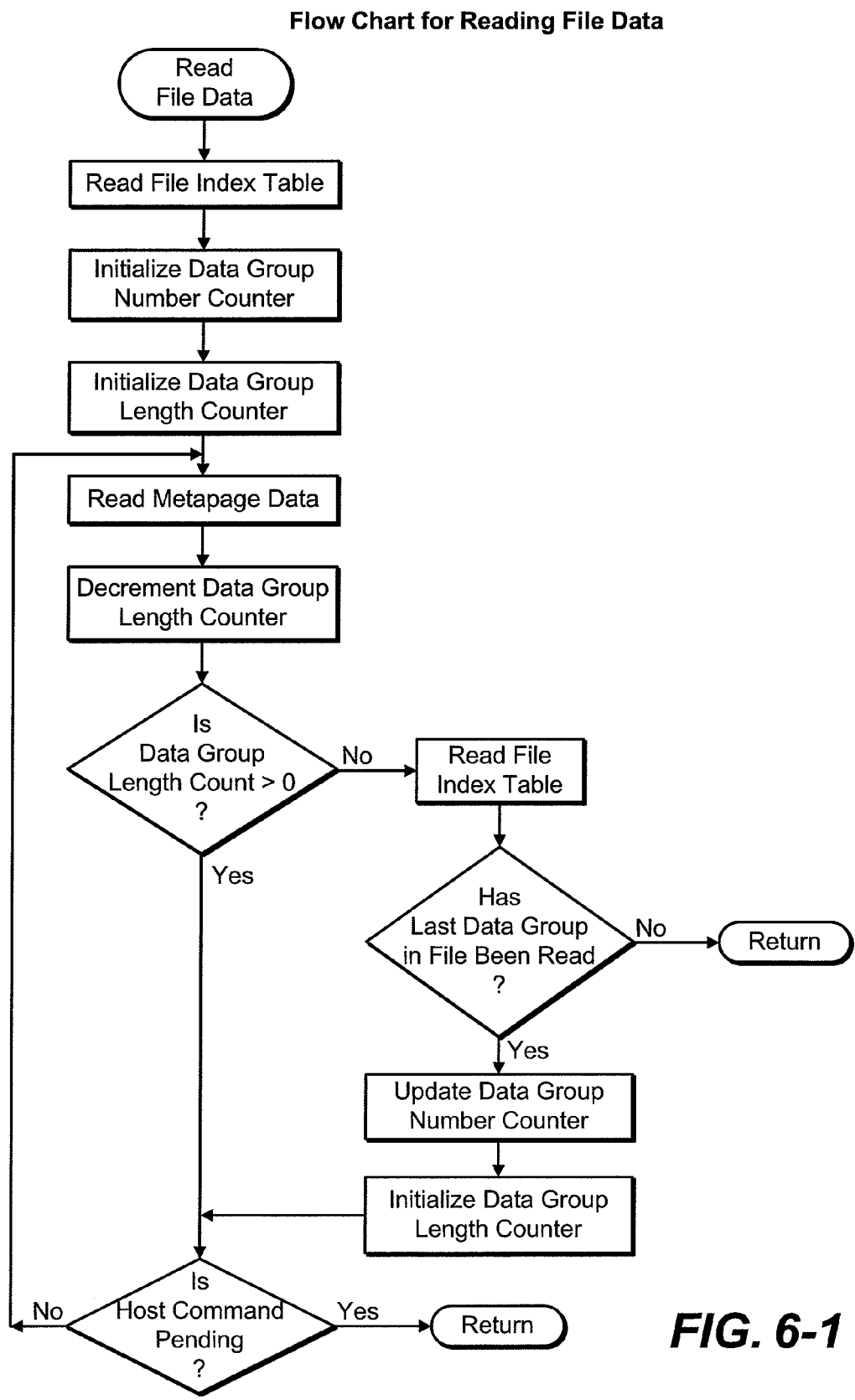
Figures 1, 7:
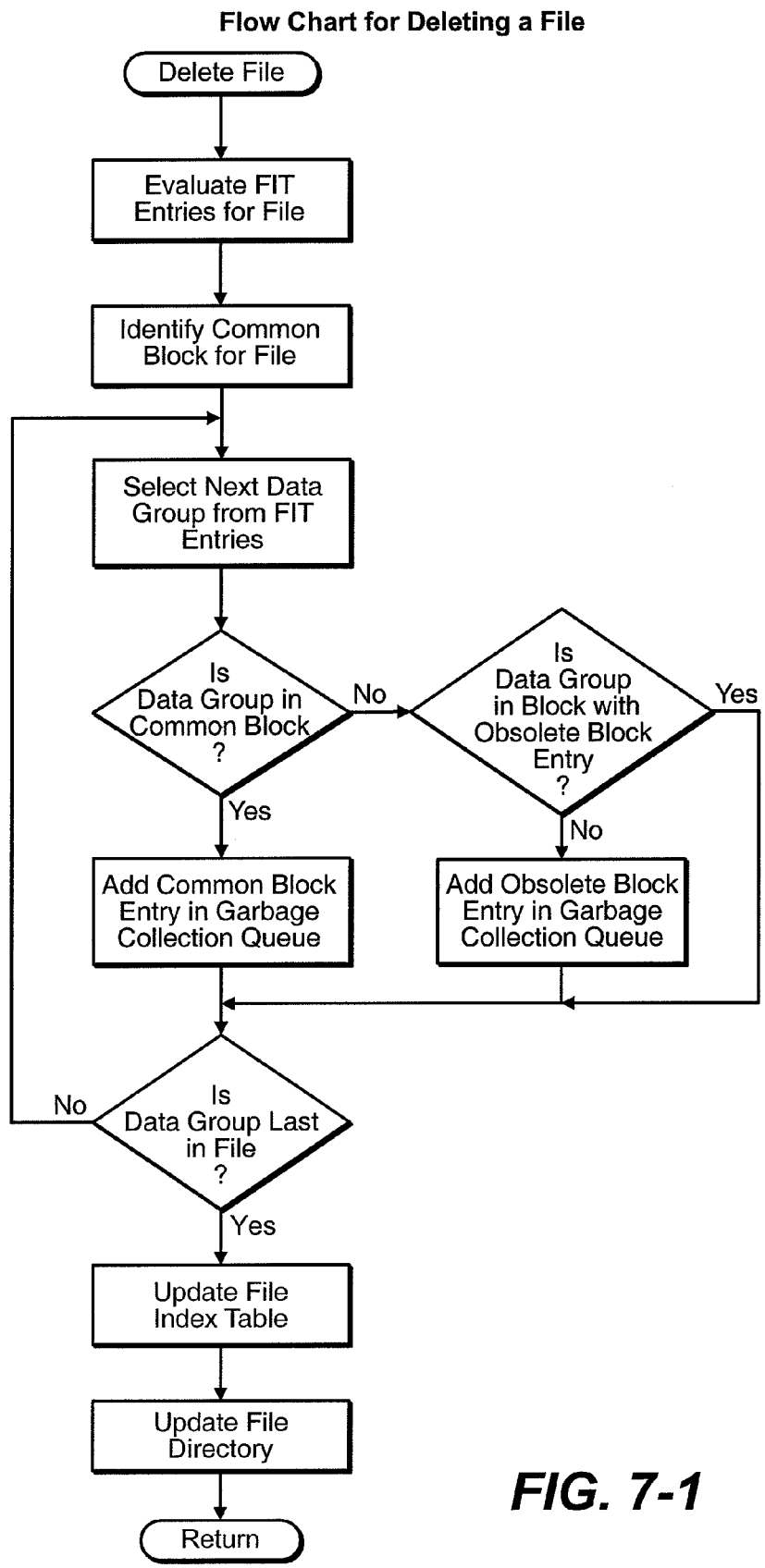
Figures 1, 8:
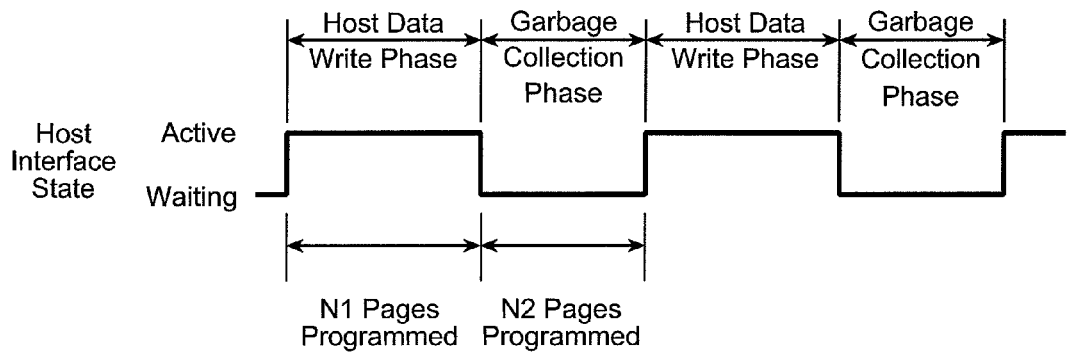
Figures 2, 8:
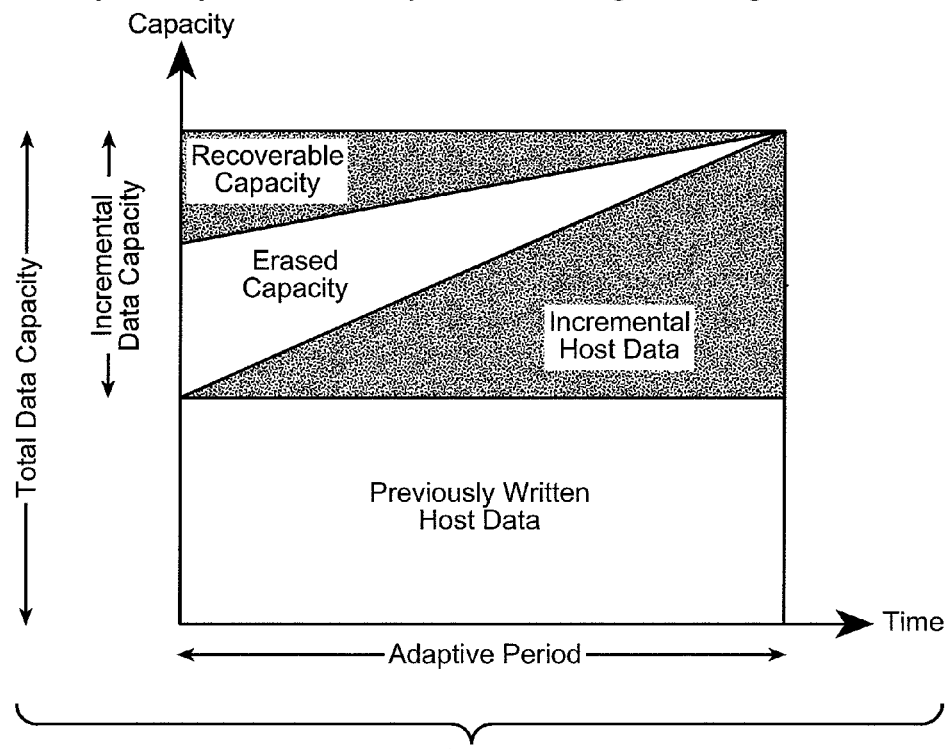
Figures 3, 8:
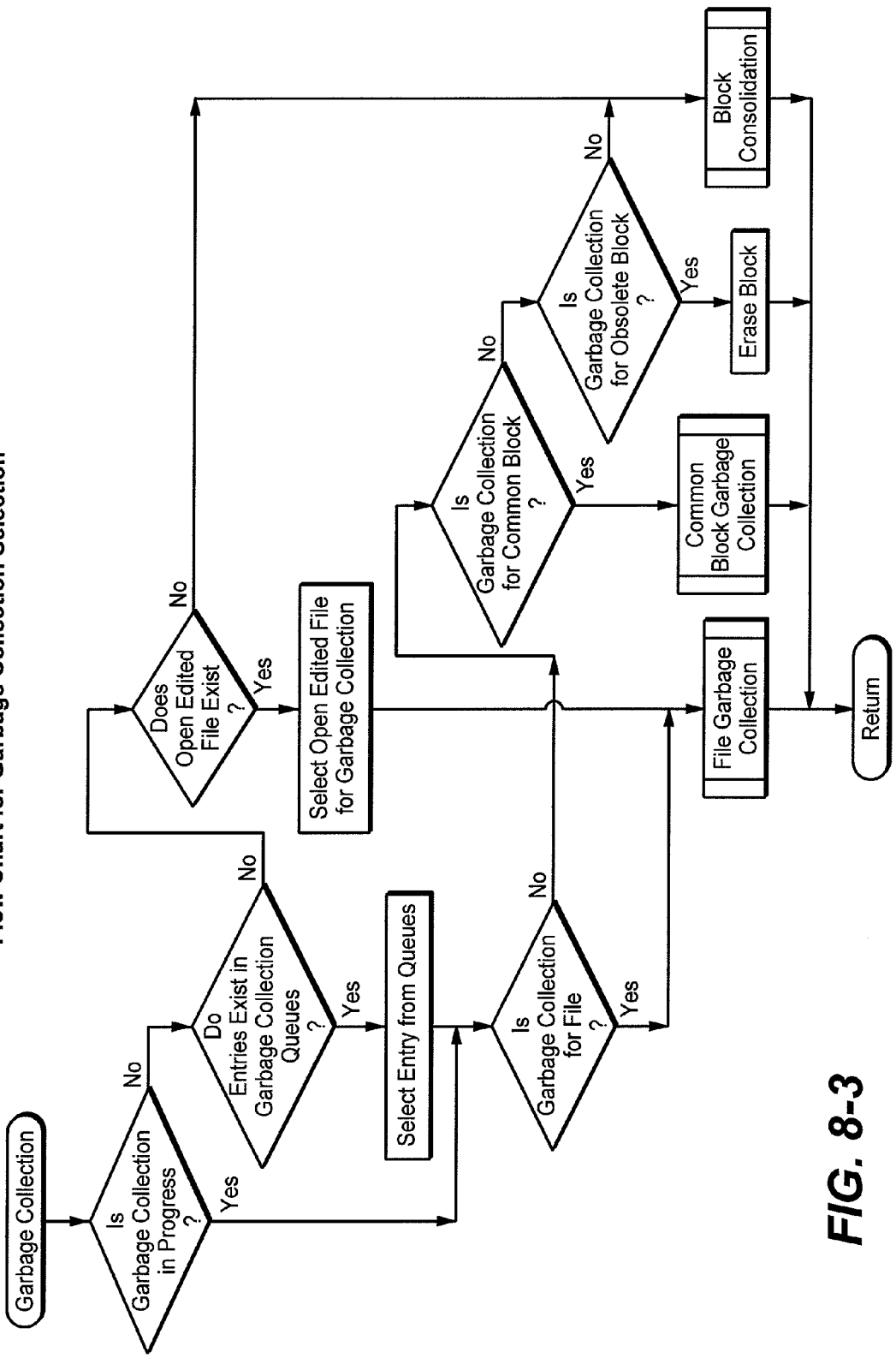
Figures 4A, 8:
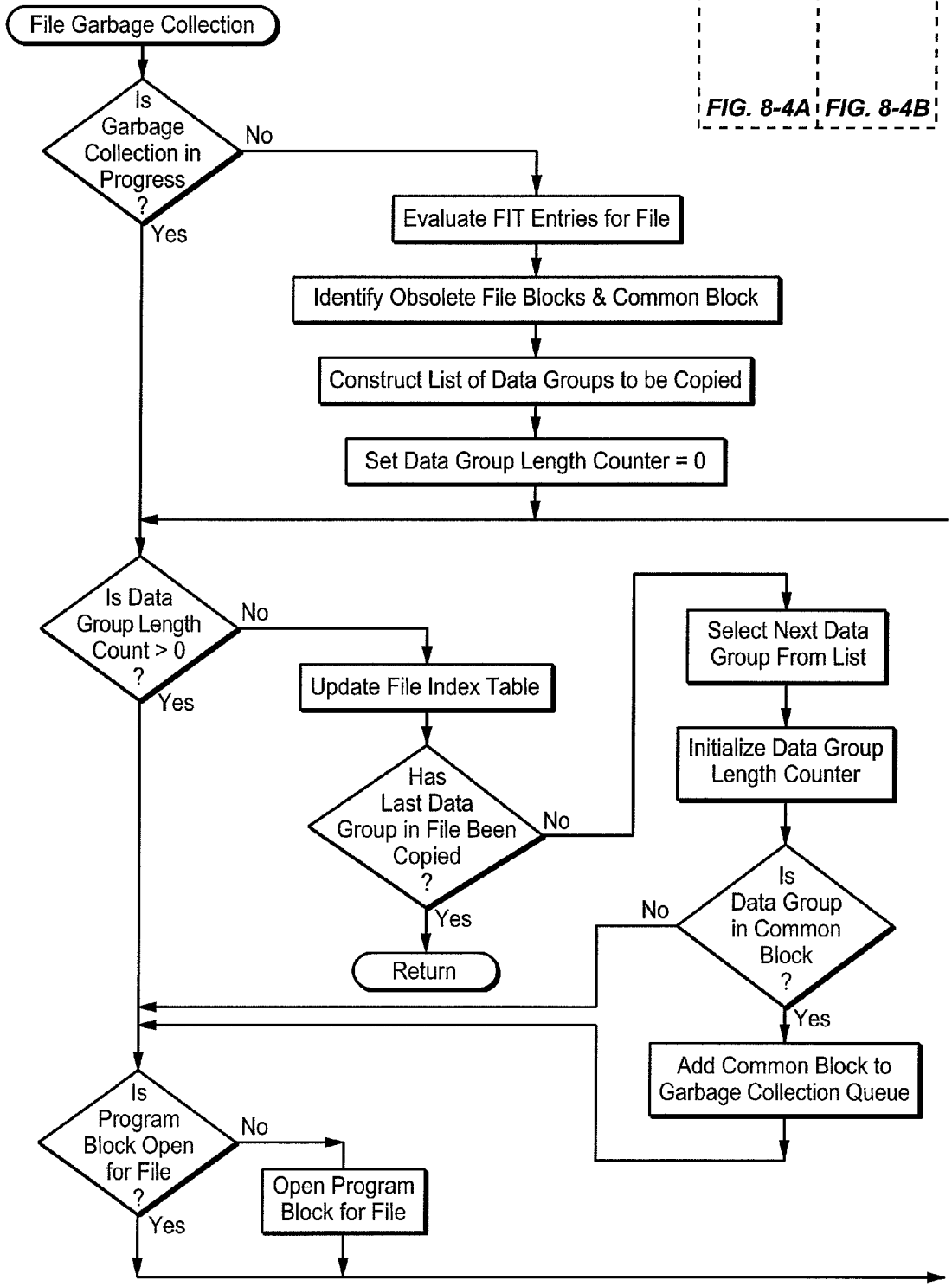
Figures 4B, 8:
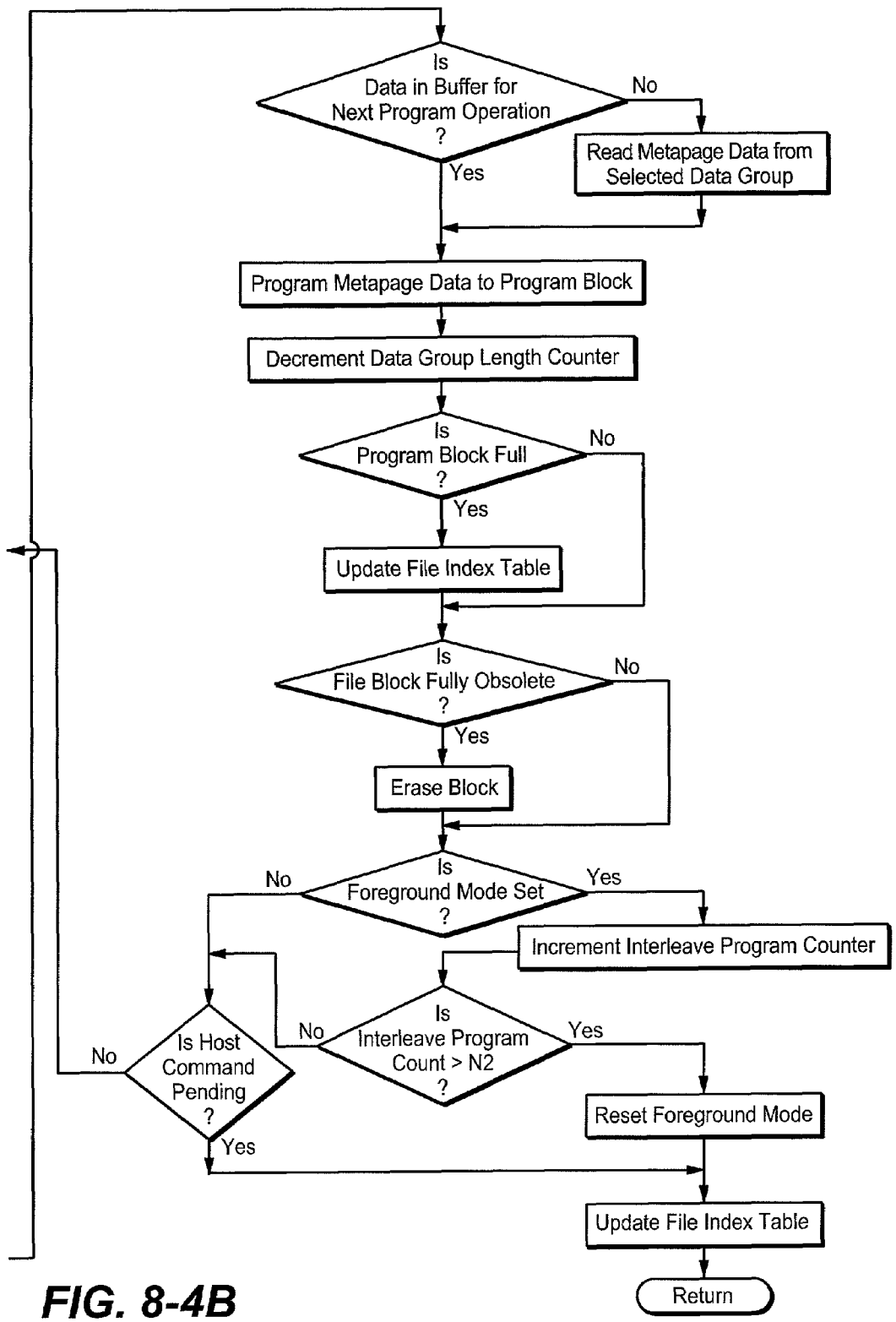
Figures 5A, 8:
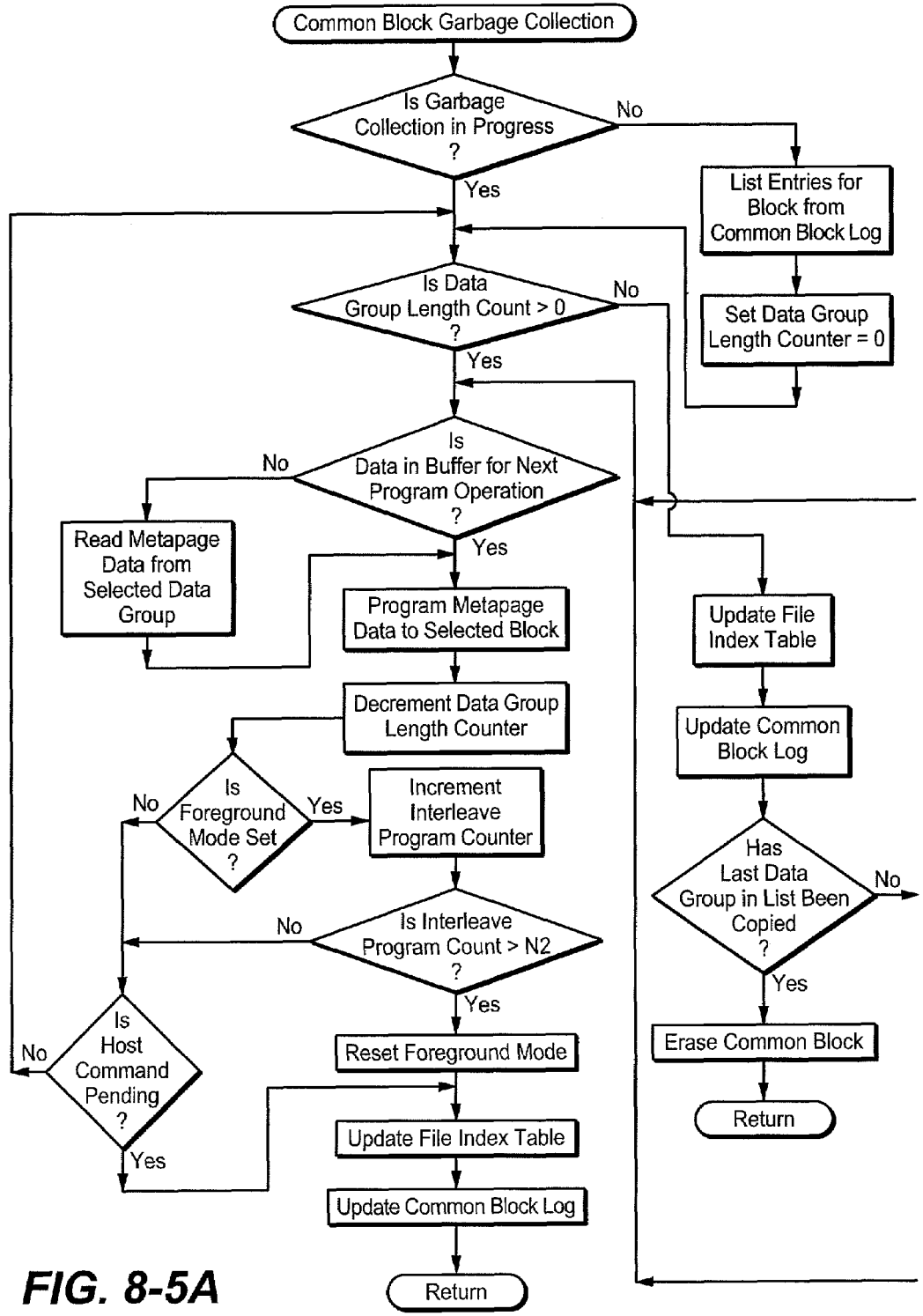
Figures 5, 5B, 8:
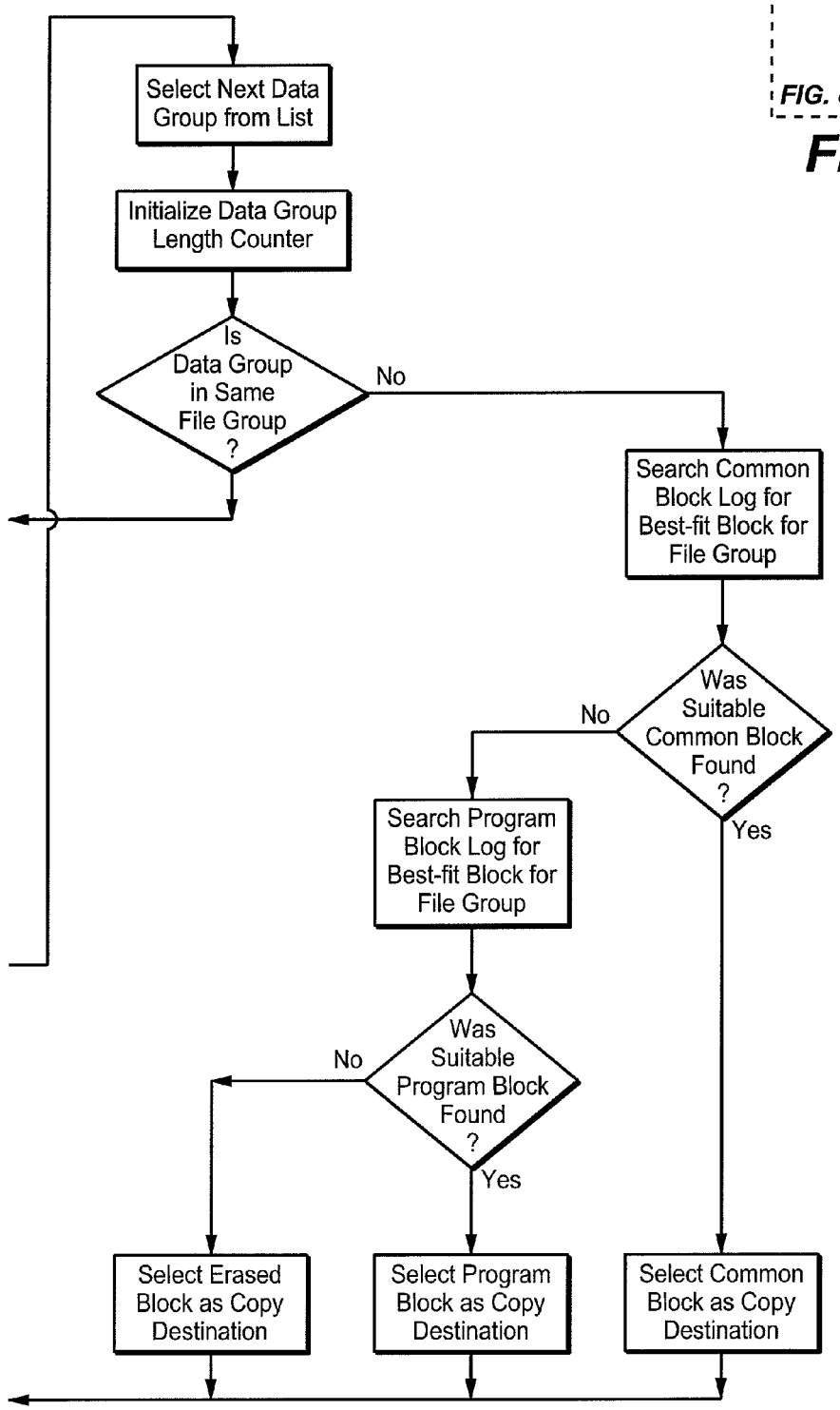
Figures 6A, 8:
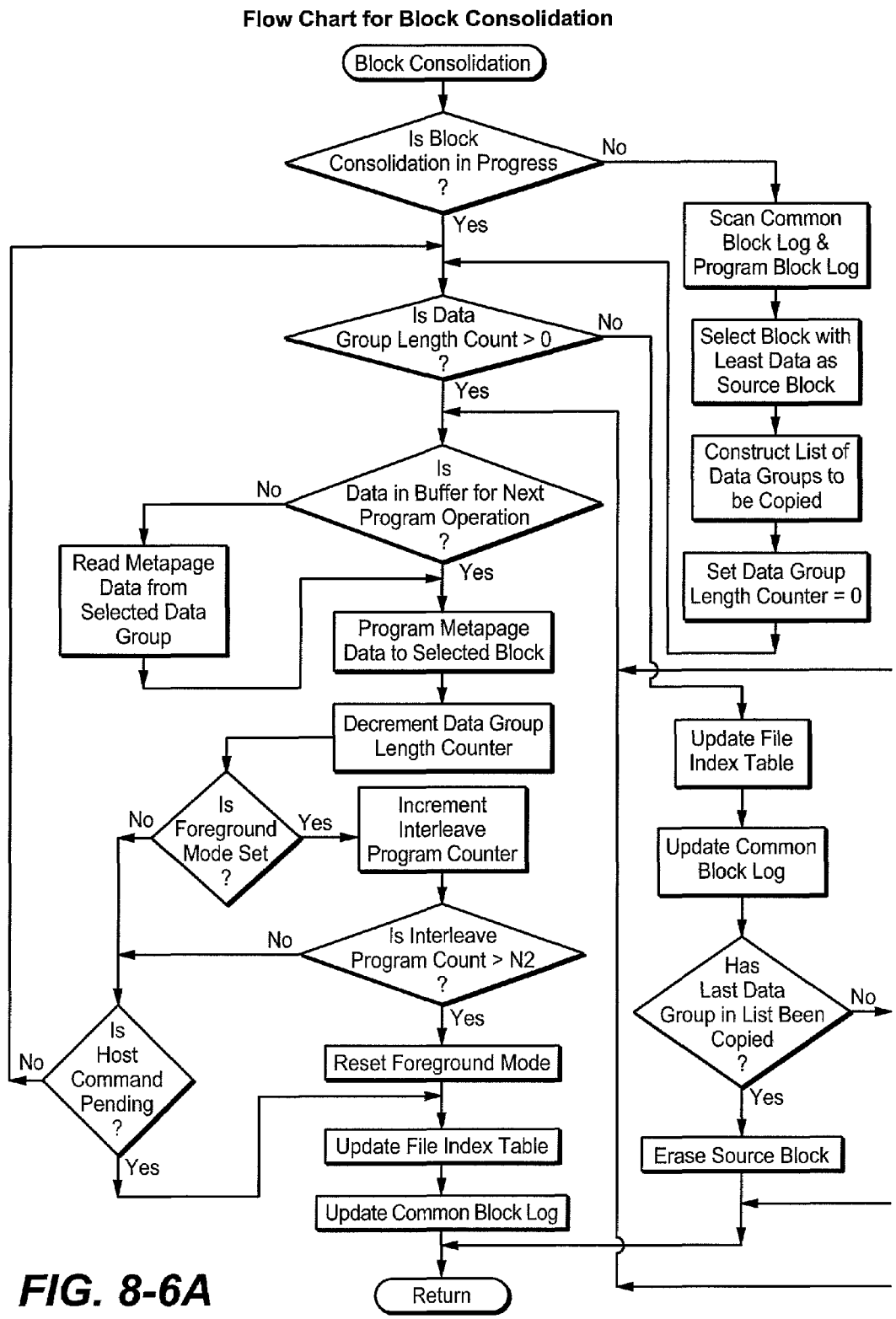
Figures 6, 6B, 8:
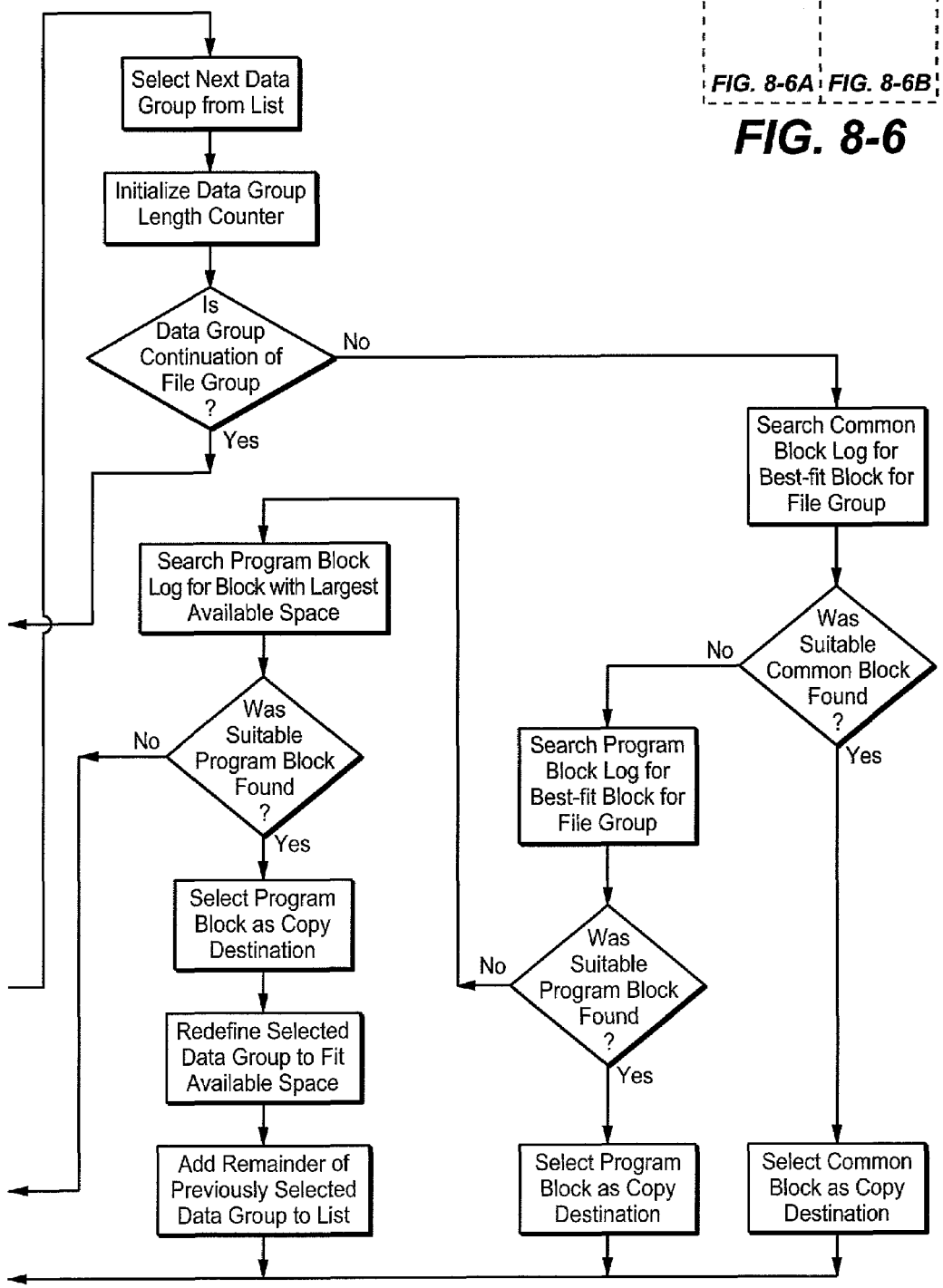
Figures 7A, 8:
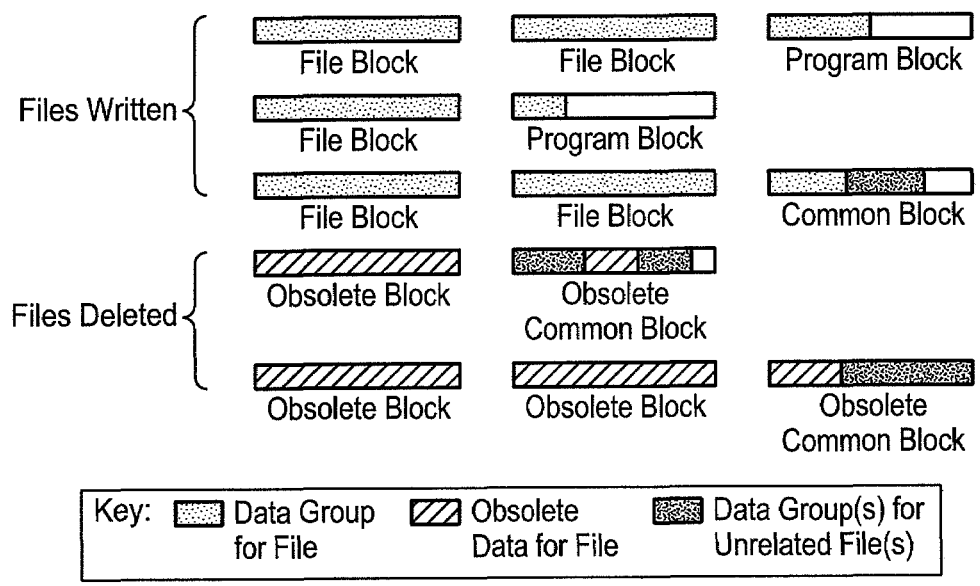
Figures 7B, 8:
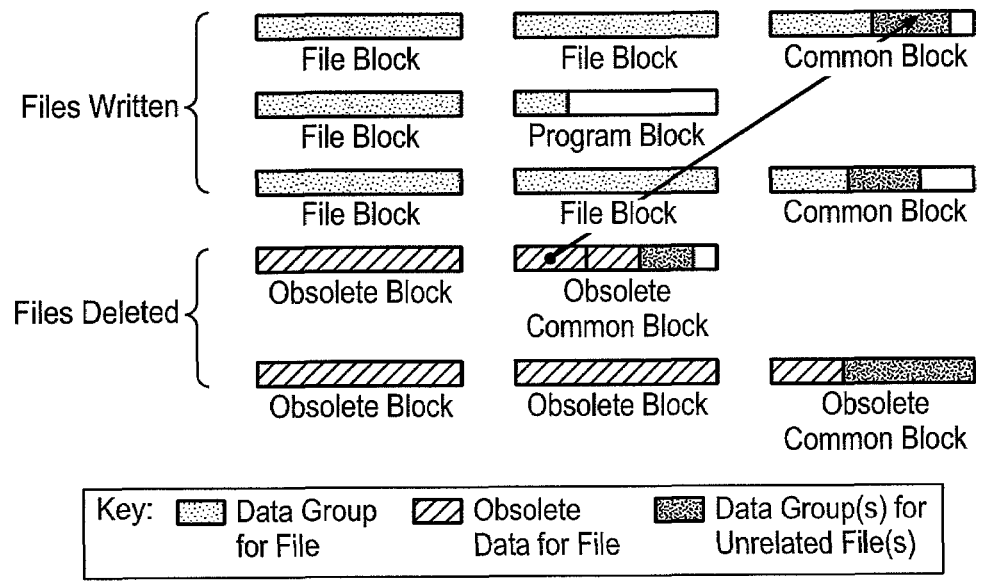
Figures 7C, 8:
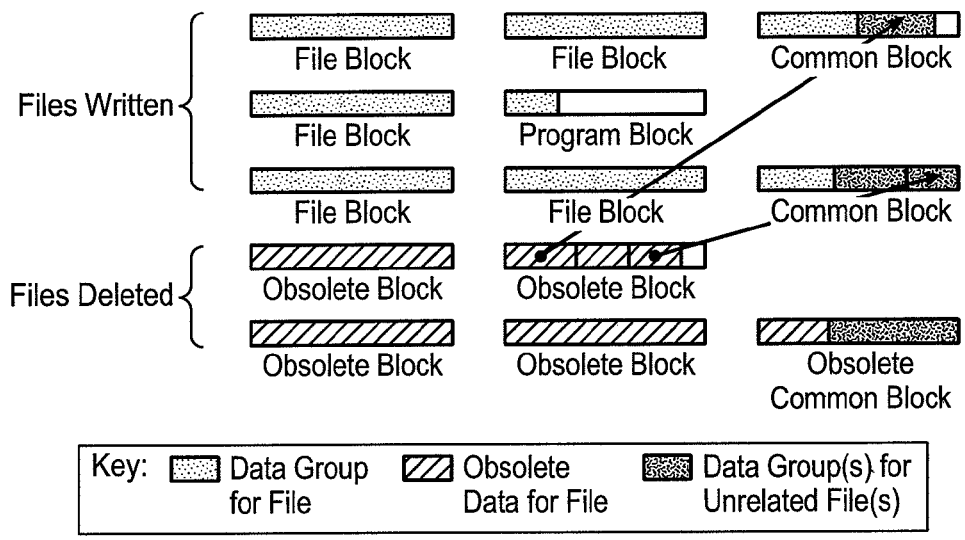
Figures 7D, 8:
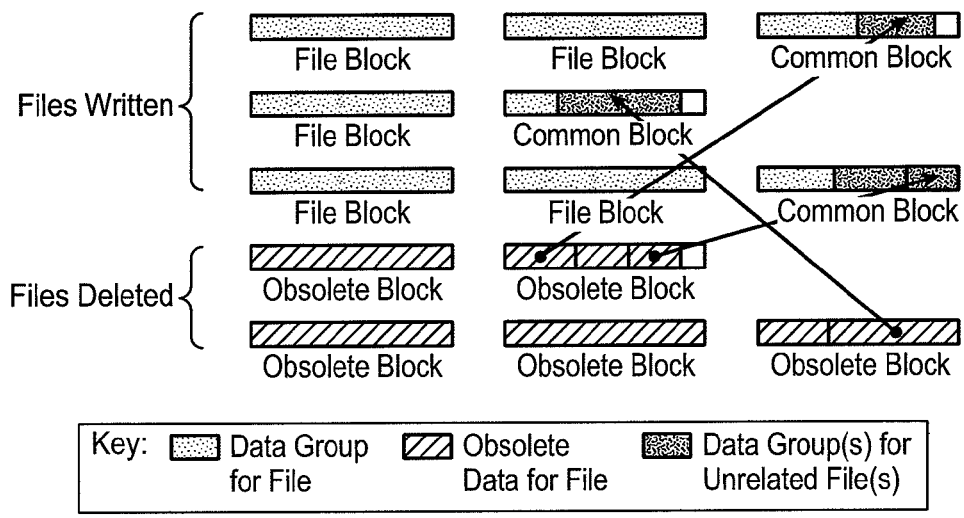

The following listed drawings are included as part of the present application and referenced in the descriptions below:
FIGS. 1-1: Memory Card with Direct Data File Platform;
FIGS. 1-2: Direct Data File Platform Components;
FIGS. 2-1: File Commands;
FIGS. 2-2: Data Commands;
FIGS. 2-3: Info Commands;
FIGS. 2-4: Stream Commands;
FIGS. 2-5: State Commands;
FIGS. 2-6: Device Commands;
FIGS. 3-1: Format of a Plain File;
FIGS. 3-2: Format of a Common File;
FIGS. 3-3: Format on an Edited Plain File;
FIGS. 3-4: Format of an Edited Common File;
FIGS. 4-1: Flow Chart for Device Operations;
FIGS. 5-1: Flow Chart for Programming File Data;
FIGS. 6-1: Flow Chart for Reading File Data;
FIGS. 7-1: Flow Chart for Deleting a File;
FIGS. 8-1: Interleaved Operations for Foreground Garbage Collection;
FIGS. 8-2: Principle of Operation for Adaptive Scheduling of Garbage Collection;
FIGS. 8-3: Flow Chart for Garbage Collection Selection;
FIGS. 8-4: Flow Chart for File Garbage Collection;
FIGS. 8-5: Flow Chart for Common Block Garbage Collection;
FIGS. 8-6: Flow Chart for Block Consolidation;
FIGS. 8-7A through 8-7D: Common Block Garbage Collection Example, showing four time sequential stages;
FIGS. 9-1: Continuous Host Data Programming;
FIGS. 9-2: Interrupted Host Data Programming;
FIGS. 9-3: Buffer Flush Programming;
FIGS. 9-4: Buffer Swap-Out Programming;
FIGS. 9-5: Host Data Programming after Buffer Flush;
FIGS. 9-6: Swap-In Data Read;
FIGS. 9-7: Host Data Programming after Buffer Swap-In;
FIGS. 9-8: Aligned Data Read to Buffer;
FIGS. 9-9: Aligned Data Programming from Buffer;
FIGS. 9-10: Non-Aligned Data Read to Buffer;
FIGS. 9-11: Non-Aligned Data Programming from Buffer;
FIGS. 9-12: Non-Aligned Non-Sequential Data Read to Buffer;
FIGS. 9-13: Non-Aligned Non-Sequential Data Programming from Buffer;
FIGS. 10-1: File Indexing;
FIGS. 10-2: File Indexing Structures;
FIGS. 10-3: Directory Block Format;
FIGS. 10-4: File Index Table (FIT) Logical Structure;
FIGS. 10-5: FIT Page Format;
FIGS. 10-6: Physical FIT Blocks;
FIGS. 10-7: Examples of FIT File Update Operations;
FIGS. 11-1: Block State Diagram;
FIGS. 12-1: Control Block Format;
FIGS. 12-2: Common Block Log Format; and
FIGS. 13-1: Command Set Used with Static Files (in parts A and B that should be taken together).

DESCRIPTION OF EXAMPLE EMBODIMENTS

1. Direct Data File Platform 1.1 Summary

A memory card with a direct data file platform is illustrated in FIGS. 1-1. The direct data file platform is a file-organized data storage device in which data is identified by filename and file offset address. It acts as the storage platform in a memory card that may incorporate functions other than data storage. File data is accessed in the platform by an external file interface channel.

The storage device has no logical addresses. Independent address spaces exist for each file, and the memory management algorithms organize data storage according to the file structure of the data. The data storage organization employed in the direct data file platform produces considerable improvement of operating characteristics, in comparison with those of a file storage device that integrates a conventional file system with conventional logically-blocked memory management.

1.2 Platform Components

The direct data file platform has the following components, structured in layers of functionality as shown in FIG. 1-2:

Direct Data File Interface: A file API that provides access from other functional blocks in the card to data identified by filename and file offset address.

File-to-Flash Mapping Algorithm: A scheme for file-organized data storage that eliminates file fragmentation and provide maximum performance and endurance.

Programming File Data: Programming file data in accordance with the file-to-flash mapping algorithm.

Reading File Data: Reading data specified by file offset address from flash memory.

Deleting File Identifying blocks containing data for a deleted file and adding them to garbage collection queues.

Garbage Collection Operations performed to recover memory capacity occupied by obsolete data. These may entail copying valid data to another location, in order to erase a block.

File Indexing File indexing allows the locations of the valid data groups for a file to be identified, in offset address order.

Data Buffering & Programming: The use of a buffer memory for data to be programmed, and the sequence of programming file data in program blocks.

Erased Block Management: Management of a pool of erased blocks in the device that are available for allocation for storage of file data or control information.

Block State Management: Transitions between the eight states into which blocks for storage of file data can be classified.

Control Data Structures: Control data structures stored in flash blocks dedicated to the purpose.

2. Direct Data File Interface

The Direct Data File interface is an API to the Direct Data File platform, which forms the back-end system for flash memory management within a device incorporating flash mass data storage.

2.1 Command Set

The following sections define a generic command set to support file-based interfacing with multiple sources. Commands are defined in six classes.
1. File commands
2. Data commands
3. File info commands
4. Stream commands (for modeling only)
5. State commands
6. Device commands

2.1.1 File Commands (see FIGS. 2-1)

A file is an object that is independently identified within the device by a fileID. A file may comprise a set of data created by a host, or may have no data, in which case it represents a directory or folder.

2.1.1.1 Create

The create command creates an entry identified by <fileID> within the directory in the device. If the <fileID> parameter is omitted, the device assigns an available value to the file and returns it to the host. This is the normal method of creating a file.

The host may alternatively assign a <fileID> value to a file. This method may be used if a specific value of fileID denotes a specific type of file within the host interface protocol. For example, a root directory may be assigned a specific fileID by the host.

2.1.1.2 Open

This command enables execution of subsequent data commands for the file specified by <fileID>. If the file does not exist, an error message is returned. The write_pointer for the file is set to the end of the file, and the read_pointer for the file is set to the beginning of the file. The info_write_pointer for the file_info is set to the end of the file_info, and the info_read_pointer for the file is set to the beginning of the file_info. There is a maximum number of files that can be concurrently open. If this number is exceeded, the command is not executed and an error message is returned. The maximum number of concurrently open files, for example, may be 8.

Resources within the device for writing to the specified file are made available only after receipt of a subsequent write, insert or remove command.

2.1.1.3 Close

This command disables execution of subsequent data commands for the specified file. Write_pointer, read_pointer, info_write_pointer and info_read_pointer values for the file become invalid.

2.1.1.4 Delete

The delete command indicates that directory, file index table and info table entries for the file specified by <fileID> should be deleted. Data for the files may be erased. The deleted file may not be subsequently accessed.

2.1.1.5 Erase

The erase command indicates that directory, file index table and info table entries for the file specified by <fileID> should be deleted. File data must be erased before any other command may be executed. The erased file may not be subsequently accessed.

2.1.1.6 List_files

FileID values for all files in the directory may be streamed from the device in numerical order following receipt of the list_files command. FileID streaming is terminated when the last file is reached, and this condition may be identified by the host by means of a status command. The list_files command is terminated by receipt of any other command.

2.1.2 Data Commands (see FIGS. 2-2)

The data commands are used to initiate data input and output operations for a specified file, and to define offset address values within the file. The specified file must have been opened by the host. If this is not the case, an error is returned. <fileID> is the file handle that was returned to the host when the file was last opened.

2.1.2.1 Write

Data streamed to the device following receipt of the write command is overwritten in the specified file at the offset address defined by the current value of the write_pointer. The write command is used to write new data for a file, append data to a file, and update data within a file. The write command is terminated by receipt of any other command.

2.1.2.2 Insert

Data streamed to the device following receipt of the insert command is inserted in the specified file at the offset address defined by the current value of the write_pointer. The file size is increased by the length of the inserted data. The insert command is terminated by receipt of any other command.

2.1.2.3 Remove

The remove command deletes sequential data defined by <length> from the specified file at the offset address defined by the current value of the write_pointer. The file size is reduced by <length>.

2.1.2.4 Read

Data in the specified file at the offset address defined by the current value of the read_pointer may be streamed from the device following receipt of the read command.

Data streaming is terminated when the end of file is reached, and this condition may be identified by the host by means of a status command. The read command is terminated by receipt of any other command.

2.1.2.5 Save_buffer

Data for the specified file that is contained in the device buffer and has not yet been programmed to flash memory is saved at a temporary location in flash memory.

The data is restored to the buffer when a subsequent write or insert command is received, and is programmed to flash together with data relating to the command.

2.1.2.6 Write_pointer

The write_pointer command sets the write_pointer for the specified file to the specified offset address. The write_pointer is incremented by the device as data is streamed to the device following a write or insert command.

2.1.2.7 Read_pointer

The read_pointer command sets the read_pointer for the specified file to the specified offset address. The read_pointer is incremented by the device as data is streamed from the device following a read command.

2.1.3 Info Commands (see FIGS. 2-3)

File_info is information generated by a host that is associated with a file. The nature and content of file_info is determined by the host, and it is not interpreted by the device. The info commands are used to initiate file_info input and output operations for a specified file, and to define offset address values within file_info.

2.1.3.1 Write_info

File_info streamed to the device following receipt of the write_info command overwrites file_info for the specified file at the offset address defined by the current value of the info_write_pointer. The content and length of file_info for the specified file is determined by the host. The write_info command is terminated by receipt of any other command.

2.1.3.2 Read_info

File_info for the specified file at the offset address defined by the current value of the info_read_pointer may be streamed from the device following receipt of the read_info command. File_info streaming is terminated when the end of the file_info is reached, and this condition may be identified by the host by means of a status command. The read_info command is terminated by receipt of any other command.

2.1.3.3 Info_write_pointer

The info_write_pointer command sets the info_write_pointer for the specified file to the specified offset address. The info_write_pointer is incremented by the device as file_info is streamed to the device following a write_info command.

2.1.3.4 Info_read_pointer

The info read_pointer command sets the info_read_pointer for the specified file to the specified offset address. The info_read_pointer is incremented by the device as file_info is streamed from the device following a read_info command.

2.1.4 Stream Commands (see FIGS. 2-4)

Stream commands are used only with a behavioural model of the direct data file platform. Their purpose is to emulate streaming data to and from a host, in association with the data commands.

2.1.4.1 Stream

The stream command emulates an uninterrupted stream of data defined by <length> that should be transferred by a host to or from the platform. A variable representing the remaining length of the stream is decremented by the model of the platform as data is added or removed from the buffer memory.

2.1.4.2 Pause

The pause command inserts a delay of length <time> that is inserted before execution of the following command in a command list that is controlling operation of the direct data file model. <time> is defined in microseconds.

2.1.5 State Commands (see FIGS. 2-6)

State commands control the state of the device.

2.1.5.1 Idle

The idle command indicates that the host is putting the direct data file device in an idle state, during which the device may perform internal housekeeping operations. The host will not deliberately remove power from the device in the idle state. The idle state may be ended by transmission of any other command by the host, whether or not the device is busy with an internal operation. Upon receipt of such other command, any internal operation in progress in the device must be suspended or terminated within a specified time. An example of this time is 10 milliseconds or less.

2.1.5.2 Standby

The standby command indicates that the host is putting the direct data file device in a standby state, during which the device may not perform internal housekeeping operations. The host will not deliberately remove power from the device in the standby state. The standby state may be ended by transmission of any other command by the host.

2.1.5.3 Shutdown

The shutdown command indicates that power will be removed from the device by the host when the device is next not in the busy state. All open files are closed by the device in response to the shutdown command.

2.1.6 Device Commands (see FIGS. 2-6)

Device commands allow the host to interrogate the device.

2.1.6.1 Capacity

In response to the capacity command, the device reports the capacity of file data stored in the device, and the capacity available for new file data.

2.1.6.2 Status

In response to the status command, the device reports its current status.

Status includes three types of busy status:
1. The device is busy performing a foreground operation for writing or reading data.
2. The device is busy performing a background operation initiated whilst the device was in the idle state.
3. The buffer memory is busy, and is not available to the host for writing or reading data.

2.1.7 Command Parameters

The following parameters are used with commands as defined below.

2.1.7.1 FileID

This is a file identifier that is used to identify a file within the directory of the device.

2.1.7.2 Offset

Offset is a logical address within a file or file_info, in bytes, relative to the start of the file or file_info.

2.1.7.3 Length

This is the length in bytes of a run of data for a file with sequential offset addresses.

2.1.7.4 Time

This is a time in microseconds.

3. File-to-Flash Mapping Algorithm

The file-to-flash mapping algorithm adopted by the direct data file platform is a new scheme for file-organized data storage that has been defined to provide the maximum system performance and maximum memory endurance, when a host performs file data write and file delete operations via a file-based interface. The mapping algorithm has been designed to minimize copying of file data between blocks in flash memory. This is achieved by mapping file data to flash blocks in a manner that achieves the lowest possible incidence of blocks containing data for more than one file.

3.1 File-to-Flash Mapping Principles

3.1.1 Files

A file is a set of data created and maintained by the host. Data is identified by the host by a filename, and can be accessed by its offset location from the beginning of the file.

The file offset address may be set by the host, and may be incremented as a write pointer by the device.

3.1.2 Physical Memory Structures

The direct data file platform stores all data for files in fixed-size metablocks. The actual number of flash erase blocks comprising a metablock, that is, the erase block parallelism, may vary between products. Throughout this specification, the term "block" is used to denote "metablock".

The term "metapage" is used to denote a page with the full parallelism of a metablock. A metapage is the maximum unit of programming.

The term "page" is used to denote a page within a plane of the memory, that is, within a flash erase block. A page is the minimum unit of programming.

The term "sector" is used to denote the unit of stored data with which an ECC is associated. The sector is the minimum unit of data transfer to and from flash memory.

There is no specified alignment maintained between offset addresses for a file and the physical flash memory structures.

3.1.3 Data Groups

A data group is a set of file data with contiguous offset addresses within the file, programmed at contiguous physical addresses in a single memory block. A file will normally be programmed as a number of data groups. A data group may have any length between one byte and one block. Each data group is programmed with a header, containing file identifier information for cross reference purposes. Data for a file is indexed in physical memory according to the data groups it comprises. A file index table provides file offset address and physical address information for each data group of a file.

3.1.4 Program Blocks

A file must be opened by the host to allow file data to be programmed. Each open file has a dedicated block allocated as a program block, and data for that file is programmed at a location defined by a program pointer within the program block. When a file is opened by the host, a program block for the file is opened, if one does not already exist. The program pointer is set to the beginning of the program block. If a program block already exists for a file that is opened by the host, it continues to be used for programming data for the file.

File data is programmed in a program block in the order it is received from the host, irrespective of its offset address within the file or whether data for that offset address has previously been programmed. When a program block becomes full, it is known as a file block, and an erased block from the erased block pool is opened as a new program block. There is no physical address relationship between blocks storing data for a file.

3.1.5 Common Blocks

A common block contains data groups for more than one file. If multiple data groups for the same file exist in a common block, they are located contiguously and the contiguous unit is known as a file group. Data is programmed to a common block only during a block consolidation operation or a common block garbage collection operation.

The start of an individual data group or a file group within a common block must align with the start of a metapage.

Data groups within a file group do not have intervening spaces. The boundary between such data groups may occur within a page. A file should have data in only a single common block (see 8.3.4 for an exception to this).

3.2 File Types

3.2.1 Plain File

A plain file comprises any number of complete file blocks and one partially programmed program block. A plain file may be created by the programming of data for the file from the host, usually in sequential offset address order, or by garbage collection of an edited file. An example plain file is shown in FIGS. 3-1. A plain file may be either an open file or a closed file.

Further data for the file may be programmed at the program pointer in the program block. If the file is deleted by the host, blocks containing its data may be immediately erased without the need to copy data from such blocks to another location in flash memory. The plain file format is therefore very efficient, and there is advantage in retaining files in this format for as long as possible.

3.2.2 Common File

A common file comprises any number of complete file blocks and one common block, which contains data for the file along with data for other unrelated files. Examples are shown in FIGS. 3-2. A common file may be created from a plain file during a garbage collection operation or by consolidation of program blocks.

A common file is normally a closed file, and does not have an associated write pointer. If the host opens a common file, a program block is opened and the program pointer is set to the beginning of the program block. If the file is deleted by the host, its file blocks may be immediately erased, but data for an unrelated file or unrelated files must be copied from the common block to another location in flash memory in a garbage collection operation before the common block is erased.

3.2.3 Edited Plain File

A plain file may be edited at any time by the host, which writes updated data for previously-programmed offset addresses for the file. Examples are given in FIGS. 3-3. Such updated data is programmed in the normal way at the program pointer in the program block, and the resulting edited plain file will contain obsolete data in one or more obsolete file blocks, or in the program block itself.

The edited plain file may be restored to a plain file in a garbage collection operation for the file. During such garbage collection, any valid file data is copied from each obsolete file block to the program pointer for the file, and the resultant fully-obsolete blocks are erased. The garbage collection is not performed until after the file has been closed by the host, if possible.

3.2.4 Edited Common File

An open common file may be edited at any time by the host, which writes updated data for previously-programmed offset addresses for the file. Examples are shown in FIGS. 3-4. Such updated data is programmed in the normal way at the program pointer in the program block, and the resulting edited common file will contain obsolete data in one or more obsolete file blocks, in the common block, or in the program block itself.

The edited common file may be restored to plain file format in a garbage collection operation for the file. During such garbage collection, any valid file data is copied from each obsolete file block and the common block to the program pointer for the file. The resultant fully-obsolete file blocks are erased, and the obsolete common block is logged for a separate subsequent garbage collection operation.

3.3 Garbage Collection and Block Consolidation

3.3.1 Garbage Collection

Garbage collection operations are performed to recover memory capacity occupied by obsolete data. These may entail copying valid data to another location, in order to erase a block. Garbage collection need not be performed immediately in response to the creation of obsolete data. Pending garbage collection operations are logged in garbage collection queues, and are subsequently performed at an optimum rate in accordance with scheduling algorithms.

The direct data file platforms supports background garbage collection operations that may be initiated by a host command. This allows a host to allocate quiescent time to the device for internal housekeeping operations that will enable higher performance when files are subsequently written by the host.

If sufficient background time is not made available by the host, the device performs garbage collection as a foreground operation. Bursts of garbage collection operations are interleaved with bursts of programming file data from the host. The interleave duty cycle may be controlled adaptively to maintain the garbage collection rate at a minimum, whilst ensuring that a backlog is not built up.

3.3.2 Block Consolidation

Each plain file in the device includes an incompletely filled program block, and a significant volume of erased capacity can be locked up in such program blocks. Common blocks may also contain erased capacity. An ongoing process of consolidating program blocks for closed files and common blocks is therefore implemented, to control the locked erased capacity. Block consolidation is treated as part of the garbage collection function, and is managed by the same scheduling algorithms.

Data in a program block or a common block is consolidated with data for one or more unrelated files by copying such unrelated data from another common block or program block. If the original block was a program block, it becomes a common block. It is preferable to consolidate a program block with an obsolete common block, rather than with another program block. An obsolete common block contains obsolete data, and it is therefore unavoidable to have to relocate valid data from the block to another location. However, a program block does not contain obsolete data, and copying data from the block to another location is an undesirable overhead.

3.3.3 Equilibrium State

When file data occupies a high percentage of the device capacity, a host must perform delete operations on files in order to create capacity for writing new files. In this state, most files in the device will have common file format, as there will be little capacity available for erased space in program blocks for files in plain file format.

Deletion of a common file requires valid data for unrelated files to be relocated from its common block during garbage collection. Data for such file groups is most commonly relocated to available capacity in one or more program blocks for a closed file. There is frequently equilibrium between available unused capacity in program blocks for files recently written then closed by a host, and required capacity for relocating file data from common blocks as a result of files being deleted by a host. This general state of equilibrium reduces the need to relocate file data from a program block, and contributes to the efficiency of the file-to-flash mapping algorithm.

4. Device Operation 4.1 Execution of Device Operations

The operating sequence of the device is determined by the flow of commands supplied by a host. When a host command is received, the current device operation is interrupted and the command is normally interpreted. Certain commands will cause execution of one of the four main device operations, as follows:

1. Data reading;
2. Data programming;
3. File deleting; or
4. Garbage collection.

The device operation continues, until one of the following conditions is reached:

1. The operation is completed;
2. Another host command is received; or
3. The end of an interleaved burst is reached in foreground garbage collection mode.

If priority garbage collection operations are queued for execution, these are completed before any new command is interpreted.

An overall flow chart showing the device operations appears as FIGS. 4-1.

5. Programming File Data 5.1 Principles for Programming File Data

Data for a file is programmed to flash memory as it is streamed to the device from a host following a write or insert command from the host. When sufficient data has been accumulated in the buffer memory for the next program operation, it is programmed in the program block for the file. See chapter 9 for a description of this operation.

When a program block becomes full, it is designated as a file block and an erased block from the erased block pool is allocated as the program block. In addition, the file index table and garbage collection queues for common blocks and obsolete blocks are updated.

The file data programming procedure initiates bursts of foreground garbage collection, according to interleave parameter N1 that is established by the garbage collection scheduling algorithm (see section 8.4). An interleave program counter is incremented whenever a metapage program operation is initiated in flash memory, and a garbage collection operation in foreground mode is initiated when this counter exceeds the value N1.

File data programming continues in units of one metapage, until the host transmits another command.

A flow chart illustrating an example of programming file data appears as FIG. 5-1.

6. Reading File Data 6.1 Principles for Reading File Data

In response to a read command from a host, data for file offset addresses beginning at that specified by the read_pointer is read from flash memory and returned sequentially to the host, until the end of file is reached. The file index table (FIT) is read, and FIT entries for the file evaluated to identify the location corresponding to the read_pointer. Subsequent FIT entries specify the locations of data groups for the file.

File data is read in units of one metapage until the end of file is reached, or until the host transmits another command.

An example process of reading file data is given in FIG. 6-1.

7. Deleting a File 7.1 Principles for Deleting a File

In response to a delete command for a file from a host, blocks containing data for the file are identified and are added to garbage collection queues for subsequent garbage collection operations. The procedure for deleting a file does not initiate these garbage collection operations, and data for the file is therefore not immediately erased.

FIT entries for the file are evaluated, initially to identify a common block that may contain data for the file. Thereafter, FIT entries for the file are evaluated in offset address order, and the data blocks in which data groups are located are added to either the common block queue or the obsolete block queue, for subsequent garbage collection. The file directory and file index table are then updated, to remove entries for the file.

7.2 Erasing a File

In response to an erase command for a file from a host, the same procedure as for a delete command should be followed, but with the blocks containing data for the file being added to the priority common block queue and the priority obsolete block queue for garbage collection.

The main device operations sequence then ensures that garbage collection operations for these blocks are performed before any other host command is executed. This ensures that data for the file identified by the erase command is immediately erased.

A flow chart of a file deletion process appears as FIG. 7-1.

8. Garbage Collection

8.1 Principles for Garbage Collection

Garbage collection is an operation that must be performed to recover flash memory capacity occupied by obsolete file data. Garbage collection may be necessary as a result of deletion of a file or of edits to the data of a file.

Block consolidation is a form of garbage collection, which is performed to recover erased capacity in blocks that are incompletely filled with file data, to allow their use for storing unrelated files. Consolidation may be performed on program blocks in plain files, to convert them to common blocks, or on common blocks, to reduce their number.

The processes of garbage collection and block consolidation relocated valid file data from a source flash block to one or more destination blocks, as dictated by the file-to-flash mapping algorithm, to allow the source block to be erased.

Pending garbage collection operations are performed not immediately, but according to a scheduling algorithm for phased execution. Entries for objects requiring garbage collection are added to three garbage collection queues from time to time during operation of the device. Separate queues exist for files, obsolete blocks, and common blocks. Objects are selected from the queues for the next garbage collection operation in a predefined order of priority. If the queues are empty, block consolidation may be performed.

Garbage collection operations may be scheduled in two ways. Background operations may be initiated by the host when it is not making read or write access to the device, and are executed continuously by the device until the host makes another access. Foreground operations may be scheduled by the device whilst it is being accessed by the host, and are executed in bursts interleaved with bursts of program operations for file data received from the host. The lengths of the interleaved bursts may be adaptively controlled to maintain the garbage collection rate to the minimum required at all times.

8.2 Garbage Collection Queues

Garbage collection queues contain entries for objects for which there is a pending garbage collection operation. Three queues each contain entries for obsolete blocks, common blocks and files, respectively. Two additional queues are given higher priority than these three, and contain entries for obsolete blocks and common blocks respectively. The five garbage collection queues are stored in the control log in the control block in flash memory.

8.2.1 Priority Obsolete Block Queue

This queue contains entries for blocks that have been made fully obsolete as a result of an erase command from the host. It is the highest priority garbage collection queue. Garbage collection operations on all blocks identified in the queue must be completed before any other command is accepted from the host, or before garbage collection operations are initiated on objects from any other queue.

8.2.2 Priority Common Block Queue

This queue contains entries for common blocks that have been made partially obsolete as a result of an erase command from the host. It is the second highest priority garbage collection queue. Garbage collection operations on all common blocks identified in the queue must be completed before any other command is accepted from the host, or before garbage collection operations are initiated on objects from a lower priority queue.

8.2.3 Obsolete Block Queue

This queue contains entries for blocks that have been made fully obsolete as a result of a delete command from the host, or of edits to the data of a file. It is the third highest priority garbage collection queue. Garbage collection operations on all blocks identified in the queue should be completed before operations are initiated on objects from a lower priority queue.

8.2.4 Common Block Queue

This queue contains entries for common blocks that have been made partially obsolete as a result of a delete command from the host, or of edits to the data of a file. It is the fourth highest priority garbage collection queue. Garbage collection operations on all blocks identified in the queue should be completed before operations are initiated on objects from a lower priority queue.

8.2.5 File Queue

This queue contains entries for files that have obsolete data as a result of edits to the data of a file. It is the lowest priority garbage collection queue. When a file is closed by the host, an entry for it is added to the file queue unless the file is a plain file. It is therefore necessary to perform an analysis on the FIT entries for a file at the time the file is closed by the host, to determine if the file is a plain file or an edited file (plain or common).

The procedure for this analysis is as follows:
1. The FIT entries in the relevant FIT file are evaluated in offset address order.
2. The cumulative capacity of data groups and data group headers is determined.
3. The physical capacity occupied by file data is determined. This is the number of blocks other than the program block containing data for the file, plus the used capacity in the program block.
4. If the data group capacity exceeds X % of the physical capacity, the file is determined to be a plain file. An example of the value of X is 98%. X % is less than 100%, to allow for unprogrammed space resulting from a buffer flush operation to persist in a plain file.

8.3 Garbage Collection Operations

8.3.1 Obsolete Block

An obsolete block contains only obsolete data, and may be erased without the need to relocate data to another block.

8.3.2 Common Block

The common block is the source block, and contains one or more partially or fully obsolete data groups for one or more files. Valid data must be relocated from this source block to one or more destination blocks.

Data is relocated in units of a complete file group, where a file group comprises one or more data groups for the same file within the common block. Each file group is relocated intact to a destination block, but different file groups may be relocated to different blocks.

A common block is the preferred choice for destination block, followed by program block if no suitable common block is available, followed by an erased block if no suitable program block is available.

The garbage collection operation can continue until the occurrence of one of the following conditions; the operation is completed, the host sends a command, or the end of an interleaved burst is reached in foreground mode.

A flow chart for the common block garbage collection operation is shown in FIG. 8-5.

8.3.3 File Garbage Collection

File garbage collection is performed to recover capacity occupied by obsolete data for the file. It restores a file in the edited plain file state or edited common file state to the plain file state. The first step is to perform an analysis on the FIT entries in its FIT file, to identify obsolete file blocks and common block from which data groups must be copied during the garbage collection. The procedure for this analysis is as follows:

1. The FIT entries in the relevant FIT file are evaluated in offset address order.
2. A data group list is constructed to relate data groups to physical blocks. Data groups in the program block are excluded from this list.
3. The physical capacity occupied by data groups and data group headers in each block referenced in the list is determined.
4. If the data group capacity exceeds X % of the capacity of a block, the block is determined to be a file block. An example of the value of X is 98%. X % is less than 100%, to allow for unprogrammed space resulting from a buffer flush operation to persist in a file block.
5. Data groups in blocks that are determined to be file blocks are removed from the data group list constructed above.

Data groups referenced in the revised data group list are contained in obsolete file blocks or a common block, and are copied to a program block during the file garbage collection operation. The data group structure of the file may be modified as a result of the file garbage collection operation, that is, a relocated data group may be split into two by a block boundary, or may be merged with an adjacent data group. The program block for the file is used as the destination block. When this is filled, another program block is opened.

The garbage collection operation can continue until the occurrence of one of the following conditions; the operation is completed, the host sends a command, or the end of an interleaved burst is reached in foreground mode.

A flow chart for the file garbage collection operation is shown in FIG. 8-4.

8.3.4 Block Consolidation

Block consolidation is performed to recover erased capacity in program blocks and common blocks that have been incompletely programmed, and to make the capacity available for storing data for other files.

The source block for a consolidation is selected as the block in the program block log or common block log with the lowest programmed capacity, to allow the block to be erased after the minimum possible data relocation. Data is relocated in units of a complete file group, where a file group comprises one or more data groups for the same file within the program block or common block. Each file group is relocated intact to a destination block, but different file groups may be relocated to different blocks.

A common block is the preferred choice for destination block, followed by program block if no suitable common block is available. In the rare event that no destination block is available, a file group may be split to be relocated to more than a single destination block.

The block consolidation operation can continue until the occurrence of one of the following conditions; the operation is completed, the host sends a command, or the end of an interleaved burst is reached in foreground mode.

A flow chart for a block consolidation operation is shown in FIG. 8-6.

8.4 Scheduling of Garbage Collection Operations

Garbage collection is preferably performed as a background task during periods when the host device is accessing the card. Background garbage collection initiated by the host is supported in the direct data file platform.

However, it may also be necessary to perform garbage collection as a foreground task whilst the host is writing data to the device. In this mode, a complete garbage collection operation need not be completed as a single event. Bursts of garbage collection can be interleaved with bursts of programming data from a host, such that a garbage collection operation may be completed in a number of separate stages and there is limited interruption to availability of the device to the host.

8.4.1 Background Operation

Background garbage collection is initiated when the host sends an idle command to the device. This indicates that the host will not deliberately remove power from the device, and does not immediately intend to access the device. However, the host may end the idle state at any time by transmitting another command.

In the idle state, the device performs continuous garbage collection operations until the occurrence of one of the following conditions; the host transmits another command, or all garbage collection queues are empty and no block consolidation operations are possible.

8.4.2 Interleaved Operation

Interleaved garbage collection operations are initiated by the direct data file process for programming file data. An interleaved operation is illustrated in FIGS. 8-1. After a host data write phase within which the host interface is active and N1 program operations are made to flash memory, the device switches into a garbage collection phase. In this phase, part of one or more garbage collection operations are performed until N2 program operations to flash memory are completed.

A garbage collection operation in progress may be suspended at the end of a garbage collection phase, and restarted in the next such phase. The values of N1 and N2 are determined by an adaptive scheduling algorithm.

8.4.3 Adaptive Scheduling

An adaptive scheduling method is used to control the relative lengths of interleaved bursts of host data programming and garbage collection, so that the interruption to host data write operations by garbage collection operations can be kept to a minimum. This is achieved whilst also ensuring that a backlog of pending garbage collection that could cause subsequent reduction in performance is not built up.

8.4.3.1 Principle of Operation

At any time, the device state comprises capacity occupied by previously written host data, erased capacity in blocks in the erased block pool, and recoverable capacity that can be made available for writing further host data by garbage collection operations. This recoverable capacity may be in program blocks, common blocks, or obsolete file blocks shared with previously written host data, or in fully obsolete blocks. These types of capacity utilization are shown in FIGS. 8-2.

Adaptive scheduling of garbage collection controls the interleave ratio of programming incremental host data and relocating previously written host data, such that the ratio can remain constant over an adaptive period during which all recoverable capacity can be made available for host data. If the host deletes files, which converts previously written host data to recoverable capacity, the interleave ratio is changed accordingly and a new adaptive period started.

The optimum interleave ratio can be determined as follows:

If

The number of erased blocks in the erased block pool=erased_blocks;

The combined number of program and common blocks=data_blocks;

The total number of valid data pages in program and common blocks=data_pages;

The number of obsolete blocks=obsolete_blocks; and

The number of pages in a block=pages_per_block,

Then

The number of erased blocks that can be created by garbage collection is given by data_blocks−(data_pages/pages_per_block);

The total number of erased blocks after garbage collection is given by erased_blocks+obsolete blocks+data_blocks−(data_pages/pages_per_block);

The number of incremental data metapages that may be written is given by pages_per_block*(erased_blocks+obsolete_blocks+data_blocks)−data_pages.

If

It is assumed that valid data is evenly distributed throughout the program and common blocks (a pessimistic assumption, since blocks with low data page counts are selected as source blocks for block consolidation operations)

Then

The number of metapages relocated during garbage collection is given by data_pages*(data_blocks−data_pages/pages_per_block)/data_blocks The optimum interleave ratio N1:N2 is the ratio of the number of incremental data metapages that may be written to the number of metapages that must be relocated during garbage collection. Therefore, N1:N2=(pages_per_block*(erased_blocks+obsolete_blocks+data_blocks)−data_pages)/(data_pages*(data_blocks−data_pages/pages_per_block)/data_blocks)

Note that recovery of obsolete capacity in obsolete file blocks has not been included in the adaptive scheduling algorithm. Such capacity results only from editing of files, and is not a common occurrence. If significant capacity exists in obsolete file blocks, the adaptively determined interleave ratio may not be optimum, but switching to operation with minimum ratio (described in 8.4.3.2) will ensure efficient garbage collection of such blocks.

8.4.3.2 Interleave Control

The interleave ratio N1:N2 is defined in three bands, as follows.

1) Maximum: A maximum limit to the interleave ratio is set, to ensure that garbage collection can never be totally inhibited. An example of this maximum limit is 10 to 1.
2) Adaptive: In the adaptive band, the interleave ratio is controlled to be optimum for pending garbage collection of common blocks and obsolete blocks, and the consolidation of program blocks and common blocks. It is defined by the relationship N1:N2=(pages_per_block*(erased_blocks+obsolete_blocks+data_blocks)−data_pages)/(data_pages*(data_blocks−data_pages/pages_per_block)/data_blocks), where N1 and N2 are defined as numbers of page program operations.

A value of N2 is defined, representing the preferred duration of a burst of garbage collection. An example of this value is 16.

3) Minimum: If the number of blocks in the erased block pool falls below a defined minimum, the interleave ratio is not adaptively defined, but is set to a fixed minimum limit. An example of this minimum limit is 1 to 10.

8.4.3.3 Control Parameters

The following parameters are maintained in the control log in the control block in flash memory, for control of adaptive scheduling:

Erased block count: A count of the number of blocks in the erased block pool is maintained. This is updated when blocks are added to and removed from the erased block pool.

Program & common block count: A count of the combined number of program blocks and common blocks is maintained. Common blocks may contain obsolete data. The count is updated when blocks are added to and removed from the program block log and the common block log.

Program & common block page count: A count of the number of valid data pages in program blocks and common blocks is maintained. The count is updated when blocks are added to and removed from the program block log and the common block log.

Obsolete block count: A count of the number of fully obsolete blocks awaiting garbage collection is maintained. The count is updated when blocks are added to and removed from the obsolete block garbage collection queue.

8.5 Flow Charts for Garbage Collection

A flow chart of a specific algorithm for selecting one of several particular garbage collection operations is given in FIGS. 8-3. FIGS. 8-4 is a flow chart for the "File garbage collection" block of FIGS. 8-3. A flow chart for the "Common block garbage collection" block of FIGS. 8-3 is the subject of FIGS. 8-5. The "Block consolidation" function of FIGS. 8-3 is shown by the flow chart of FIGS. 8-6.

Four FIGS. 8-7A through 8-7D show an example garbage collection of a common block that can result from the process of FIGS. 8-5. FIGS. 8-7A shows an initial condition, while FIGS. 8-7B through 8-7C illustrate three steps in the garbage collection process. The arrows show the transfer of valid data from obsolete blocks into file blocks that are not full, and these destination file blocks then become common blocks.

9. Data Buffering & Programming

The data buffering and programming method described in this section is constrained to use the same flash interface and error correction code (ECC) structures that are employed on current products. Alternative optimised methods may be adopted in the future if new flash interface and ECC structures are introduced.

9.1 Data Buffers

A buffer memory exists in SRAM in the controller (RAM 31 of the Prior Applications), for temporary storage of data being programmed to and read from flash memory. An allocated region of the buffer memory is used to accumulate sufficient data for a file to allow a full metapage to be programmed in a single operation in flash memory. The offset addresses of data for a file in the buffer memory is unimportant. The buffer memory may store data for multiple files.

To allow pipelining of both write and read operations with a host, buffer memory space with a capacity of two metapages should be available for each file being buffered. The buffer memory comprises a set of sector buffers. Individual sector buffers may be allocated for temporary storage of data for a single file, and deallocated when the data has been transferred to its final destination. Sector buffers are identified by a sector buffer number 0 to N−1. An example of the number of sector buffers (N) is 64.

Available sector buffers are allocated cyclically in order of their sector buffer number. Each sector buffer has a file label, and two associated pointers defining the start and end of data contained within it. File offset address ranges within the data in the sector buffer are also recorded. Both the sector buffers and the control information associated with them exist only within volatile memory in the controller.

9.2 Data Programming

9.2.1 Metapage

A metapage is the maximum unit of programming in flash memory. Data should be programmed in units of a metapage wherever possible, for maximum performance.

9.2.2 Page

A page is a subset of a metapage, and is the minimum unit of programming in flash memory.

9.2.3 Sector

A sector is a subset of a page, and is the minimum unit of data transfer between controller and flash memory. A sector usually comprises 512 bytes of file data. An ECC is generated by the controller for each sector (such as by the controller ECC circuit 33 of FIG. 2 of the Prior Applications), and is transferred to flash appended to the end of the sector. When data is read from flash, it must be transferred to the controller in multiples of a complete sector, to allow the ECC to be checked.

9.3 Buffer Flush

Data for a file is normally accumulated in sector buffers until sufficient data is available for programming a complete metapage in flash memory. When the host stops streaming data for a file, one or more sector buffers remain with file data for part of a metapage. This data remains in buffer memory, to allow the host to write further data for the file. However, under certain circumstances, data in buffer memory must be committed to flash memory in an operation known as a buffer flush. A buffer flush operation causes all data for a file that is held in sector buffers to be programmed in one or more pages within a metapage.

A buffer flush operation is performed in the following two events:
1) The file is closed by the host, or
2) A shut-down command is received by the host.

If data for a file that is closed by the host has been swapped-out to the swap block, it should be restored to the buffer memory and a buffer flush should be performed. Data that is in the swap block during initialization of the device following power removal should be restored to the buffer memory and a buffer flush should be performed.

9.4 Buffer Swap

Buffer swap is an operation in which data for a file in one or more sector buffers is programmed in a temporary location known as a swap block, to be subsequently restored to buffer memory when the host continues writing data for the file.

9.4.1 Format of Swap Block

The swap block is a dedicated block that stores data for files that has been swapped-out from sector buffers. Data for a file is stored contiguously in one or more pages dedicated to that file in the swap block. When data is subsequently swapped-in back to buffer memory, it becomes obsolete in the swap block.

When the swap block becomes full, valid data within it is written in compacted form to an erased block, which then becomes the swap block. This compacted form allows data for different files to exist within the same page. Only a single swap block preferably exists.

9.4.2 Indexing Data stored in Swap Block

A swap block index is maintained in flash memory, containing for each file in the swap block a copy of the information previously recorded for the file in the buffer memory (see 9.1).

9.4.3 Moving Data to Swap Block (Swap-Out)

A swap-out operation occurs when insufficient sector buffers are available to be allocated to a file that has been opened by the host, or to a file that must be swapped-in from the swap block as a result of a write command for the file from the host. The file selected for swap-out should be the least recently written file of those for which buffers exist in the buffer memory.

Optionally, to improve security of data in the event of unscheduled removal of power, a swap-out may be performed for any file in the buffer memory which is not related to the most recent write command from the host. In this case, data for the file may remain in buffer memory, and a subsequent swap-in operation is not required if there has not been a removal of power.

9.4.4 Restoring Data from Swap Block (Swap-in)

The complete data for a file is read from the swap block to one or more sector buffers. The file data need not have exactly the same alignment to sector buffers as before its swap-out. Alignment may have changed as a result of a compaction of the swap block. Data for the file in the swap block becomes obsolete.

9.5 Programming File Data from Host

Examples given in this section relate to a flash memory configuration with two pages per metapage, and two sectors per page.

9.5.1 Programming Continuous Data from Host

Data for a file is streamed from a host and is accumulated in successively allocated sector buffers. When sufficient sector buffers have been filled, their data is transferred to flash memory together with an ECC for each sector, and the destination metapage in the program block for the file is programmed. An example of continuous host data programming is shown in FIG. 9-1.

9.5.2 Programming Interrupted Data from Host

Data for a file is streamed from a host and is accumulated in successively allocated sector buffers. FIGS. 9-2 shows an example of host data programming that has been interrupted. The stream is interrupted after data segment 2A, whilst a write operation for a different file is executed. When a further write command for the file is received, data streamed from the host is accumulated in the same sector buffer as before, beginning at data segment 2B. When sufficient sector buffers have been filled, their data is transferred to flash memory together with an ECC for each sector, and the destination metapage in the program block for the file is programmed.

9.5.3 Programming Data being Flushed from Buffer

Data for a file is streamed from a host and is accumulated in successively allocated sector buffers. However, insufficient data is present to be programmed in a complete metapage. An example is given in FIGS. 9-3. Data segments 1 and 2A, together with padding segment 2B, is transferred to flash memory together with an ECC for each sector, and the destination page in the program block for the file is programmed.

9.5.4 Programming Data being Swapped-Out from Buffer

This operation is identical to that for buffer flush programming, except that the destination page is the next available in the swap block, instead of in the program block for the file. FIGS. 9-4 illustrates this.

9.5.5 Programming Data from Host following a Flush from Buffer

File data supplied by a host subsequent to a buffer flush operation for the file is programmed separately from the data flushed from buffer memory. Programming must therefore begin at the next available page in the program block for the file. Sufficient data is accumulated to complete the current metapage, and it is transferred with ECC and programmed as shown for sectors 3 and 4 of FIG. 9-5.

9.5.6 Programming Data from Host following a Swap-In to Buffer

When further data for a file that has been swapped-out from the buffer memory is received, it is accumulated in sector buffers allocated in the buffer memory. The swapped-out data is also restored to the buffer memory from the swap block. When sufficient data has been accumulated, a full metapage is programmed in a single operation.

As illustrated in FIGS. 9-6, data segments 1 and 2A, together with padding segment 2B, is read from the swap block and restored in two sector buffers. The ECC is checked on both sectors.

As shown in the example of FIGS. 9-7, file data from the host is accumulated in buffer sectors. Data segments 1, 2A/2B, 3A/3B and 4A/4B are transferred to flash memory together with ECC for each sector, and are programmed as sectors 1, 2, 3 and 4.

9.6 Programming Data Copied from Flash

9.6.1 Copying Data from Aligned Metapage

Source and destination metapages are said to be aligned when data to be copied to a full destination metapage occupies a single full source metapage, as illustrated in FIGS. 9-8. Data sectors 1, 2, 3 and 4 are read from the source metapage to four sector buffers, and the ECC is checked on each sector.

9.6.1.1 Write-Back from Buffer

Data is programmed from the four sector buffers to the destination metapage, as shown in FIGS. 9-9. An ECC is generated and stored for sectors 1, 2, 3 and 4.

9.6.1.2 On-Chip Copy

When the metapage alignment of data to be copied is the same in the source and destination metapages, on-chip copy within the flash chip may be used to increase the speed of the copy operation. Data is programmed to the destination metapage if the ECC check shows no error.

9.6.1.3 Metapage Alignment within Common Block

The start of each file group within a common block should be forced to align with start of metapage. Data groups in a program block also align with the start of the first metapage in the block. Therefore, all data copy operations for a common block, such as consolidating program blocks into a common block and copying file groups from one common block to a program block or to another common block, will operate with data copy between aligned metapages. On-chip copy within the flash chip should be used when copying data to or from a common block to increase the speed of the copy operation.

9.6.2 Copying Data from Non-Aligned Sequential Metapages

Source and destination metapages are said to be non-aligned when data to be copied to a full destination metapage is contiguous, but occupies two sequential source metapages. An example of reading the source metapage is shown in FIGS. 9-10. Data sectors 1A/1B, 2, and 3 are read from the first source metapage to three sector buffers, and data sectors 4 and 5A/5B are read from the second source metapage to a further two sector buffers. The ECC is checked on each sector.

Data portions 1A/1B, 2A/2B, 3A/3B, and 4A/4B are programmed from the sector buffers to sectors 1, 2, 3 and 4 in the destination metapage, as shown if FIGS. 9-11. An ECC is generated and stored for sectors 1, 2, 3 and 4.

When the metapage data being copied is part of a larger run of continuous data, the copy may be partially pipelined. Data is read from the source location to the buffer memory in full metapages. N+1 source metapages must be read in order to program N destination metapages.

9.6.3 Copying Data from Non-Aligned Non-Sequential Metapages

Source and destination metapages are said to be non-aligned and non-sequential when data to be copied to a full destination metapage is not contiguous, and occupies two or more non-sequential source metapages. This case represents copying part of two or more non-contiguous data groups within a file to a single destination metapage. Data sectors 1A/1B, 2, and 3A/3B, as shown in FIGS. 9-12, are read from the first source metapage to three sector buffers, and data sectors 4A/4B and 5A/5B are read from the second source metapage to a further two sector buffers. The ECC is checked on each sector.

Data portions 1A/1B, 2A/2B, 3A/3B, and 4A/4B are then programmed from the sector buffers to sectors 1, 2, 3 and 4 in the destination metapage, as shown in FIGS. 9-13. An ECC is generated and stored for sectors 1, 2, 3 and 4.

10. File Indexing

10.1 Principles of File Indexing

File indexing is shown generally in FIGS. 10-1. Data for a file is stored as a set of data groups, each spanning a run of contiguous addresses in both file offset address space and physical address space. Data groups within the set for a file need not have any specific physical address relationship with each other. A file index table (FIT) allows the locations of the valid data groups for a file to be identified, in offset address order. A set of FIT entries for a file is identified by a file data pointer.

Information associated with a file that is generated by a host is stored as file_info in an info table (IT). The nature and content of file_info is determined by the host, and it is not interpreted by the device. File_info may include filename, parent directory, child directories, attributes, rights information, and file associations for a file. File_info for a file in the IT is identified by a file info pointer.

A directory contains a file data pointer and file info pointer for every valid file in the device. These directory entries for a file are identified by a fileID, which is a numerical value.

10.2 File Indexing Structures

FIGS. 10-2 shows an example of the file indexing structures.

10.3 Directory

10.3.1 FileID

The fileID is a numerical identifier for a file existing within the direct data file platform. It is allocated by the direct data file platform in response to a create command, or may be specified as a parameter with a create command.

When a fileID value is allocated by the device, a cyclic pointer to entries in the directory is used to locate the next available fileID. When a file is deleted or erased, the directory entry identified by the file's fileID is marked as available.

A fileID value defines an entry in the directory, which contains fields for the file data pointer and file info pointer for a file.

The maximum number of files that may be stored in the device is determined by the number of bits allocated for the filed.

10.3.2 File Data Pointer

A file data pointer is a logical pointer to an entry for a file in the FIT block list, and possibly also the FIT update block list, within the control log.

A file data pointer has two fields:
1) FIT range, and
2) FIT file no.

A file data pointer for a file exists even when the file has zero length.

10.3.2.1 FIT Range

A FIT range is a subset of the FIT. Each FIT range is mapped to a separate physical FIT block. A FIT range may contain between one FIT file and a maximum number of FIT files, which may be 512, for example.

10.3.2.2 FIT File No.

A FIT file no. is a logical number used to identify a FIT file within the FIT.

10.3.3 File Info Pointer

A file info pointer is a logical pointer to an entry for a file in the info block list, and possibly also the info update block list, within the control log.

A file info pointer has two fields:
1) Info range; and
2) Info no.

10.3.3.1 Info Range

An info range is a subset of the info table. Each info range is mapped to a separate physical info block. An info range may contain between one set of file_info and a maximum number of sets of file_info, which may be 512, for example.

10.3.3.2 Info No.

An info no. is a logical number used to identify a set of file_info within the info block.

10.3.4 Directory Structure

The directory is stored in a flash block dedicated to the purpose. FIGS. 10-3 shows an example directory block format. The directory is structured as a set of pages, within each of which a set of entries exists for files with consecutive fileID values. This set of entries is termed a directory range.

The directory is updated by writing a revised version of a directory page at the next erased page location defined by a control pointer. Multiple pages may be updated simultaneously, if necessary, by programming them to different pages in a metapage.

The current page locations for the directory ranges are identified by range pointers in the last written page in the directory block.

10.4 Block Lists

Both the File Index Table and the Info Table comprise a series of logical ranges, where a range has a correlation with a physical flash block. Block lists are maintained in the control log to record the correlations between range defined in a file data pointer or file info pointer and a physical block, and between logical number defined in a file data pointer or file info pointer and the logical number that is used in physical blocks within the File Index Table and the Info Table.

10.4.1 FIT Block Lists

The FIT Block List is a list in the control log that allocates a FIT file pointer for entries in the FIT for a file. The FIT file pointer contains the address of the physical flash block that is allocated to the range defined in a file data pointer, and the same FIT file number that is defined in the file data pointer. An entry in the FIT block list contains a single field, a block physical address.

The FIT Update Block List is a list in the control log that allocates a FIT file pointer for entries for a file in the FIT that are being updated. The FIT file pointer contains the address of the physical flash block that is currently allocated as the FIT update block entry, and the FIT update file number that is allocated in the FIT update block to the FIT file being updated.

An entry in the FIT update block list contains three fields:
1) FIT range,
2) FIT file number, and
3) FIT update file number.

When a FIT file pointer corresponding to a file data pointer should be determined from the FIT block lists, the FIT update block list is searched to determine if an entry relating to the file data pointer is present. If none exists, the entry relating to the file data pointer in the FIT block list is valid.

10.4.2 Info Block Lists

File_info written by a host is stored directly in the info table, identified by a file info pointer. Info block lists exist to allocate an info pointer to file_info in the info table. The indexing mechanisms for these info block lists is completely analogous to those described for the FIT block lists.

An entry in the info block list contains a single field, a block physical address.

An entry in the info update block list contains three fields:
1) Info range,
2) Info number, and
3) Update info number.

10.5 File Index Table

The File Index Table (FIT) comprises a string of FIT entries, where each FIT entry identifies the file offset address and the physical location in flash memory of a data group. The FIT contains entries for all valid data groups for files stored in the device. Obsolete data groups are not indexed by the FIT. An example FIT logical structure is given in FIGS. 10-4.

A set of FIT entries for data groups in a file is maintained as consecutive entries, in file offset address order. The set of entries is known as a FIT file. The FIT is maintained as a series of FIT ranges, and each FIT range has a correlation with a physical flash block. The number of FIT ranges will vary, depending on the number of data groups in the device. New FIT ranges will be created and FIT ranges eliminated during operation of the device. The FIT block lists are used to create a FIT file pointer from the file data pointer, by which a location in the FIT may be identified.

10.5.1 FIT File

A FIT file is a set of contiguous FIT entries for the data groups within a file. The entries in the set are in order of file offset address. FIT entries in a FIT file are consecutive, and are either contained within a single FIT range, or overflow from one FIT range to the next consecutive FIT range.

10.5.2 FIT Header

The first entry in a FIT file is the FIT header. It has three fields:
1) FileID,
2) Program block, and
3) Program pointer.

The FIT header has a fixed length equal to an integral number of FIT entries. This number may be one.

10.5.2.1 FileID

The fileID identifies the entry for the file in the directory.

10.5.2.2 Program Block

The current physical location of the program block for a file is recorded in the FIT header whenever an updated version of the FIT file is written in the FIT. This is used to locate the program block for a file, when the file is re-opened by the host. It may also be used to validate the correspondence between a FIT file and the program block for the file, which has been selected for program block consolidation.

10.5.2.3 Program Pointer

The current value of the program pointer within the program block for a file is recorded in the FIT header whenever an updated version of the FIT file is written in the FIT. This is used to define the location for programming data within the program block for a file, when the file is re-opened by the host, or when the program block has been selected for program block consolidation.

10.5.3 FIT Entry

A FIT entry specifies a data group. It has four fields:
1) Offset address,
2) Length,
3) Pointer, and
4) EOF flag.

10.5.3.1 Offset Address

The offset address is the offset in bytes within the file relating to the first byte of the data group.

10.5.3.2 Length

This defines the length in bytes of file data within the data group. The length of the complete data group is longer than this value by the length of the data group header.

10.5.3.3 Pointer

This is a pointer to the location in a flash block of the start of the data group. The pointer has two fields:
1) Block address, defining the physical block containing the data group, and
2) Byte address, defining the byte offset within the block of the start of the data group. This address contains the data group header.

10.5.3.4 EOF Flag

The EOF flag is a single bit that identifies a data group as being the end of file.

10.5.4 FIT Block Format

A FIT range is mapped to a single physical block, known as a FIT block. Updated versions of data in these blocks is programmed in a common update block, known as a FIT update block. Data is updated in units of one page. Multiple pages within a metapage may be updated in parallel, if necessary.

10.5.4.1 Indirect Addressing

A FIT file is identified by a FIT file pointer. The FIT file number field within this pointer is a logical pointer, which remains constant as data for a FIT file is moved within the physical structures used for indexing. Pointer fields within the physical page structures provide logical to physical pointer translation.

10.5.4.2 Page Format

The page formats employed in FIT blocks and FIT update blocks are identical.

A page is subdivided into two areas, the first for FIT entries and the second for file pointers. An example is given in FIGS. 10-5.

The first area contains FIT entries that each specifies a data group or contains a FIT header for a FIT file. An example of the number of FIT entries in a FIT page is 512. A FIT file is specified by a contiguous set of FIT entries, within one FIT page or overlapping two or more FIT pages. The first entry of a FIT file, containing a FIT header, is identified by a file pointer in the second area.

The second area contains valid file pointers only in the FIT page that was most recently programmed. The second area in all other pages is obsolete, and is not used. The file pointer area contains one entry for each FIT file that may be contained in the FIT block, that is, the number of file pointer entries is equal to the maximum number of FIT files that may exist in a FIT block. File pointer entries are stored sequentially, according to FIT file number. The Nth file pointer entry contains a pointer to FIT file N within the FIT block. It has two fields:
1) Page number, specifying a physical page within the FIT block, and
2) Entry number, specifying a FIT entry within the physical page.

The file pointer entries provide the mechanism for translating a logical FIT file number within a FIT block to a physical location within the block. The complete set of file pointers is updated when every FIT page is programmed, but is only valid in the most recently programmed page. When a FIT file is updated in the FIT update block, its previous location in either the FIT block or FIT update block becomes obsolete, and is no longer referenced by a file pointer.

10.5.5 FIT Update Blocks

Changes to FIT files in a FIT block are made in a single FIT update block that is shared amongst all FIT blocks. An example of physical FIT blocks is shown in FIGS. 10-6.

The file data pointer is a logical pointer to a FIT file. Its FIT range field is used to address a FIT block list to identify the physical block address of the FIT block that is mapped to this FIT range. The FIT file number field of the FIT file pointer then selects the correct file pointer for the target FIT file in the FIT block.

Both FIT range field and FIT file number field of the file data pointer are used to address a FIT update block list, to identify if the target FIT file has been updated. If an entry is found in this list, it provides the physical block address of the FIT update block, and the FIT file number within the update block of the updated version of the FIT file. This may be different from the FIT file number used for the FIT file in the FIT block. The FIT update block contains the valid version of the FIT file, and the version in the FIT block is obsolete.

10.5.6 Update Operations

A FIT block is programmed only during a consolidation operation. This results in the FIT files being close packed within the block. A FIT update block is updated when FIT entries are modified, added or removed, and during a compaction operation. FIGS. 10-7 shows examples of update operations on FIT files.

FIT files are closely packed in the FIT block, as a result of a consolidation operation. The FIT block may not be entirely filled, as there is a maximum number of FIT files that can exist within it. FIT files may overflow from one page to the next. A FIT file in a FIT block becomes obsolete when it is updated and rewritten in the FIT update block.

When a FIT file is updated, it is rewritten in its entirety in the next available page in the FIT update block. Updating a FIT file may consist of either changing the content of existing FIT entries, or changing the number of FIT entries. FIT files may overflow from one page to the next. The FIT files within a FIT update block need not all relate to the same FIT range.

10.5.7 Creation of a FIT Range

When a new FIT range must be created to accommodate additional storage space for FIT files, a FIT block is not immediately created. New data within this range is initially written to the FIT update block. A FIT block is subsequently created when a consolidation operation is performed for the range.

10.5.8 Compaction and Consolidation

10.5.8.1 Compaction of Directory Update Block or FIT Update Block

When a FIT update block becomes filled, its valid FIT file data may be programmed in compacted form to an erased block, which then becomes the update block. There may be a little as one page of compacted valid data to be programmed, if updates have related to only a few files.

If the FIT file to be relocated in the compaction operation relates to a closed file, and the FIT block for the range contains sufficient unprogrammed pages, the FIT file may be relocated to the FIT block, rather than to the compacted update block.

10.5.8.2 Consolidation of Directory Block or FIT Block

When FIT entries are updated, the original FIT file in the FIT block becomes obsolete. Such FIT blocks should undergo garbage collection periodically, to recover obsolete space. This is achieved by means of a consolidation operation. In addition, new files may have been created within a range and have entries in an update block, but no corresponding obsolete entries in the FIT block may exist. Such FIT files should be relocated to the FIT block periodically.

FIT files in an update block may be consolidated into a FIT block for the relevant range, and therefore be eliminated from the update block, whilst other FIT files remain in the update block.

If the number of FIT entries in a FIT file has increased during the update process, and valid data for the FIT range cannot be consolidated into a single erased block, some FIT files originally assigned to that FIT range may be assigned to another FIT range, and consolidation may be performed into two blocks in separate operations. In the case of such reassignment of a FIT file, the file data pointer in the directory must be updated to reflect the new FIT range.

A consolidation operation for a range should be performed when the capacity of valid data for that range in a FIT update block reaches a defined threshold. An example of this threshold is 50%.

Compaction should be performed in preference to consolidation for active FIT files relating to files that are still open, and which the host may continue to access.

10.6 Info Table

The info table uses the same structures, indexing mechanisms and update techniques that are defined for the File Index Table in section 10.5. However, file_info for a file comprises a single string of information that is not interpreted within the direct data file platform.

10.7 Data Groups

A data group is a set of file data with contiguous offset addresses for a file, programmed at contiguous physical addresses in a single memory block. A file will normally be programmed as a number of data groups. A data group may have any length between one byte and one block.

10.7.1 Data Group Header

Each data group is programmed with a header, containing file identifier information for cross reference purposes. The header contains the FIT file pointer for the file of which the data group forms part.

11. Block State Management

11.1 Block States

Blocks for storage of file data can be classified in the following eight states, as shown in the state diagram of FIG. 11-1.

11.1.1 Erased Block

An erased block is in the erased state in an erased block pool. A possible transition from this state is as follows:
 (a) Erased Block to Program Block
 Data for a single file is programmed to an erased block, when it is supplied from the host or when it is copied during garbage collection for the file.

11.1.2 Program Block

A program block is partially programmed with valid data for a single file, and contains some erased capacity. The file may be either open or closed. Further data for the file should be programmed to the block when supplied by the host, or when copied during garbage collection of the file.

Possible transitions from this state are as follows:
 (b) Program Block to Program Block
 Data for a single file is programmed to a program block for that file, when it is supplied from the host or when it is copied during garbage collection for the file.
 (c) Program Block to File Block
 Data for a single file from the host is programmed to fill a program block for that file.

(f) Program Block to Obsolete Block

All data for a file in a program block becomes obsolete, as a result of valid data being copied to another block during garbage collection, or of all or part of the file being deleted by the host.

(h) Program Block to Obsolete Program Block

Part of the data in a program block becomes obsolete as a result of an updated version of the data being written by the host in the same program block, or of part of the file being deleted by the host.

(l) Program Block to Common Block

Residual data for a file is programmed to a program block for a different closed file during garbage collection of the file or of a common block, or during consolidation of program blocks.

11.1.3 FileBlock

A file block is filled with fully valid data for a single file.
Possible transitions from this state are as follows:

(d) File Block to Obsolete File Block

Part of the data in a file block becomes obsolete as a result of an updated version of the data being programmed by the host in a program block for the file.

(g) File Block to Obsolete Block (g)

All data in a file block becomes obsolete, as a result of an updated version of the data in the block being programmed by the host in a program block for the file, or of all or part of the file being deleted by the host.

11.1.4 Obsolete File Block

An obsolete file block is filled with any combination of valid data and obsolete data for a single file.
Possible transitions from this state are as follows:

(e) Obsolete File Block to Obsolete Block (e)

All data in an obsolete file block becomes obsolete, as a result of an updated version of valid data in the block being programmed by the host in a program block for the file, of valid data being copied to another block during garbage collection, or of all or part of the file being deleted by the host.

11.1.5 Obsolete Program Block

An obsolete program block is partially programmed with any combination of valid data and obsolete data for a single file, and contains some erased capacity. Further data for the file should be programmed to the block when supplied by the host. However, during garbage collection, data for the file should not be copied to the block and a new program block should be opened.

Possible transitions from this state are as follows:

(i) Obsolete Program Block to Obsolete Program Block

Data for a single file is programmed to an obsolete program block for that file, when it is supplied from the host.

(j) Obsolete Program Block to Obsolete Block

All data for a file in an obsolete program block becomes obsolete, as a result of valid data being copied to another block during garbage collection, or of all or part of the file being deleted by the host.

(k) Obsolete Program Block to Obsolete File Block

Data for a single file is programmed to fill an obsolete program block for that file, when it is supplied from the host.

11.1.6 Common Block

A common block is programmed with valid data for two or more files, and normally contains some erased capacity. Residual data for any file may be programmed to it during garbage collection or consolidation of program blocks.

Possible transitions from this state are as follows:

(m) Common Block to Common Block

Residual data for a file is programmed to a common block during garbage collection of the file or a common block, or during consolidation of program blocks.

(n) Common Block to Obsolete Common Block

Part or all of the data for one file in a common block becomes obsolete as a result of an updated version of the data being programmed by the host in a program block for the file, of the data being copied to another block during garbage collection of the file, or of all or part of the file being deleted by the host.

11.1.7 Obsolete Common Block

An obsolete common block is programmed with any combination of valid data and obsolete data for two or more files, and normally contains some erased capacity. Further data should not be programmed to the block.

Possible transitions from this state are as follows:

(o) Obsolete Common Block to Obsolete Block

Data for all files in an obsolete common block becomes obsolete as a result of an updated version of the data for one file being programmed by the host in a program block for the file, of the data for one file being copied to another block during garbage collection of the file, or of all or part of one file being deleted by the host.

11.1.8 Obsolete Block

An obsolete block contains only obsolete data, but is not yet erased.

A possible transition from this state is as follows:

(p) Obsolete Block to Erased Block (p)

An obsolete block is erased during garbage collection, and added back to the erased block pool.

12. Erased Block Management 12.1 Metablock Linking

The method of linking erase blocks into metablocks is unchanged from that defined for an earlier 3rd generation LBA system.

12.2 Erased Block Pool

The erased block pool is a pool of erased blocks in the device that are available for allocation for storage of file data or control information. Each erased block in the pool is a metablock, and all metablocks have the same fixed parallelism.

Erased blocks in the pool are recorded as entries in the erased block log in the control block. Entries are ordered in the log according to the order of erasure of the blocks. An erased block for allocation is selected as the entry at the head of the log. An entry is added to the tail of the log when a block is erased.

13. Control Data Structures

Control data structures are stored in flash blocks dedicated to the purpose. Three classes of blocks are defined, as follows:
1) File directory block,
2) File index table block, and
3) Control block.

13.1 File Directory Block

The structure of file directory blocks is has been described previously.

13.2 File Index Table Block

The structure of file index table blocks has been described previously

13.3 Control Block

The control block stores control information in four independent logs. A separate page is allocated for each of the logs. This may be extended to multiple pages per log, if necessary. An example format of a control block is shown in FIGS. 12-1.

A log is updated by writing a revised version of the complete log at the next erased page location defined by a control pointer. Multiple logs may be updated simultaneously, if necessary, by programming them to different pages in a metapage. The page locations of the valid versions of each of the four logs are identified by log pointers in the last written page in the control block.

13.3.1 Common Block Log

The common block log records information about every common block existing in the device. The log entries in the common block log are subdivided into two areas, the first for block entries and the second for data group entries, as illustrated in FIGS. 12-2. Each block entry records the physical location of a common block. Entries are fixed size, and a fixed number exist in the common block log. Each entry has the following fields:
1) Block physical address,
2) Pointer to the next available page in the common block for programming,
3) Pointer to the first of the data group entries for the block, and
4) Number of data group entries.

A data group entry records information about a data group in a common block. A set of contiguous data group entries defines all data groups in a common block. There is a variable number of data groups in a common block. Each entry preferably has the following fields:
1) Byte address within common block, and
2) FIT file pointer.

13.3.2 Program Block Log

The program block log records information about every program block existing in the device for closed files. One entry exists for each program block, and has the following fields:
1) Block physical address,
2) Pointer to the next available page in the program block for programming, and
3) FIT file pointer.

13.3.3 Erased Block Log

The erased block log records the identity every erased block existing in the device. One entry exists for each erased block. Entries are ordered in the log according to the order of erasure of the blocks. An erased block for allocation is selected as the entry at the head of the log. An entry is added to the tail of the log when a block is erased. An entry has a single field: Block physical address.

13.3.4 Control Log

The control log records diverse control information in the following fields:

13.3.4.1 Open File List

This field contains information about each of the currently open files, as follows:
1) Pathname,
2) Filename,
3) FIT file pointer, and
4) Program block physical address.

The program blocks for open files are not included in the program block log.

13.3.4.2 Common Block Count

This field contains the total number of common blocks recorded in the common block log.

13.3.4.3 Program Block Count

This field contains the total number of program blocks recorded in the program block log. The count is updated when blocks are added to and removed from the program block log.

13.3.4.4 Erased Block Count

This field contains the total number of erased blocks recorded in the erased block log. The count is updated when blocks are added to and removed from the erased block log.

13.3.4.5 Program/Common Block Page Count

This field contains a count of the number of valid data pages in program blocks and common blocks. The count is updated when blocks are added to and removed from the program block log and the common block log.

13.3.4.6 Obsolete Block Count.

This field contains a count of the number of fully obsolete blocks awaiting garbage collection. The count is updated when blocks are added to and removed from the obsolete block garbage collection queue.

13.3.4.7 FIT Block List

This field contains information for mapping FIT range to FIT block. It contains an entry defining FIT block physical address for each FIT range.

13.3.4.8 FIT Update Block List

This field contains information for mapping FIT range and FIT file number to FIT update file number. It contains an entry for each valid FIT file that exists in the update block. An entry has the following three fields:
1) FITrange,
2) FIT file number, and
3) FIT update file number.

13.3.4.9 Directory Block List

This field contains information for mapping directory range to directory block. It contains an entry defining directory block physical address for each directory range.

13.3.4.10 Directory Update Block List

This field contains information for mapping directory range and subdirectory number to update subdirectory number. It contains an entry for each valid subdirectory that exists in the update block. An entry has the following three fields:
1) Directory range,
2) Subdirectory number, and
3) Update subdirectory number.

13.3.4.11 Buffer Swap Block Index

This field contains an index of valid data groups in the swap block. The index for each data group contains the following fields:
1) FIT file pointer,
2) Byte address within swap block, and
3) Length.

13.3.4.12 Priority Obsolete Block Queue

This field contains the block addresses of all blocks in the priority obsolete block queue for garbage collection.

13.3.4.13 Priority Common Block Queue

This field contains the block addresses of all blocks in the priority common block queue for garbage collection.

13.3.4.14 Obsolete Block Queue

This field contains the block addresses of all blocks in the obsolete block queue for garbage collection.

13.3.4.15 Common Block Queue

This field contains the block addresses of all blocks in the common block queue for garbage collection.

13.3.4.16 File Queue

This field contains the FIT file pointers of all files in the file queue for garbage collection.

14. Static Files

14.1 Static Files

Some hosts may store data in a direct data file device by creating a set of files with identical sizes, and updating data periodically within files in the set. A file that is part of such a set is termed a static file. The host may be external to the memory card or may be a processor within the memory card that is executing an on-card application.

An example application of the use of static files is described in a patent application of Sergey Anatolievich Gorobets, entitled "Interfacing systems Operating Through A Logical Address Space and on a Direct Data File Basis," filed concurrently herewith. In that application, the logical address space of a host is divided by the memory controller into such static files.

The direct data file device manages the storage of a static file in exactly the same way as for any other file. However, the host may use commands in the direct data file command set in a way that optimizes behavior and performance of the device with static files.

14.1.1 Static File Partition

Static files are stored as a set in a dedicated partition in the device. All static files in a partition have identical file size.

14.1.2 Static File Size

File size is defined by host, via the range of offset addresses written to the file. Static files have a size equal to the size of a metablock.

The host manages the file offset values represented by the write_pointer and read_pointer, to maintain them within the range of values permitted for a static file at all times.

14.1.3 Deleting Static Files

Unlike other files in a direct data file device, the host does not delete a static file during normal operation. A static file is created by the host, then exists continuously in the device. Data written at any time to the file overwrites existing file data.

However, a host always has the ability to delete a static file, for example, during an operation by the host to reformat the device or to reduce the size of the partition for static files in the device.

14.2 Command Set used with Static Files

Figures 9, 10, 11, 12, 13:
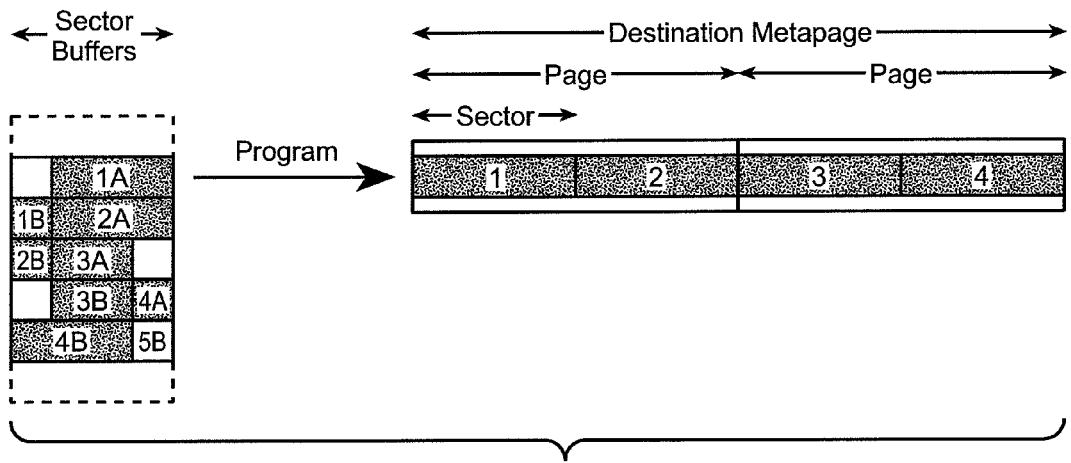
Figures 1, 10:
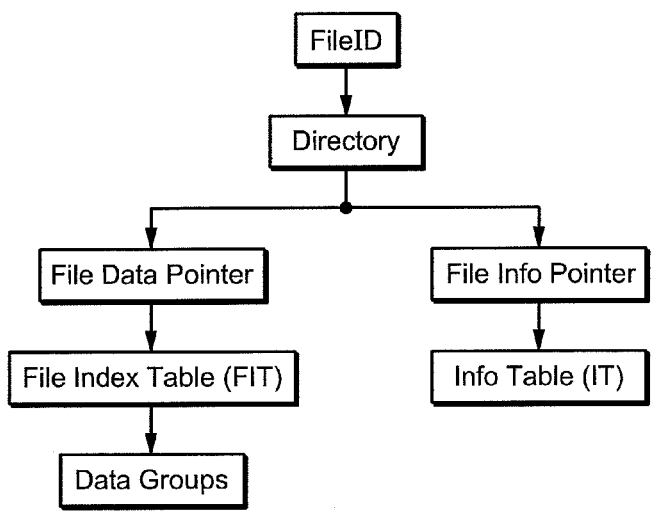
Figures 2, 10:
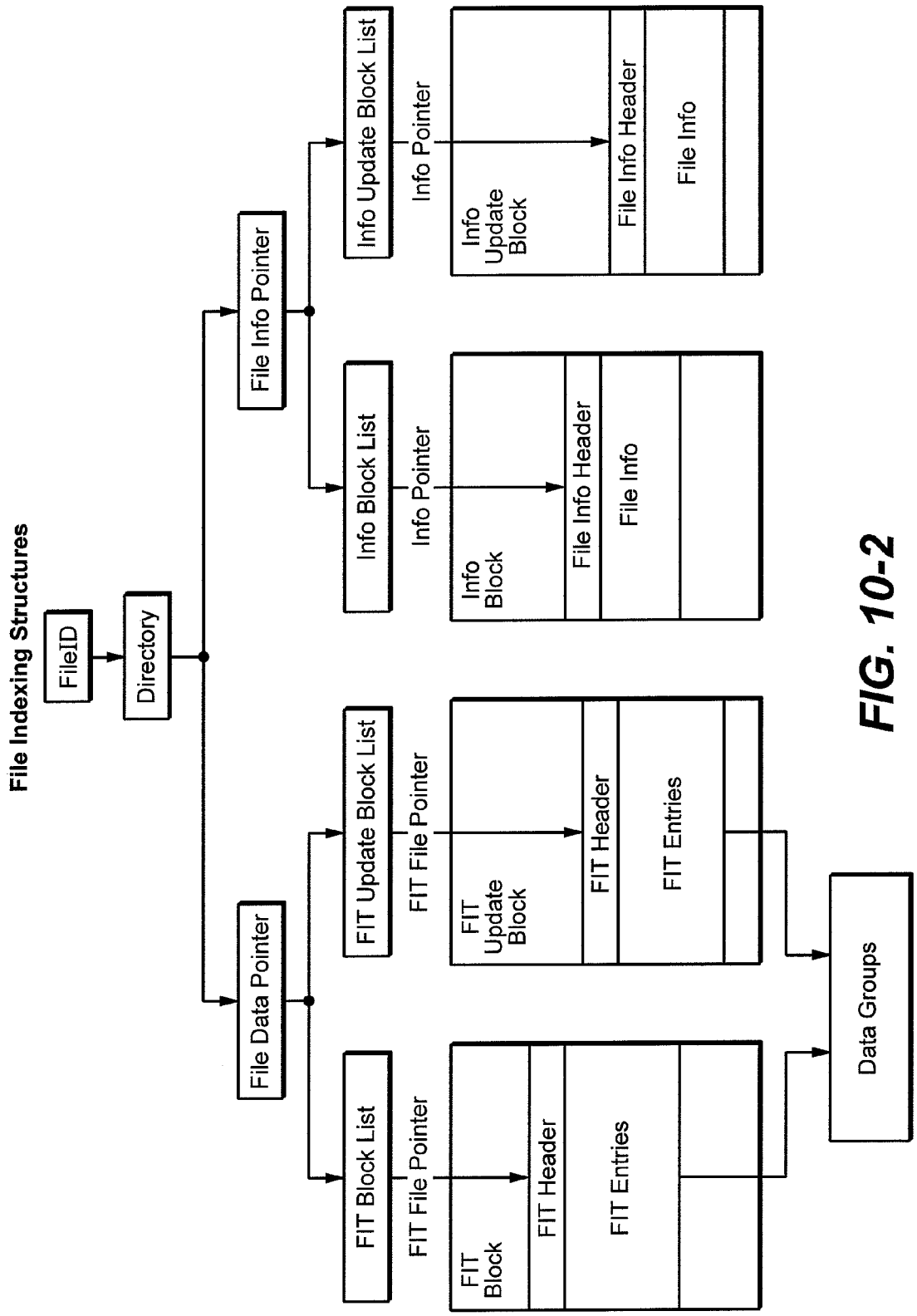
Figures 3, 10:
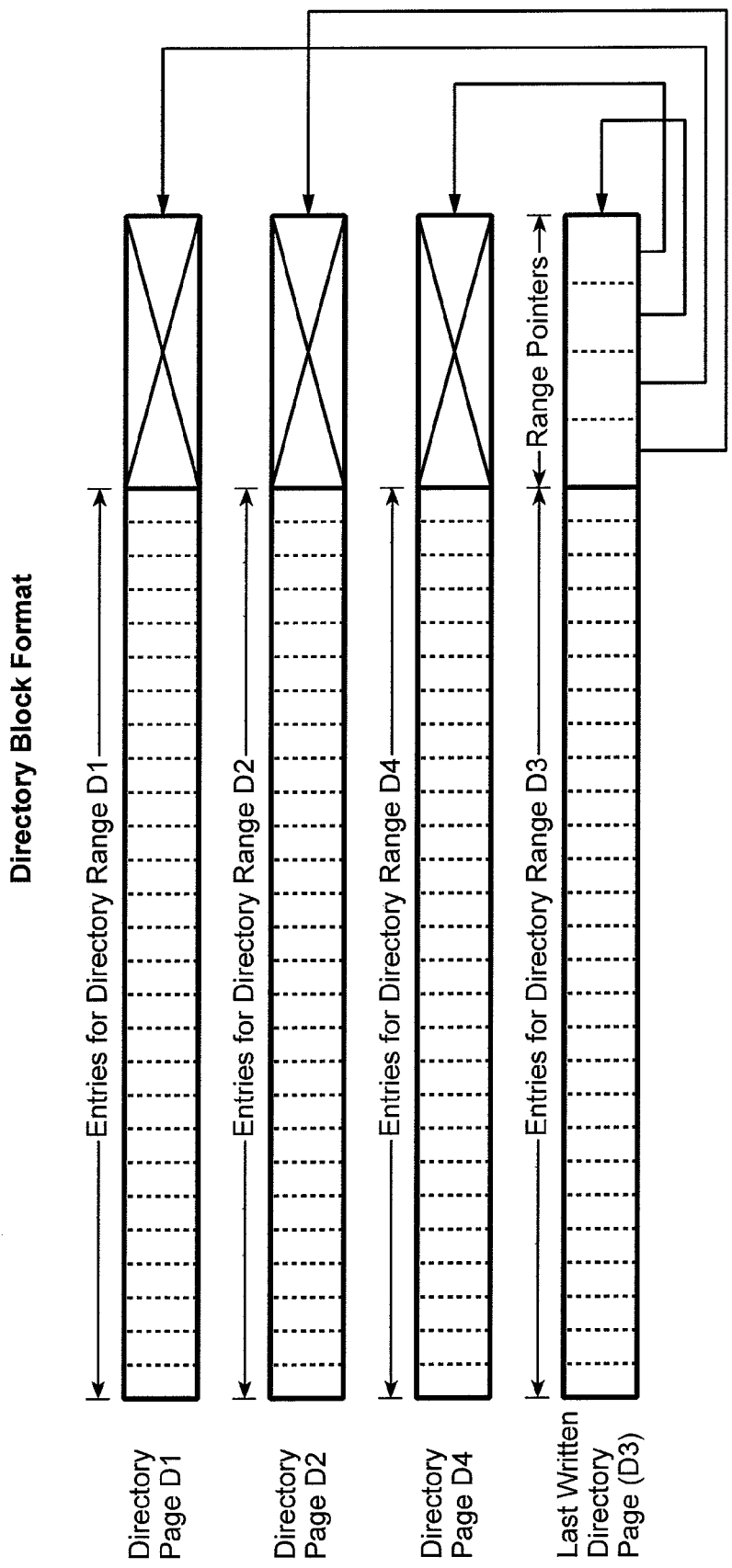
Figures 4, 10:
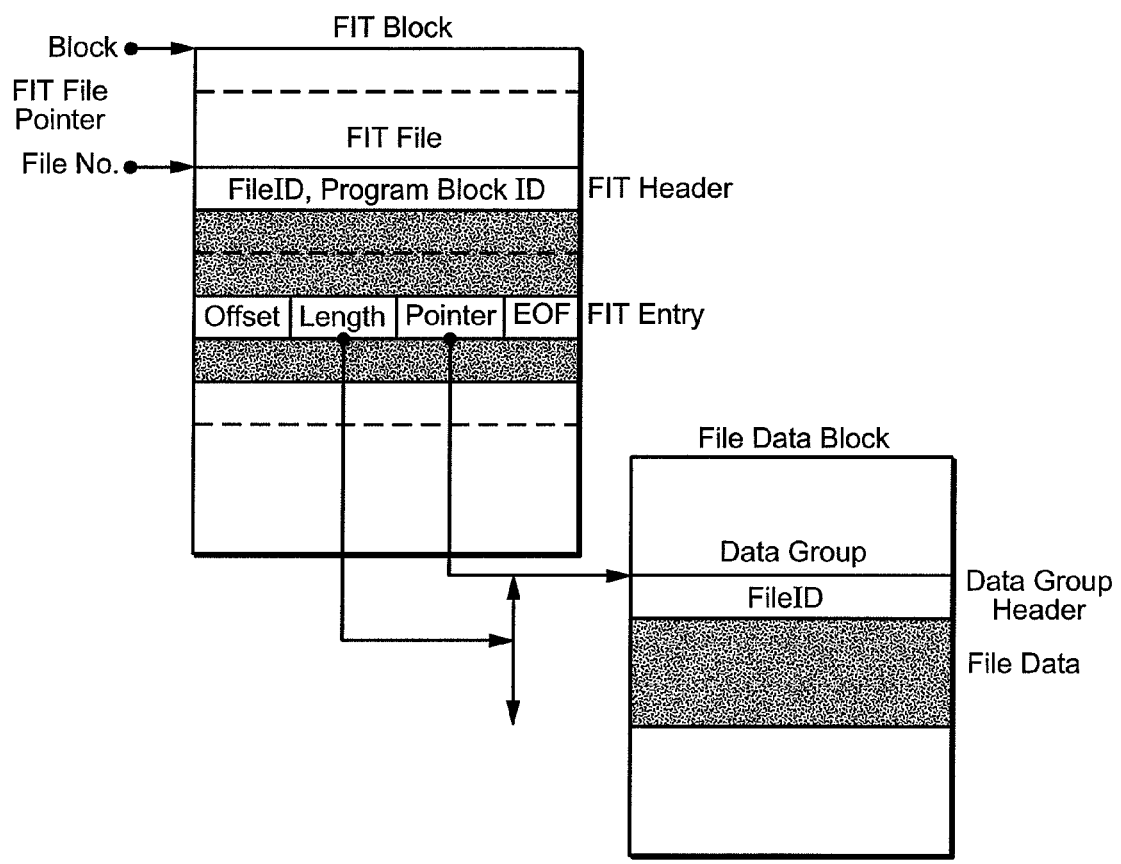
Figures 5, 10:
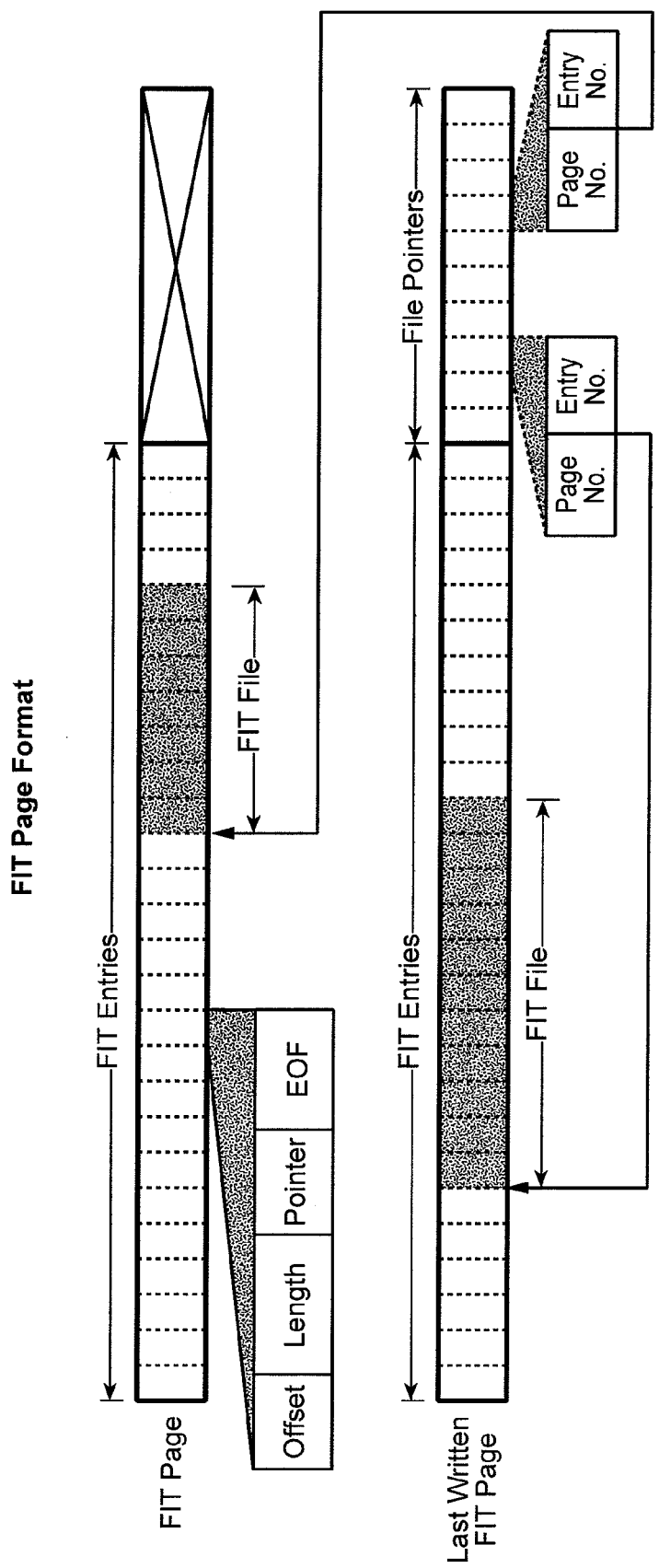
Figures 6, 10:
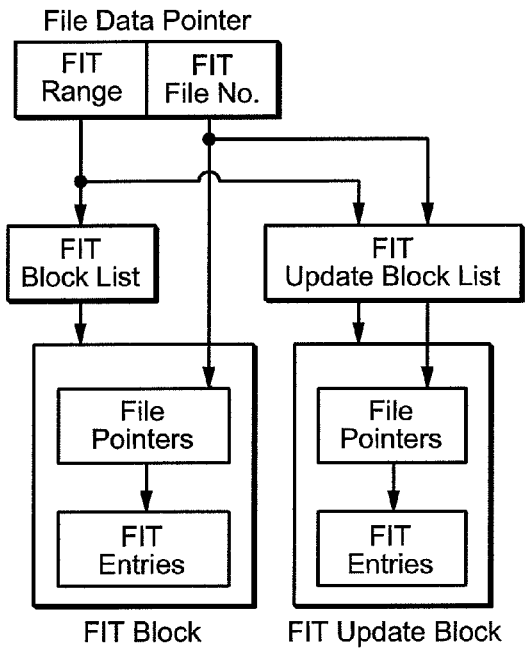
Figures 7, 10:
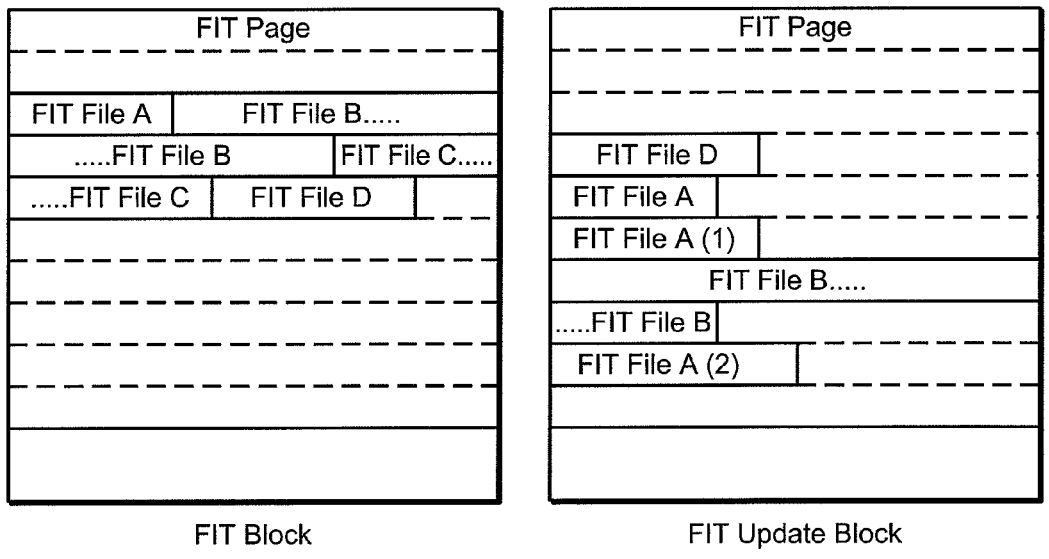
Figures 1, 11:
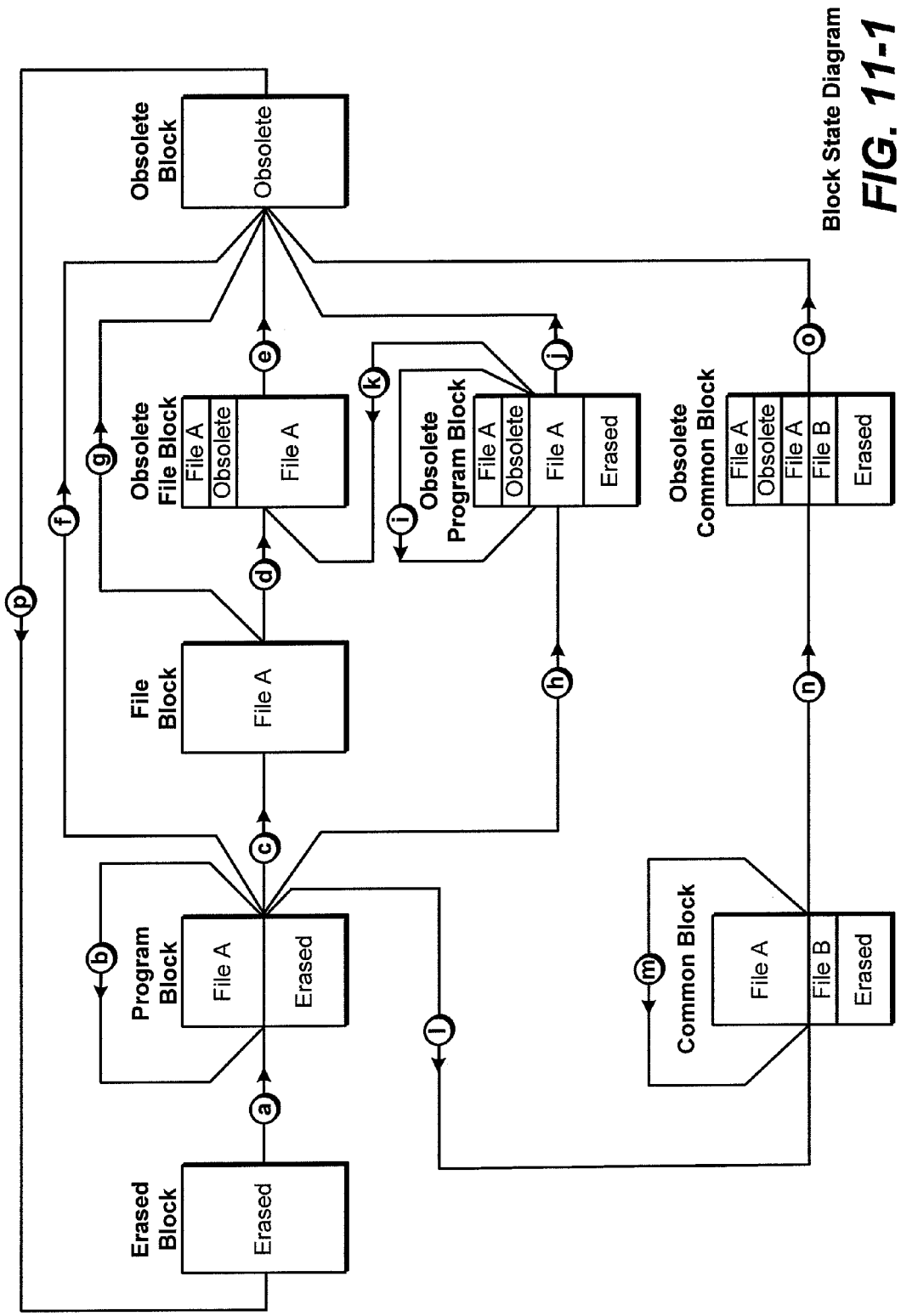

FIGS. 13-1 gives a command set for use with static files, a subset of that shown in FIGS. 2-1 through 2-6, which support all operations required for static files.

14.3 Creating Static Files

A static file is created in the device by use of the create command from the host. The host will normally specify the fileID with which it wishes to identify the file.

The host may either track which files it has created in the device, or it may create a file in response to an error message from the device after the host has attempted to open a file whose fileID does not already exist in the device.

14.4 Opening Static Files

The host opens a static file by sending an open command using the fileId for the file as a parameter.

The host may operate with the set of static files in the device in such a way that it controls the number of the files that are concurrently open in the device or the number of files of a specific type defined by the host that are concurrently open in the device. The host may therefore close one or more static files before opening another static file.

14.5 Writing to Static Files

When a static file is first written, it occupies a single complete file block in the device, because the file size is defined by the host as being exactly equal to the size of a metablock in flash memory. The offset address range for the file is therefore exactly equal to the size of a metablock in flash memory.

Subsequent writes to the static file cause data to be updated within this offset address range. The host controls the file offset address at which data is being updated by controlling the write_pointer value for the file by means of the write_pointer command. The host does not allow the write_pointer value to exceed the end of the offset address range relating to the size of a static file. Similarly, the host constrains the read_pointer value to within this range.

When existing data in a static file is updated after the file has been opened, a program block is opened to which updated data is programmed. Data with corresponding offset address in the file block becomes obsolete. If the complete static file is updated, all data in the program block is valid and the program block becomes the file block for the file. All data in the previous file block for the file has become obsolete, and the block is added to the obsolete block garbage collection queue. An erased block is assigned as a program block if further updated data is received for the file.

If a program block for a static file becomes full, but it does not contain all the valid data for the file, some of the data in the program block is obsolete because multiple updates have been made to the same offset address. In this case, the program block cannot become a file block, and another empty program block is not opened when further data for the file is received. An erased block is allocated to which valid data from the program block is copied (the program block is compacted), and this partially filled block then becomes the program block for the file. All data in the previous program block for the file is now obsolete, and the block is added to the obsolete block garbage collection queue.

Note that the host can force a consolidation of a file block and a program block, each of which contains some valid data for a file, by closing the file as described in the following section 14.6. The host may elect to temporarily close a file when a partially obsolete program block becomes full, rather than allow the direct data file device to compact the program block when further data for the file is received.

14.6 Closing Static Files

The host closes a static file by sending a close command using the fileID for the file as a parameter.

Closure of a static file causes the file to be put into the file garbage collection queue, if only part of the data for the file has been updated. This allows a subsequent garbage collection operation for the file as described in the following section 14.7. However, the host may force an immediate garbage collection operation on the file, as also described in section 14.7.

14.7 Garbage Collection of Static Files

A static file with an entry in the file garbage collection queue has been closed following the update of part of the data in the file. The file block for the file contains some valid data and some obsolete data, and the program block contains some valid data, possibly some obsolete data, and possible some erased capacity.

The file garbage collection operation consolidates all valid data for the file to a single block. If the program block contains no obsolete data, valid data is copied to the program block from the file block, and the file block is erased. If the program block contains obsolete data, all valid data from both the file block and the program block are copied to an erased block, and both the file block and program block are erased.

File garbage collection is performed when the entry reaches the head of the queue, at a time determined by the garbage collection-scheduling algorithm. However, the host may force an immediate garbage collection operation on a file when it closes the file. It does this by sending an idle command immediately after the close command for the file, which causes the device to perform garbage collection or block consolidation operations continuously, until another command is received. The host monitors the internal busy status of the device, until it detects that the device is no longer busy performing internal operations, before sending another command. By this mechanism, consolidation of file and program blocks for a file immediately the file has been closed may be ensured by the host.

Outline of an Example Memory System According to the Foregoing Description

Direct Data File Platform

The direct data file platform acts as a universal back-end system for managing data storage in flash memory.

The direct data file interface is an internal file storage interface supporting multiple sources of data.

File access interface with random read/write access of file data without predefined length.

Object interface with transfer of complete file objects with predefined length.

LBA interface to conventional hosts incorporating a file system. Logical blocks are stored as logical files.

Embedded application programs with random access to data within files.

Direct data file storage is a back-end system that organizes data storage on a file-by-file basis.

No logical address space for storage device.
No file system.

Direct Data File v. Prior Systems

The direct data file platform offers benefits over prior systems:
  High Data Write Speed:
  Progressive performance reduction due to file fragmentation is eliminated;
  Peak data write speed can be increased when files deleted by a host are erased in a background operation.
  Uniformity of Data Write Speed:
  Sustained write speed for streaming data can be improved when garbage collection is performed in the background or in bursts interleaved with writing of host data.
  Benefits are a consequence of the characteristics of the algorithms used in the direct data file platform:
    Limited file fragmentation
    Limited file and block consolidation
    True file delete
    Optimum file data indexing
    Efficient garbage collection Direct Data File Interface—Desirable Features The direct data file interface should be independent of the operating system in a host:
  Files with a numerical identifier are managed in a flat hierarchy;
  Data associated with a file may be stored, to allow construction and maintenance of a hierarchical directory at a level above the interface.
The direct data file interface preferably supports various formats of file data transfer:
  Files whose size is undefined to which data can be streamed;
  Files whose size is defined before they are written;
  Files whose size is fixed and which exist permanently.

Direct Data File Interface—Implementation

Data within a file has random write and read access, with a granularity of one byte.

Data may be appended to, overwrite, or be inserted within, existing data for a file.

File data being written or read is streamed to or from the device with no predefined length.

A current operation is terminated by receipt of another command.

Files are opened for writing data and closed at the end of the file, or when the file is inactive.

A file handle is returned by the device for files specified by the host.

A hierarchical directory is supported but not maintained.

Associated information for a file may be stored.

A state within which the device may perform internal operations in the background may be initiated by the host.

Direct Data File Interface—Command Set
  File Commands:
  Commands for controlling file objects,
  Create, Open, Close, Delete, Erase, List_files.
  Data Commands:
  Commands for writing and reading file data,
  Write, Insert, Remove, Read, Save_buffer, Write_pointer, Read_pointer.
  Info Commands:
  Commands for writing and reading information associated with a file,
  Write_info, Read_info, Info write_pointer, Info_read_pointer.
  State Commands:
  Commands for controlling the state of the device,
  Idle, Standby, Shut-down.
  Device Commands:
  Commands for interrogating the device,
  Capacity, Status.

File-to-Flash Mapping Algorithm
  Data Structures:
  Files
  Data groups
  Block Types:
  Program blocks
  File blocks
  Common blocks
  File Types:
  Plain file
  Common file
  Edited file
  Memory Recovery:
  Garbage collection
  Block consolidation File-to-Flash Mapping Algorithm—Data Structures
  Files:
    A file is a set of data created and maintained by a host;
    The host may be an external host or may be an application program within the memory card;
    A file is identified by a filename created by the host, or by a file handle created by the direct data file platform;
    Data within a file is identified by file offset addresses;
    The sets of offset addresses for different files act as independent logical address spaces within the device. There is no logical address space for the device itself.
  Data Groups:
    A data group is a set of data for a single file with contiguous offset addresses within the file;
    A data group is stored at contiguous physical addresses in a single block;
    A data group may have any length between one byte and one block;
    The data group is the basic unit for mapping logical file address to physical flash address.

File-to-Flash Mapping Algorithm—Block Types
  Program Blocks:
    All data written by a host is programmed in a program block;
    A program block is dedicated to data for a single file;
    File data in a program block may be in any order of file offset address, and a program block may contain multiple data groups for a file;
    Separate program blocks exist for each open file, and for an unspecified number of closed files.
  File Blocks:
    A program block becomes a file block when its last location has been programmed.
  Common Blocks:
    A common block contains data groups for more than one file;
    A common block is created by programming data groups for unrelated files to a program block during garbage collection of a common block or during a block consolidation operation;
    Data groups may be written to a common block during garbage collection of another common block or during a block consolidation operation.

File-to-Flash Mapping Algorithm—File Types
  Plain File (see FIGS. 3-1):
    A plain file comprises any number of complete file blocks and one partially written program block.
    A plain file may be deleted without need to relocate data from any block prior to its erasure.
  Common File (see FIGS. 3-2):
    A common file comprises any number of complete file blocks and one common block, which contains data for the file along with data for other unrelated files.
    A garbage collection operation on only the common block must be performed subsequent to the file being deleted.
  Edited File (see FIGS. 3-3 and 3-4)
    An edited file contains obsolete data in one or more of its blocks, as a result of data at an existing offset address having been overwritten.
    Memory capacity occupied by obsolete data may be recovered by a file garbage collection operation.
    A file garbage collection operation restores an edited file to plain file format.

File-to-Flash Mapping Algorithm—Memory Recovery
  Garbage Collection:
    Garbage collection operations are performed to recover memory capacity occupied by obsolete data.
    Pending operations are logged in garbage collection queues, and are performed subsequently at an optimum rate according to scheduling algorithms.
    Garbage collection may be initiated by a host command and performed in the background whilst the host interface is quiescent. Operations are suspended on receipt of any other host command.
    Garbage collection may also be performed as foreground operations, in bursts interleaved with host data write operations.
  Block Consolidation:
    An ongoing process of block consolidation may be implemented to recover erased capacity locked up in program blocks and common blocks.
    Only necessary if the distributions of capacities of file data in program blocks and of capacities of obsolete data for deleted files in common blocks are imbalanced.
    Data in multiple program or common blocks is consolidated to allow erasure of one or more blocks.

Programming File Data
  Data for a file identified by a file handle is programmed to flash memory as it is streamed from a host following a write or insert command.
  The initial file offset address of the data is defined by a write pointer, whose value may be set by the host.
  When sufficient data has been accumulated in buffer memory, a metapage is programmed in the program block for the file.
  When a program block becomes filled, it is designated as a file block and an erased block is allocated as a new program block for the file.
  Data group indexing structures are updated in flash memory whenever a program block becomes filled, or whenever another host command is received.
  The file data programming procedure initiates bursts of foreground garbage collection, at intervals in the host data stream that are determined by an adaptive scheduling algorithm.
  The file data programming procedure is exited when another host command is received.

Reading File Data
  Data for a file identified by a file handle is read from flash memory and is streamed to a host following a read command.
  The initial file offset address of the data is defined by a read pointer, whose value may be set by the host.
  File data is read in units of one metapage until the end of the file is reached, or until another host command is received.
  Data is transferred to the host in file offset address order.
  The location of data groups to be read for the file is defined by file indexing structures.
  The file data reading procedure is exited when another host command is received.

Deleting a File
  In response to a delete command for a file, blocks containing data for the file are identified and added to garbage collection queues for subsequent garbage collection operations.
  The file directory and file index table are updated, to remove entries for the file.
  The procedure for deleting a file does not initiate garbage collection operations, and data for the file is not immediately erased.

In response to an erase command for a file, the same procedure is followed as for the delete command, but garbage collection operations are initiated and completed before any other host command is executed.

Garbage Collection

Garbage collection is an operation to recover flash capacity occupied by obsolete data.

Objects are added to 3 garbage collection queues from time to time during operation of the device, to define subsequent garbage collection operations:

Obsolete block queue—When a block becomes fully obsolete as a result of update of file data or deletion of a file, it is added to this queue.

Common block queue—When data in part of a block containing data for multiple files becomes obsolete as a result of file data update, deletion of a file, or garbage collection of a file, it is added to this queue.

File queue—When a file is closed by the host, it is added to this queue.

Objects may be designated for priority garbage collection.

Garbage Collection Operations May be Scheduled in Two Ways:

Background operations may be initiated by the host when it it is not making read or write access to the device.

Foreground operations may be initiated by the direct data file platform whilst it is being accessed by the host.

Garbage Collection—Scheduling

Background garbage collection is initiated by a host. An idle state in which the device is permitted to perform internal operations is initiated by the host via a specific command at the direct data file interface. Garbage collection of objects from the garbage collection queues continues whilst the idle state persists. Garbage collection is suspended when any command is received from the host. The host may optionally monitor the busy state of the device to allow garbage collection operations to complete before sending the next command.

Foreground garbage collection is initiated by the direct data file platform when a host has not initiated background operations. Garbage collection is scheduled according to an adaptive algorithm. Bursts of program and erase operations for a current garbage collection operation are interleaved with bursts of program operations for file data received from the host. The lengths of the bursts may be adaptively controlled to define the duty cycle of interleaved garbage collection.

Garbage Collection—Adaptive Scheduling (see FIGS. 8-2)

Flash memory normally has recoverable capacity that is required for writing further host data, contained in program blocks, common blocks and obsolete file blocks.

Adaptive garbage collection controls the interleave ratio of programming further host data and relocating previously written host data. Recoverable capacity is made available for new host data by converting it to erased capacity. The garbage collection rate remains constant over the adaptive period Garbage Collection—Priority of Operations The operation for a scheduled garbage collection is selected from the garbage collection queues with the following order of priority:

1. Obsolete block priority garbage collection:
The next entry for an obsolete block created as a result of a file erase command is selected.
2. Common block priority garbage collection:
The next entry for a partially-obsolete common block created as a result of a file erase command is selected.
3. Obsolete block garbage collection:
The next entry for an obsolete block is selected.
4. Common block garbage collection:
The next entry for a partially-obsolete common block is selected
5. File garbage collection:
The next entry for a partially obsolete file is selected.
6. Block consolidation:
When no entries exist in the garbage collection queues, a source block and destination blocks are selected for a block consolidation operation.

Garbage Collection—Common Block Garbage Collection

Valid files contain some data in either a program block or a common block.

When a file is deleted, any common block containing obsolete data for the file experiences a common block garbage collection operation.

Data groups for unrelated files are relocated to another common block or program block (see FIGS. 8-7A through 8-7D).

During a common block garbage collection operation, valid file groups are relocated from the source common block to one or more selected destination blocks.

The destination block is selected individually for each file group.

Priorities for selection of a destination block are as follows:
1. The common block with available erased capacity that is the best-fit for the source file group to be relocated;
2. The program block with available erased capacity that is the best-fit for the source file group to be relocated; and
3. An erased block, which is then designated a program block.

Garbage Collection—File Garbage Collection

File garbage collection may be performed after a file has been closed, to recover capacity occupied by obsolete data for file. This is only necessary if data for the file has been overwritten during an edit.

A file in the edited plain file state or edited common file state is restored to the plain file state (containing a single program block and no common block).

File garbage collection is performed by copying valid data groups from blocks containing obsolete data to the program block for the file.

Data groups are copied in sequential order from the offset address following the initial program pointer, with wrap-around at the end of the file.

Garbage Collection—Block Consolidation

During a block consolidation operation, valid file groups are relocated from a selected source block to one or more selected destination blocks.

The source block is selected as the common block or program block with the lowest capacity of data.

The destination block is selected individually for each file group.

Priorities for selection of a destination block are as follows:
1. A common block with available erased capacity that is the best-fit for the source file group to be relocated.
2. A program block with available erased capacity that is the best-fit for the source file group to be relocated.
3. A program block or common block with the highest available erased capacity, to which part of the file group is written In this situation, it is permissible for a file to share two blocks with other unrelated files.

4. A second program block or common block with available erased capacity that is the best-fit for the remainder of the source file group, to which the remainder of the file group is written.
5. An erased block, which is then designated a program block, to which the remainder of the file group is written.

File Indexing (see FIGS. 10-1)

A file is identified by a FileID that is allocated by the direct data file device when a file is created by a host.

A flat directory specifies a File Data Pointer and File Info Pointer for each FileID.

The File Data Pointer identifies a set of entries in a File Index Table, with each entry specifying a data group for the file to which the set relates.

The File Info Pointer identifies a string of information for the file in an Info Table:
   File_info is written by a host and is not interpreted by the direct data file device.
   File_info may include filename, parent directory, child directories, attributes, rights information, and file associations for a file.

File Indexing—Indexing Structures
See FIGS. 10-2

File Indexing—File Index Table (FIT)—See FIGS. 10-4

The FIT contains entries for all valid data groups for files in flash memory. Obsolete data groups are not indexed by the FIT.

The FIT is divided into logical ranges, each of which is mapped to a physical block.

A FIT file is a set of consecutive entries for a file, in file offset address order.

A FIT file is identified by a FIT file pointer, defining physical block and logical file number.

File Indexing—Updating File Indices (see FIGS. 10-6 and 10-7)

The same structure is used for file index table and info table.

Block lists are used to relate a logical file data pointer to FIT files within a physical FIT block or FIT update block.

FIT files are stored in the FIT block in compacted format.

Updated versions of FIT files are stored in a shared FIT update block, with a single FIT file in a page.

Compaction of the FIT update block and consolidation of FIT files in a FIT block are performed from time to time.

File Indexing—Index Page Format (see FIGS. 10-5)

The same structure is used for, FIT block, FIT update block, info block, and info update block.

Information is programmed in units of one page.

A page is subdivided into two areas, for FIT entries and file pointers.

File pointers translate a logical file number within a range to a page number and entry number for the start of the corresponding FIT file.

A FIT file comprises physically consecutive FIT entries.

Data Buffering and Programming

Data written by host or being relocated within flash memory is buffered in a set of sector buffers.

The resolution of data group boundaries is one byte, but data is transferred to and from flash in multiples of one sector, for ECC generation and checking.

Data from the buffer is programmed in flash in units of a metapage, where possible.

A buffer flush operation programs only part of a page when a file is closed or a shutdown is pending. The file indexing techniques allow the unprogrammed part of the page to persist.

A buffer swap-out operation allows file data in the buffer to be stored temporarily in a common swap block, for management of buffer space and back-up of data in buffer.

The start of a file group in a program block or common block is aligned to the start of a metapage.

On-chip copy may be used for most data relocation in flash.

Block State Management

The direct data file system maintains eight states for blocks associated with the storage of data (see FIGS. 11-1).

Erased Block Management

Direct data file stores all data for files and all control information in fixed-size metablocks. (The term "block" is often used to designate "metablock.").

The method of linking erase blocks into blocks is unchanged from that used in a system with a logical address space (LBA) interface that is described in the following pending U.S. patent applications: Ser. No. 10/749,831, filed Dec. 30, 2003, entitled "Management of Non-Volatile Memory Systems Having Large Erase Blocks"; Ser. No. 10/750,155, filed Dec. 30, 2003, entitled "Non-Volatile Memory and Method with Block Management System"; Ser. No. 10/917,888, filed Aug. 13, 2004, entitled "Non-Volatile Memory and Method with Memory Planes Alignment"; Ser. No. 10/917,867, filed Aug. 13, 2004; Ser. No. 10/917,889, filed Aug. 13, 2004, entitled "Non-Volatile Memory and Method with Phased Program Failure Handling"; and Ser. No. 10/917,725, filed Aug. 13, 2004, entitled "Non-Volatile Memory and Method with Control Data Management," Ser. No. 11/192,200, filed Jul. 27, 2005, entitled "Non-Volatile Memory and Method with Multi-Stream Update Tracking," Ser. No. 11/192,386, filed Jul. 27, 2005, entitled "Non-Volatile Memory and Method with Improved Indexing for Scratch Pad and Update Blocks," and Ser. No. 11/191,686, filed Jul. 27, 2005, entitled "Non-Volatile Memory and Method with Multi-Stream Updating".

Erased blocks that are available for allocation for storing data or control information are held in an erased block pool.

Erased blocks are recorded as entries in an erased block log.

An erased block for allocation is selected as the entry at the head of the log.

An entry is added at the tail of the log when a block is erased.

Control Data Structures

Control data structures are stored in a dedicated control block.

Control information is stored in four independent logs. Each log occupies one or more pages in the control block. Valid log pages are tracked by log pointers in the last page written.

The common block log contains entries for all common blocks existing in flash memory, in order of the available erased capacity they contain.

The program block log contains entries for all program blocks existing in flash memory, in order of the available erased capacity they contain.

The erased block log contains entries for all erased blocks existing in flash memory, in order of the sequence of their erasure.

The control log contains predefined fields for control parameters, counts and lists.

A log is updated by writing a revised version of the complete log at the next erased page location in the control block.

It is claimed:

1. A re-programmable non-volatile memory system having a plurality of blocks of memory cells that are individually erased prior to data being written therein, wherein:
   data having logical addresses of unique file identifiers and offsets within the individual files are accepted,
   data of a first file are stored in at least first and second blocks with the second block being only partially filled with data of the first file and a remaining portion of the second block being erased, and
   valid data of the first file are copied from the first block into the erased portion of the second block in response to data of the first file being relocated from the first block, whereby said valid data are not copied into a totally erased block.

2. A memory system according to claim 1, wherein data of a second file are also stored in the first block prior to copying data of the first file from the first block.

3. A memory system according to claim 1, wherein data of the first file are stored as a plurality of data groups that individually have both contiguous logical offset addresses and contiguous physical addresses of data within the group.

4. A re-programmable non-volatile memory system capable of receiving data as files with logical addresses of a unique file identifier and offsets of data within the file, wherein:
   the memory system includes a plurality of blocks of memory cells that are individually erased prior to data being written therein,
   data of a file are written to successive pages of one or more blocks when in an erased state, and
   a garbage collection operation is immediately performed on data written into at least one of the one or more blocks in response to receipt of a command after the file is closed, in a case where data of the file are written to only a portion of the pages of the at least one block and then closed, only if at least some of the data of the file stored in the at least one block are obsolete.

5. A memory system according to claim 4, wherein data of the file are written in a form of a plurality of data groups that individually have both contiguous logical offset addresses and contiguous physical addresses of data within the group.

6. A re-programmable non-volatile memory system which receives data having logical addresses of unique file identifiers and offsets within the individual files, wherein:
   the memory system includes a plurality of blocks of memory cells that are individually erased prior to data being written therein,
   data and logical addresses of unique file identifiers and offsets of a given file are stored in a first block,
   newly received data of the given file are written into a second block, and
   garbage collection of the given file is performed by copying data of the given file from the first block into the second block.

7. A memory system according to claim 6, wherein data of the given file are written in a form of a plurality of data groups that individually have both contiguous logical offset addresses and contiguous physical addresses of data within the group.

* * * * *

UNITED STATES PATENT AND TRADEMARK OFFICE
CERTIFICATE OF CORRECTION

PATENT NO.       : 7,590,795 B2
APPLICATION NO.  : 11/462013
DATED            : September 15, 2009
INVENTOR(S)      : Sinclair et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 421 days.

Signed and Sealed this

Fourteenth Day of December, 2010

David J. Kappos
*Director of the United States Patent and Trademark Office*